(12) United States Patent
Inasaki

(10) Patent No.: US 11,117,364 B2
(45) Date of Patent: *Sep. 14, 2021

(54) COLOR DEVELOPING COMPOSITION, LITHOGRAPHIC PRINTING PLATE PRECURSOR, METHOD FOR PRODUCING LITHOGRAPHIC PRINTING PLATE, AND COMPOUND

(71) Applicant: FUJIFILM Corporation, Tokyo (JP)

(72) Inventor: Takeshi Inasaki, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 64 days.

This patent is subject to a terminal disclaimer.

(21) Appl. No.: 16/283,967

(22) Filed: Feb. 25, 2019

(65) Prior Publication Data

US 2019/0184696 A1 Jun. 20, 2019

Related U.S. Application Data

(63) Continuation of application No. PCT/JP2017/030200, filed on Aug. 23, 2017.

(30) Foreign Application Priority Data

Aug. 31, 2016 (JP) .............................. JP2016-169849

(51) Int. Cl.
*G03F 7/20* (2006.01)
*B41C 1/10* (2006.01)
*G03F 7/00* (2006.01)
*G03F 7/004* (2006.01)
*C09K 9/02* (2006.01)
*C09B 23/00* (2006.01)
*G03F 7/32* (2006.01)

(52) U.S. Cl.
CPC .......... *B41C 1/1016* (2013.01); *B41C 1/1008* (2013.01); *B41C 1/1033* (2013.01); *C09B 23/00* (2013.01); *C09K 9/02* (2013.01); *G03F 7/00* (2013.01); *G03F 7/004* (2013.01); *G03F 7/2014* (2013.01); *G03F 7/327* (2013.01); *B41C 2201/12* (2013.01); *B41C 2201/14* (2013.01); *B41C 2210/08* (2013.01)

(58) Field of Classification Search
CPC ....................................................... G03F 7/32
See application file for complete search history.

(56) References Cited

U.S. PATENT DOCUMENTS

| 2008/0254384 A1 | 10/2008 | Iwai |
| 2009/0192298 A1 | 7/2009 | Burgess |
| 2013/0011791 A1 | 1/2013 | Suzuki et al. |
| 2016/0121596 A1 | 5/2016 | Saito |
| 2017/0123315 A1 | 5/2017 | Mizuno et al. |
| 2018/0356730 A1 | 12/2018 | Inasaki et al. |

FOREIGN PATENT DOCUMENTS

| CN | 103059832 A | | 4/2013 |
| CN | 104788987 A | * | 7/2015 |
| CN | 104788987 A | | 7/2015 |
| EP | 1 736 312 B1 | | 4/2008 |

(Continued)

OTHER PUBLICATIONS

Berry et al., "Oximes of αω-Diquaternary Alkane Salts as Antidotes to Organophosphate Anticholines Terases", British Journal of Pharmacology and Chemotherapy, vol. 14. No. 2, pp. 186-191 (1959) 6 pages total.

Voltrova et al., "Reaction of Thiolesters with Nitrogen Ylides", European Journal of Organic Chemistry, 2008, pp. 1677-1679, 39 pages total.

Office Action dated Feb. 4, 2020, from the Japanese Patent Office in Japanese Application No. 2018-537189.

(Continued)

*Primary Examiner* — Chanceity N Robinson
(74) *Attorney, Agent, or Firm* — Sughrue Mion, PLLC

(57) ABSTRACT

Provided are a color developing composition including a compound represented by Formula 1, a lithographic printing plate precursor having at least a layer including the color developing composition, a method for producing a lithographic printing plate in which the lithographic printing plate precursor is used, and a compound represented by Formula 1.

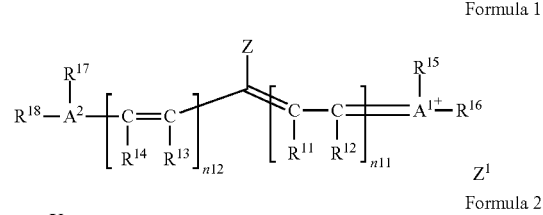

Formula 1

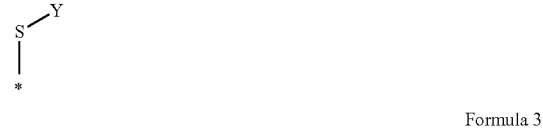

Formula 2

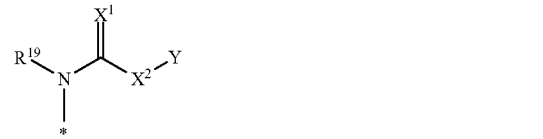

Formula 3

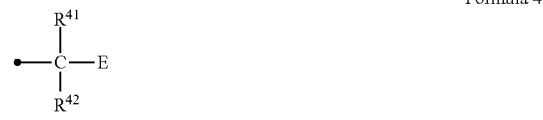

Formula 4

11 Claims, No Drawings

(56) References Cited

FOREIGN PATENT DOCUMENTS

| JP | 56-57780 A | 5/1981 | | |
|----|----|----|----|----|
| JP | 2003-307844 A | 10/2003 | | |
| JP | 2003307844 A | * | 10/2003 | ........... B41C 1/1008 |
| JP | 2008-191468 A | 8/2008 | | |
| JP | 2010-234589 A | 10/2010 | | |
| JP | 2011-213114 A | 10/2011 | | |
| JP | 2017-013318 A | 1/2017 | | |
| RU | 2030402 C1 | 3/1995 | | |
| RU | 2032670 C1 | 4/1995 | | |
| WO | 2015/008578 A1 | 1/2015 | | |
| WO | 2015/115598 A1 | 8/2015 | | |
| WO | 2016/027886 A1 | 2/2016 | | |
| WO | WO-2016027886 A1 | * | 2/2016 | ......... C09B 23/0066 |
| WO | 2016/121667 A1 | 8/2016 | | |
| WO | 2017/141882 A1 | 8/2017 | | |

OTHER PUBLICATIONS

Dongjian Zhu et al., "Development of ratiometric near-infrared fluorescent probes using analyte-specific cleavage of carbamte", Organic & Biomolecular Chemistry, 2013, pp. 4577-4580, 5 pages total.

J.E. Oliver et al., "Insect Chemosterilants. 11. Substituted 3,5-Diamino-1,2,4-dithiazolium Salts and Related Compounds", Journal of Medicinal Chemistry, 1972, pp. 315-320, vol. 15, No. 3 (6 pages total).

International Search Report for PCT/JP2017/030200, dated Oct. 3, 2017.

Written Opinion for PCT/JP2017/030200, dated Oct. 3, 2017.

International Preliminary Report on Patentability with translation of Written Opinion for PCT/JP2017/030200, dated Mar. 5, 2019.

Extended European Search Report dated Nov. 22, 2019 from the European Patent Office in European application No. 17846264.4.

Office Action dated Dec. 19, 2019, from the Intellectual Property of India in Indian application No. 201947007400.

Office Action dated May 21, 2021 with translation from the State Intellectual Property Office of People's Republic of China in Chinese application No. 201780051497.1; 13 pages total.

Office Action dated Jul. 6, 2021 by Brazilian Patent Office in Brazilian Application No. BR112019003802-7.

* cited by examiner

COLOR DEVELOPING COMPOSITION, LITHOGRAPHIC PRINTING PLATE PRECURSOR, METHOD FOR PRODUCING LITHOGRAPHIC PRINTING PLATE, AND COMPOUND

CROSS-REFERENCE TO RELATED APPLICATIONS

This application is a continuation application of International Application No. PCT/JP2017/030200, filed Aug. 23, 2017, the disclosure of which is incorporated herein by reference in its entirety. Further, this application claims priority from Japanese Patent Application No. 2016-169849, filed Aug. 31, 2016, the disclosure of which is incorporated herein by reference in its entirety.

BACKGROUND OF THE INVENTION

1. Field of the Invention

The present disclosure relates to a color developing composition, a lithographic printing plate precursor, a method for producing a lithographic printing plate, and a compound.

2. Description of the Related Art

Generally, a lithographic printing plate includes a lipophilic image area that receives ink in a printing process and a hydrophilic non-image area that receives dampening water.

Lithographic printing is a method in which the properties of water and oil-based ink that repel each other are used, the lipophilic image area of the lithographic printing plate is used as an ink-receiving portion, the hydrophilic non-image area is used as a dampening water-receiving portion (non-ink-receiving portion), a difference in the adhesive property of ink to the surface of the lithographic printing plate is caused, the ink is inked only in the image area, and then the ink is transferred to a body to be printed such as paper, thereby carrying out printing.

At the moment, in a plate making step of producing a lithographic printing plate from a lithographic printing plate precursor, image exposure is carried out using a computer to plate (CTP) technology. That is, image exposure is directly carried out on a lithographic printing plate precursor by means of scanning, exposure, or the like using a laser or a laser diode without using a lith film.

In addition, due to the intensifying interest in the global environment, regarding the plate making of lithographic printing plate precursors, an environmental issue of waste liquid generated by wet processes such as a development process has gathered attention, and accordingly, there have been attempts to simplify or remove development processes. As one of simple development processes, a method called "on-machine development" has been proposed. The on-machine development refers to a method in which, after the image exposure of a lithographic printing plate precursor, a wet-type development process of the related art is not carried out, and instead, the lithographic printing plate precursor is attached to a printer, and non-image areas in an image-recording layer are removed at the initial phase of an ordinary printing step.

Generally, as a previous step of attaching the lithographic printing plate to the printer, an operation of inspecting and identifying an image on the lithographic printing plate (the inspection of the plate) in order to check whether image is recorded as intended on the lithographic printing plate is carried out. Particularly, in polychromatic printing, the capability of determining a register mark which serves as a mark for registration is critical in printing operations.

In lithographic printing plate precursors that are subjected to an ordinary development process step, generally, an image-recording layer is colored, and a development process is carried out, thereby obtaining a colored image, and thus it is possible to easily check the image before the printing plate is attached to a printer.

Meanwhile, in on-machine development-type or process-less (development-less)-type lithographic printing plate precursors on which an ordinary wet-type development process step is not accompanied, it is difficult to check an image on the lithographic printing plate precursor in a phase of attaching the lithographic printing plate precursor to a printer, and thus it is impossible to sufficiently inspect the plate. Therefore, for on-machine development-type or process-less (development-less)-type lithographic printing plate precursors, there is a demand for means for checking an image in a phase of being exposed, that is, the formation of a so-called print-out image in which an exposed region develops or does not develop a color. Furthermore, from the viewpoint of improving workability, it is also critical that an exposed region which develops or does not develop a color maintains a state of developing or not developing a color even after the elapsing of time.

As a technique of the related art, a technique described in the specification of EP1736312B or WO2016/027886A is known.

SUMMARY OF THE INVENTION

An object that an embodiment of the present invention intends to achieve is to provide a color developing composition having excellent color developability.

An object that another embodiment of the present invention intends to achieve is to provide a lithographic printing plate precursor which is excellent in terms of the plate inspection property by color development and a method for producing a lithographic printing plate in which the lithographic printing plate precursor is used.

In addition, an object that still another embodiment of the present invention intends to achieve is to provide a new compound that can be preferably used as a color developer.

Means for achieving the above-described objects includes the following aspects.

<1> A color developing composition, comprising: a compound represented by the following Formula 1.

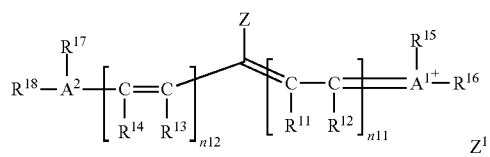

Formula 1

Formula 2

-continued

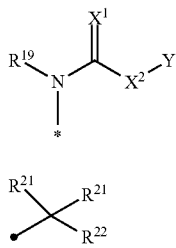
Formula 3

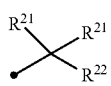
Formula 1-1

In Formula 1, Z represents a group represented by Formula 2 or Formula 3, each of $R^{11}$ to $R^{18}$ independently represents a hydrogen atom, a halogen atom, $-R^a$, $-OR^b$, $-SR^c$, or $-NR^dR^e$, each of $R^a$ to $R^e$ independently represents a hydrocarbon group, each of $A^1$ and $A^2$ independently represents an oxygen atom, a sulfur atom, or a nitrogen atom, $R^{16}$ is not present in a case in which $A^1$ represents an oxygen atom or a sulfur atom, $R^{18}$ is not present in a case in which $A^2$ represents an oxygen atom or a sulfur atom, at least two selected from the group consisting of $A^1$, $A^2$, and a plurality of $R^1$ to $R^{18}$ may be linked to each other to form a monocyclic structure or a polycyclic structure, n11 and n12 represent the same integer of 0 to 5, and $Z^1$ represents a counter ion for neutralizing a charge, in Formula 2 and Formula 3, $R^{19}$ represents a hydrocarbon group, each of $X^1$ and $X^2$ independently represents an oxygen atom or a sulfur atom, Y represents a group which is represented by Formula 1-1 and which is capable of cleaving a Y—S bond in Formula 2 or a Y—$X^2$ bond in Formula 3 upon exposure to heat or an infrared ray, and * represents a bonding site with a carbon atom in Formula 1, and in Formula 1-1, • represents a bonding site with a sulfur atom in Formula 2 or a bonding site with $X^2$ in Formula 3, each of $R^{21}$'s independently represents a hydrogen atom, an alkyl group, or an aryl group, and $R^{22}$ represents an aryl group, an alkenyl group, an alkoxy group, or an onium group.

<2> The color developing composition according to <1>, in which Y in Formula 2 or Formula 3 is a group represented by the following Formula 4.

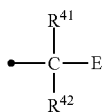
Formula 4

In Formula 4, each of $R^{41}$ and $R^{42}$ independently represents a hydrogen atom or a hydrocarbon group, E represents an onium salt, and • represents a bonding site with a sulfur atom in Formula 2 or a bonding site with $X^2$ in Formula 3.

<3> The color developing composition according to <2>, in which E in Formula 4 is a group represented by Formula 5:

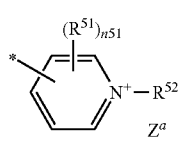
Formula 5

Each of $R^{51}$'s independently represents a halogen atom, a hydrocarbon group, a hydroxy group, or $-OR^{53}-$, $R^{53}$ represents a hydrocarbon group, a plurality of $R^{51}$'s may be linked to each other to form a ring, n51 represents an integer of 0 to 4, $R^{52}$ represents a hydrocarbon group, and $Z^a$ represents a counter ion that neutralizes a charge.

<4> The color developing composition according to any one of <1> to <3>, in which the compound represented by Formula 1 is a compound represented by the following Formula 6.

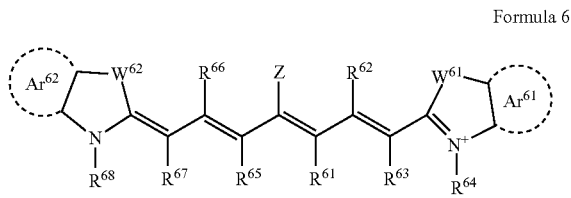
Formula 6

Formula 2

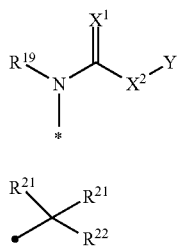
Formula 3

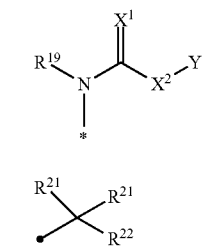
Formula 1-1

In Formula 6, Z represents a group represented by Formula 2 or Formula 3, each of $R^{61}$ to $R^{68}$ independently represents a hydrogen atom, a halogen atom, $-R^a$, $-OR^b$, $-SR^c$, or $-NR^dR^e$, each of $R^a$ to $R^e$ independently represents a hydrocarbon group, each of $Ar^{61}$ and $Ar^{62}$ independently represents a group forming a benzene ring or forming a naphthalene ring, each of $W^{61}$ and $W^{62}$ independently represents an oxygen atom, a sulfur atom, $-CR^{611}R^{612}-$, or $-NR^{613}-$, each of $R^{611}$ to $R^{613}$ independently represents a hydrocarbon group, and $Z^b$ represents a counter ion that neutralizes a charge, in Formula 2 and Formula 3, $R^{19}$ represents a hydrocarbon group, each of $X^1$ and $X^2$ independently represents an oxygen atom or a sulfur atom, Y represents a group which is represented by Formula 1-1 and which is capable of cleaving a Y—S bond in Formula 2 or a Y—$X^2$ bond in Formula 3 upon exposure to heat or an infrared ray, and * represents a bonding site with a carbon atom in Formula 1, and in Formula 1-1, • represents a bonding site with a sulfur atom in Formula 2 or a bonding site with $X^2$ in Formula 3, each of $R^{21}$'s independently represents a hydrogen atom, an alkyl group, or an aryl group, and $R^{22}$ represents an aryl group, an alkenyl group, an alkoxy group, or an onium group.

<5> The color developing composition according to <4>, in which $R^{64}$ and $R^{68}$ in Formula 6 represent a group represented by any of the following Formula 7 to Formula 10.

$-[R^{71}-O]_{n71}R^{72}$   Formula 7

$-R^{81}-CO_2M^{81}$   Formula 8

$-R^{91}-PO_3M^{91}$　　　　Formula 9

$-R^{101}-SO_3M^{101}$　　　　Formula 10

In Formulae 7 to 10, $R^{71}$ represents an alkylene group having 2 to 6 carbon atoms, n71 represents an integer of 1 to 45, $R^{72}$ represents an alkyl group having 1 to 12 carbon atoms or $-C(=O)-R^{73}$, each of $R^{81}$, $R^{91}$, and $R^{101}$ independently represents an alkylene group having 1 to 12 carbon atoms, $R^{73}$ represents an alkyl group having 1 to 12 carbon atoms, and each of $M^{81}$, $M^{91}$, and $M^{101}$ represents a hydrogen atom, a Na atom, a K atom, or an onium salt.

<6> The color developing composition according to any one of <1> to <5>, further comprising a binder polymer.

<7> The color developing composition according to any one of <1> to <6>, further comprising a thermally adhesive particle.

<8> The color developing composition according to any one of <1> to <7>, further comprising a polymerization initiator and a polymerizable compound.

<9> The color developing composition according to any one of <1> to <8>, further comprising a borate compound.

<10> A lithographic printing plate precursor, comprising: at least one layer including the color developing composition according to any one of <1> to <9> on a support.

<11> A method for producing a lithographic printing plate, comprising:
a step of radiating an infrared ray to the lithographic printing plate precursor according to <10>; and
a step of carrying out on-machine development by supplying at least one selected from the group consisting of a printing ink and dampening water to the lithographic printing plate precursor to which the infrared ray has been radiated on a printer.

<12> A compound represented by the following Formula 1.

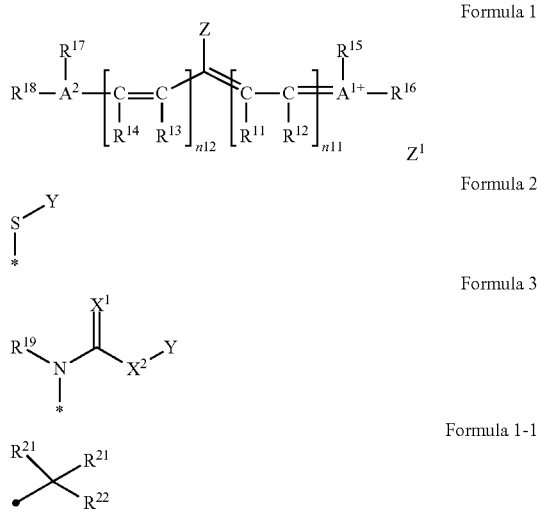

In Formula 1, Z represents a group represented by Formula 2 or Formula 3, each of $R^{11}$ to $R^{18}$ independently represents a hydrogen atom, a halogen atom, $-R^a$, $-OR^b$, $-SR^c$, or $-NR^dR^e$, each of $R^a$ to $R^e$ independently represents a hydrocarbon group, each of $A^1$ and $A^2$ independently represents an oxygen atom, a sulfur atom, or a nitrogen atom, $R^{16}$ is not present in a case in which A represents an oxygen atom or a sulfur atom, $R^{18}$ is not present in a case in which $A^2$ represents an oxygen atom or a sulfur atom, at least two selected from the group consisting of $A^1$, $A^2$, and a plurality of $R^1$ to $R^{18}$ may be linked to each other to form a monocyclic structure or a polycyclic structure, n11 and n12 represent the same integer of 0 to 5, and $Z^1$ represents a counter ion for neutralizing a charge, in Formula 2 and Formula 3, $R^{19}$ represents a hydrocarbon group, each of $X^1$ and $X^2$ independently represents an oxygen atom or a sulfur atom, Y represents a group which is represented by Formula 1-1 and which is capable of cleaving a Y—S bond in Formula 2 or a Y—$X^2$ bond in Formula 3 upon exposure to heat or an infrared ray, and * represents a bonding site with a carbon atom in Formula 1, and in Formula 1-1, • represents a bonding site with a sulfur atom in Formula 2 or a bonding site with $X^2$ in Formula 3, each of $R^{21}$'s independently represents a hydrogen atom, an alkyl group, or an aryl group, and $R^{22}$ represents an aryl group, an alkenyl group, an alkoxy group, or an onium group.

According to an embodiment of the present invention, it is possible to provide a color developing composition having excellent color developability.

In addition, according to another embodiment of the present invention, it is possible to provide a lithographic printing plate precursor which is excellent in terms of the plate inspection property by color development and a method for producing a lithographic printing plate in which the lithographic printing plate precursor is used.

Furthermore, according to still another embodiment of the present invention, it is possible to provide a new compound that can be preferably used as a color developer.

DESCRIPTION OF THE PREFERRED EMBODIMENTS

Hereinafter, the present disclosure will be described in detail.

Meanwhile, in the present specification, the expression "xx to yy" indicates a numerical range including xx and yy.

In the present specification, "(meth)acrylic" indicates either or both "acrylic" and "methacrylic", and "(meth) acrylate" indicates either or both "acrylate" and "methacrylate".

In the present specification, "% by mass" is the same as "% by weight", and "parts by mass" is the same as "weight by mass". In addition, in the present specification, a combination of two or more preferred aspects is a more preferred aspect.

In the present specification, regarding the expression of a group in a compound represented by a formula, in a case in which a group that is not described to be "substituted" or "unsubstituted" is capable of further having a substituent, unless particularly otherwise described, the group refers not only to an unsubstituted group but also to a group having a substituent. For example, in a formula, the expression "R represents an alkyl group, an aryl group, or a heterocyclic group" means that "R represents an unsubstituted alkyl group, a substituted alkyl group, an unsubstituted aryl group, a substituted aryl group, an unsubstituted heterocyclic group, or a substituted heterocyclic group".

In the present specification, the term "step" refers not only to an independent step but also to a step that is not clearly distinguished from other steps as long as the intended purpose of the step is achieved.

(Color Developing Composition)

A color developing composition according to the embodiment of the disclosure includes a compound represented by Formula 1.

In addition, the color developing composition according to embodiment of the disclosure can be preferably used as a thermosensitive, infrared-sensitive, or thermosensitive and infrared-sensitive color developing composition.

Furthermore, the color developing composition according to embodiment of the disclosure can be preferably used to produce an image-recording layer, a protective layer, or both the image-recording layer and the protective layer in a lithographic printing plate precursor.

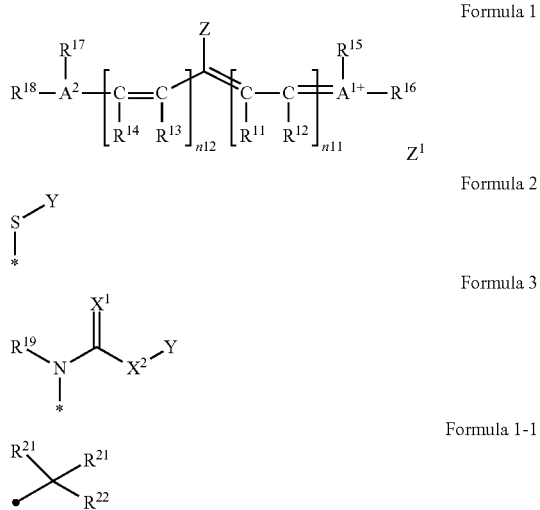

Formula 1

Formula 2

Formula 3

Formula 1-1

In Formula 1, Z represents a group represented by Formula 2 or Formula 3, each of $R^{11}$ to $R^{18}$ independently represents a hydrogen atom, a halogen atom, $-R^a$, $-OR^b$, $-SR^c$, or $-NR^dR^e$, each of $R^a$ to $R^e$ independently represents a hydrocarbon group, each of $A^1$ and $A^2$ independently represents an oxygen atom, a sulfur atom, or a nitrogen atom, $R^{16}$ is not present in a case in which $A^1$ represents an oxygen atom or a sulfur atom, $R^{18}$ is not present in a case in which $A^2$ represents an oxygen atom or a sulfur atom, at least two selected from the group consisting of $A^1$, $A^2$, and a plurality of $R^{11}$ to $R^{18}$ may be linked to each other to form a monocycle or a polycycle, n11 and n12 represent the same integer of 0 to 5, and $Z^1$ represents a counter ion for neutralizing a charge, in Formula 2 and Formula 3, $R^{19}$ represents a hydrocarbon group, each of $X^1$ and $X^2$ independently represents an oxygen atom or a sulfur atom, Y represents a group which is represented by Formula 1-1 and which is capable of cleaving a Y—S bond in Formula 2 or a Y—$X^2$ bond in Formula 3 upon exposure to heat or an infrared ray, and * represents a bonding site with a carbon atom in Formula 1, in Formula 1-1, • represents a bonding site with the sulfur atom in Formula 2 or a bonding site with $X^2$ in Formula 3, each of $R^{21}$'s independently represents a hydrogen atom, an alkyl group, or an aryl group, and $R^{22}$ represents an aryl group, an alkenyl group, an alkoxy group, or an onium group.

<Compound Represented by Formula 1>

The compound represented by Formula 1 is a compound that decomposes by exposure to heat or an infrared ray and generates a color developing compound.

In the present disclosure, color developing means that visible light (in a range of 400 nm or more and less than 750 nm) is rarely absorbed before heating or exposure to an infrared ray; however, after heating or exposure to an infrared ray, strong color is exhibited or shorter wavelengths begin to be absorbed and visible light is absorbed.

Meanwhile, in the present disclosure, the infrared ray has a wavelength of 750 nm or more and 1 mm or less and preferably has a wavelength of 750 nm or more and 1,400 nm or less.

The detail of the color development mechanism of the compound represented by Formula 1 is not clear;

However, regarding the color development mechanism of the compound represented by Formula 1, the present inventors and the like assume that, due to exposure to heat or an infrared ray, the Y—S bond in Formula 2 or the Y—$X^2$ bond in Formula 3 is cleaved, and thus the electron structure in an electron conjugation system of the mother nucleus structure of the compound changes, thereby developing color.

Each of $R^1$ to $R^{18}$ independently preferably represents a hydrogen atom, $-R^a$, $-OR^b$, $-SR^c$, or $-NR^dR^e$.

The hydrocarbon group as $R^a$ to $R^e$ is preferably a hydrocarbon group having 1 to 30 carbon atoms, more preferably a hydrocarbon group having 1 to 15 carbon atoms, and still more preferably a hydrocarbon group having 1 to 10 carbon atoms. The hydrocarbon group may have a linear shape, have a branch, or have a ring structure.

In Formula 1, each of $R^{11}$ to $R^{14}$ independently preferably represents a hydrogen atom or an alkyl group and more preferably represent a hydrogen atom.

In addition, $R^{11}$ and $R^{13}$ that are bonded to a carbon atom that bonds with a carbon atom to which Z is bonded preferably represent an alkyl group and more preferably represent an alkyl group and are linked to each other to form a ring. The above-described ring being formed is preferably a five-membered ring or a six-membered ring and more preferably a five-membered ring.

It is preferable that $R^{12}$ that is bonded to a carbon atom to which $A^{1+}$ is bonded and $R^{14}$ that is bonded to a carbon atom to which $A^2$ is bonded each are linked with $R^{15}$ and $R^{17}$ to form a ring.

$R^{15}$ in Formula 1 preferably represents a hydrocarbon group. In addition, $R^{15}$ and $R^{12}$ that is bonded to the carbon atom to which $A^{1+}$ is bonded are preferably linked to each other to form a ring. The ring being formed is preferably an indole ring, a pyran ring, a thiopyran ring, a benzoxazoline ring, or a benzimidazoline ring, and, from the viewpoint of the color developability, more preferably an indole ring.

$R^{17}$ in Formula 1 preferably represents a hydrocarbon group. In addition, $R^{17}$ and $R^{14}$ that is bonded to the carbon atom to which $A^2$ is bonded are preferably linked to each other to form a ring. The ring being formed is preferably an indole ring, a pyran ring, a thiopyran ring, a benzoxazole ring, or a benzimidazole ring, and, from the viewpoint of the color developability, more preferably an indole ring.

$R^{15}$ and $R^{17}$ in Formula 1 are preferably the same group and, in the case of forming a ring respectively, preferably form the same ring.

$R^{16}$ and $R^{18}$ in Formula 1 are preferably the same group.

Furthermore, from the viewpoint of improving the solubility of the compound represented by Formula 1, each of $R^{16}$ and $R^{18}$ independently is preferably an alkyl group having a (poly)oxyalkylene group or an alkyl group having an anion structure, more preferably an alkyl group having an alkoxyalkyl group, a carboxylate group, or a sulfonate group, and still more preferably an alkyl group having a sulfonate group at a terminal. The alkyl group is preferably an alkyl group having 1 to 10 carbon atoms and more preferably an alkyl group having 1 to 4 carbon atoms.

In addition, a counter cation of the anion structure may be a cation or $A^+$ included in Z in Formula 1 and may be an alkali metal cation or an alkaline earth metal cation.

According to the above-described aspect, in the case of using the color developing composition for a lithographic printing plate precursor, a lithographic printing plate precursor having excellent developability is obtained.

A counter cation of the sulfonate group may be a cation or $A^+$ included in Z in Formula 1 and may be an alkali metal cation or an alkaline earth metal cation.

In addition, from the viewpoint of an increase in the maximum absorption wavelength of the compound represented by Formula 1, the color developability, and the printing resistance of lithographic printing plates, each of $R^{16}$ and $R^{18}$ independently is preferably an alkyl group or an alkyl group having an aromatic ring. The alkyl group is preferably an alkyl group having 1 to 10 carbon atoms, more preferably an alkyl group having 1 to 4 carbon atoms, and more preferably a methyl group or an ethyl group. The alkyl group having an aromatic ring is more preferably an alkyl group having an aromatic ring at a terminal and particularly preferably a 2-phenylethyl group, a 2-naphthaleneethyl group, or a 2-(9-anthracenyl)ethyl group.

n11 and n12 in Formula 1 represent the same integer of 0 to 5, are preferably an integer of 1 to 3, more preferably 1 or 2, and more preferably 2.

Each of $A^1$ and $A^2$ in Formula 1 independently represents an oxygen atom, a sulfur atom, or a nitrogen atom and preferably represent a nitrogen atom.

$A^1$ and $A^2$ in Formula 1 preferably represent the same atom.

Z in Formula 1 represents the group represented by Formula 2 or Formula 3, is preferably the group represented by Formula 2 from the viewpoint of the on-machine developability, and preferably the group represented by Formula 3 from the viewpoint of the color developability.

$Z^1$ in Formula 1 represents a counter ion that neutralizes a charge, and, in a case in which $Z^1$ represents an anion, examples thereof include a sulfonate ion, a carboxylate ion, a tetrafluoroborate ion, a hexafluorophosphate ion, a p-toluenesulfonate ion, a perchlorate ion, and the like, and a hexafluorophosphate ion is particularly preferred. In a case in which $Z^1$ represents a cation, an alkali metal ion, an alkaline earth metal ion, an ammonium ion, a pyridinium ion, or a sulfonium ion is preferred, a sodium ion, a potassium ion, an ammonium ion, a pyridinium ion, or a sulfonium ion is more preferred, and a sodium ion, a potassium ion, or an ammonium ion is still more preferred.

$R^{11}$ to $R^{18}$ and Z may have an anion structure or a cation structure, and, in a case in which all of $R^{11}$ to $R^{18}$ and Z are electrically neutral groups, $Z^1$ is a monovalent counter anion, and, for example, in a case in which $R^{11}$ to $R^{18}$ and Z have two or more anion structures, $Z^1$ may also become a counter cation.

In addition, in a case in which the compound represented by Formula 1 is a structure that is electrically neutral in the entire compound, $Z^1$ is not present.

[Group Represented by Formula 2]

Y in Formula 2 is represented by Formula 1-1 and represents a group which is capable of cleaving the Y—S bond upon exposure to heat or an infrared ray.

The group represented by Formula 1-1 will be described below.

[Group Represented by Formula 3]

Y in Formula 3 is represented by Formula 1-1 and represents a group which is capable of cleaving the Y—$X^2$ bond upon exposure to heat or an infrared ray.

The group represented by Formula 1-1 will be described below.

$X^1$ and $X^2$ in Formula 3 are preferably the same atom and both more preferably an oxygen atom.

$R^{19}$ in Formula 3 represents a hydrocarbon group, is preferably an alkyl group, more preferably an alkyl group having 1 to 4 carbon atoms, and still more preferably a methyl group.

Each of $R^{21}$'s in Formula 1-1 independently represents a hydrogen atom, an alkyl group, or an aryl group, are preferably a hydrogen atom, an alkyl group having 1 to 10 carbon atoms, or a phenyl group, more preferably an alkyl group having 3 to 10 carbon atoms or a hydrogen atom, and still more preferably a hydrogen atom.

Furthermore, the alkyl group as $R^{21}$ is preferably an alkyl group having a branch or a ring structure, more preferably a secondary or tertiary alkyl group, and still more preferably an isopropyl group, a cyclopentyl group, a cyclohexyl group, or a t-butyl group.

From the viewpoint of color developability, $R^{22}$ in Formula (1-1) is preferably an aryl group, an alkoxy group, or an onium group, more preferably p-dimethylaminophenyl group or a pyridinium group, and still more preferably a pyridinium group.

Examples of the onium group as $R^{22}$ include a pyridinium group, an ammonium group, a sulfonium group, and the like. The onium group may have a substituent. Examples of the substituent include an alkyl group, an alkoxy group, an aryloxy group, an amino group, an alkylthio group, an arylthio group, a halogen atom, a carboxy group, a sulfo group, an alkyloxycarbonyl group, an aryloxycarbonyl group, a group formed of a combination thereof, and the like, and an alkyl group, an aryl group, and a group formed of a combination thereof are preferred. Among these, a pyridinium group is preferred.

As the pyridinium group, an N-alkyl-3-pyridinium group, an N-benzyl-3-pyridinium group, an N-(alkoxy polyalkyleneoxy alkyl)-3-pyridinium group, an N-alkoxycarbonylmethyl-3-pyridinium group, an N-alkyl-4-pyridinium group, an N-benzyl-4-pyridinium group, an N-(alkoxy polyalkyleneoxy alkyl)-4-pyridinium group, an N-alkoxycarbonylmethyl-4-pyridinium group, or an N-alkyl-3,5-dimethyl-4-pyridinium group is more preferred, an N-alkyl-3-pyridinium group or an N-alkyl-4-pyridinium group is still more preferred, an N-methyl-3-pyridinium group, an N-octyl-3-pyridinium group, an N-methyl-4-pyridinium group, or an N-octyl-4-pyridinium group is particularly preferred, and an N-octyl-3-pyridinium group or an N-octyl-4-pyridinium group is most preferred.

In addition, in a case in which $R^{22}$ is an onium group, examples of the counter anion include a sulfonate ion, a carboxylate ion, a tetrafluoroborate ion, a hexafluorophosphate ion, a p-toluenesulfonate ion, a perchlorate ion, and the like, and a p-toluenesulfonate ion or a hexafluorophosphate ion is preferred.

[Group Represented by Formula 4]

From the viewpoint of the color developability, Y in Formula 2 or Formula 3 is preferably a group represented by Formula 4.

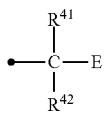

Formula 4

In Formula 4, each of $R^{41}$ and $R^{42}$ independently represents a hydrogen atom or a hydrocarbon group, E represents an onium salt, and • represents the bonding site with the sulfur atom in Formula 2 or the bonding site with $X^2$ in Formula 3.

Each of $R^{41}$ and $R^{42}$ in Formula 4 independently is preferably a hydrogen atom, a hydrocarbon group having 1 to 10 carbon atoms, or a phenyl group, more preferably an alkyl group having 3 to 10 carbon atoms or a hydrogen atom, and still more preferably a hydrogen atom.

Furthermore, the alkyl group as $R^{41}$ and $R^{42}$ is preferably an alkyl group having a branch or a ring structure, more preferably a secondary or tertiary alkyl group, and still more preferably an isopropyl group, a cyclopentyl group, a cyclohexyl group, or a t-butyl group.

$R^{41}$ and $R^{42}$ are both a hydrogen atom, but it is preferable that one of them is an alkyl group and the other is a hydrogen atom, and both are more preferably a hydrogen atom.

A preferred aspect of E in Formula 4 is the same as the preferred aspect in a case in which $R^{22}$ in Formula 1-1 represents an onium group.

[Group Represented by Formula 5]

In addition, from the viewpoint of the color developability, E in Formula 4 is preferably a group represented by Formula 5.

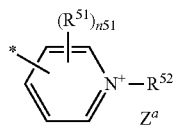

Formula 5

Each of $R^{51}$'s independently represents a halogen atom, an alkyl group, an aryl group, a hydroxy group, or an alkoxy group, a plurality of $R^{51}$'s may be linked to each other to form a ring, n51 represents an integer of 0 to 4, $R^{52}$ represents a hydrocarbon group, and $Z^a$ represents a counter ion that neutralizes a charge.

Each of $R^{51}$'s in Formula 5 independently preferably represents a hydrocarbon group and more preferably represent an alkyl group having 1 to 10 carbon atoms.

The plurality of $R^{51}$'s in Formula 5 may be linked to each other to form a ring, and, as the ring being formed, a benzene ring is exemplified.

$R^{52}$ in Formula 5 represents a hydrocarbon group and is preferably an alkyl group.

The alkyl group as $R^{52}$ may have a linear shape, have a branch, or have a ring structure.

In addition, the alkyl group may have a substituent, and, as the substituent, an alkoxy group, an aryl group, a terminal alkoxy polyalkyleneoxy group, and a terminal sulfonate group are preferably exemplified.

$R^{52}$ is preferably an alkyl group having 1 to 12 carbon atoms, more preferably a linear alkyl group having 1 to 12 carbon atoms, still more preferably a linear alkyl group having 1 to 8 carbon atoms, and particularly preferably a methyl group or an n-octyl group.

$Z^a$ in Formula 5 needs to be a counter ion that neutralizes a charge, and, in a case in which the structure of the compound excluding $Z^a$ is electrically neutral, $Z^a$ may not be present.

$Z^a$ is preferably a sulfonate ion, a carboxylate ion, a tetrafluoroborate ion, a hexafluorophosphate ion, a p-toluenesulfonate ion, or a perchlorate ion and more preferably a p-toluenesulfonate ion or a hexafluorophosphate ion.

The bonding site between the group represented by Formula 5 and a carbon atom in Formula 4 is preferably a third site or a fourth site of a pyridinium ring and more preferably the fourth site of the pyridinium ring.

Hereinafter, preferred examples of the group represented by Z in Formula 1 will be illustrated, but the present invention is not limited thereto.

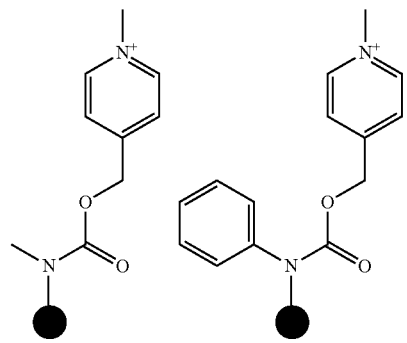

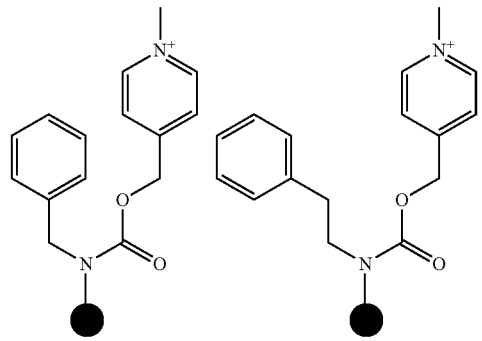

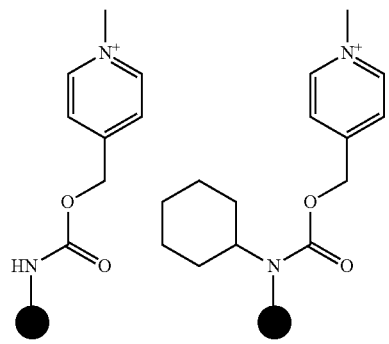

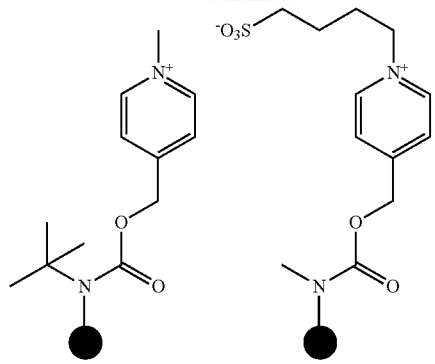
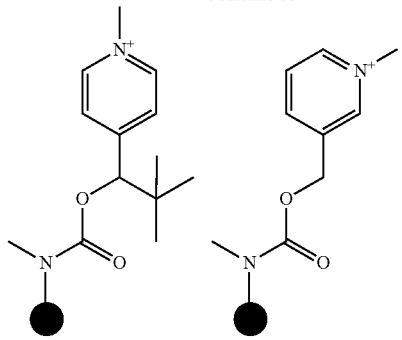
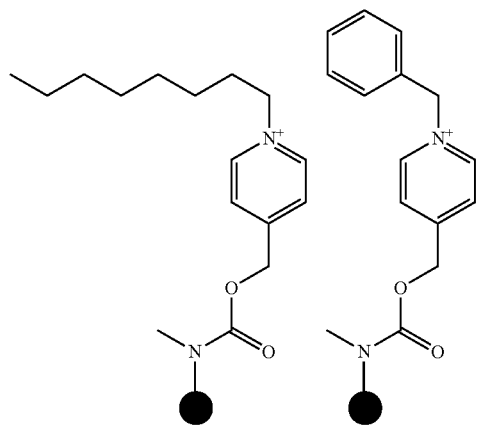
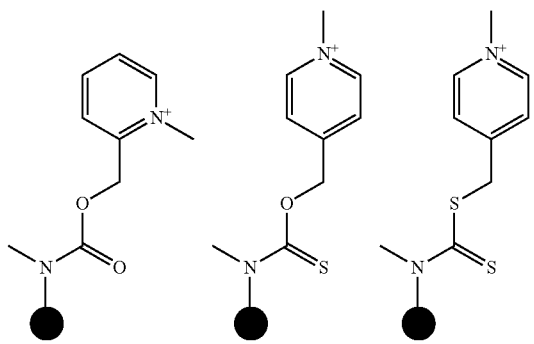
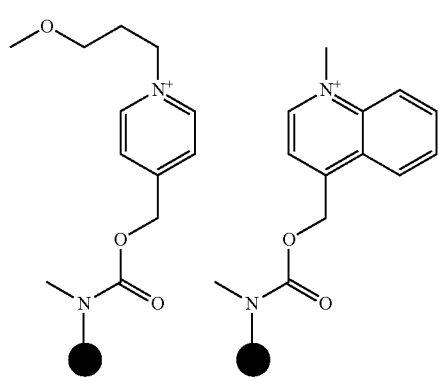
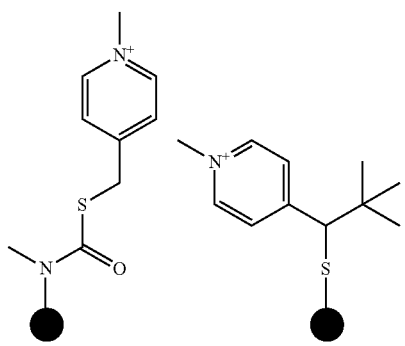
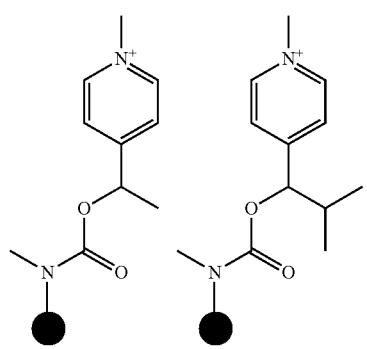
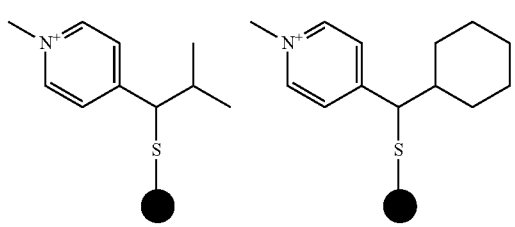
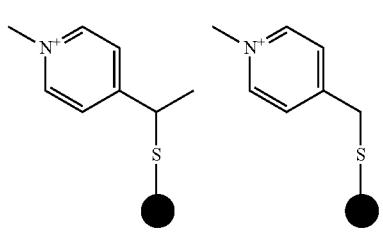

-continued

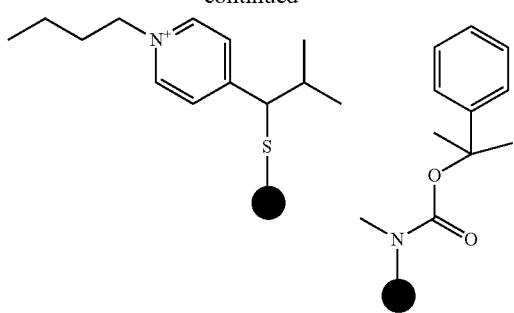

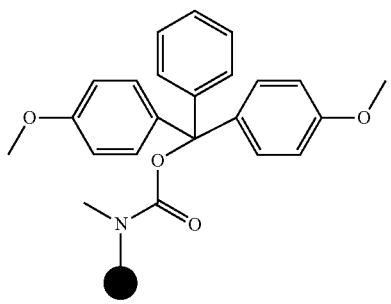

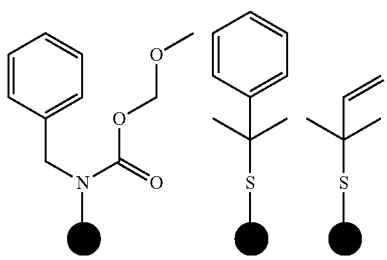

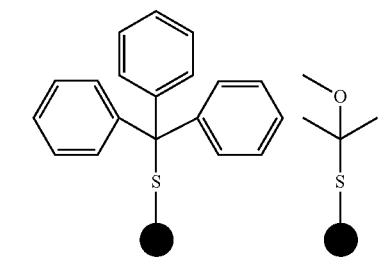

[Compound Represented by Formula 6]

The compound represented by Formula 1 is preferably a compound represented by Formula 6.

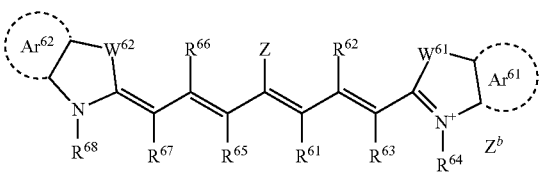

Formula 6

-continued

Formula 2

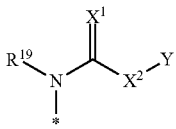

Formula 3

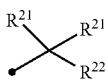

Formula 1-1

In Formula 6, Z represents the group represented by Formula 2 or Formula 3, each of $R^{61}$ to $R^{68}$ independently represents a hydrogen atom, a halogen atom, —$R^a$, —$OR^b$, —$SR^c$, or —$NR^dR^e$, each of $R^a$ to $R^e$ independently represents a hydrocarbon group, each of $Ar^{61}$ and $Ar^{62}$ independently represents a group forming a benzene ring or a naphthalene ring, each of $W^{61}$ and $W^{62}$ independently represents an oxygen atom, a sulfur atom, —$CR^{611}R^{612}$, or —$NR^{613}$—, each of $R^{611}$ to $R^{613}$ independently represents a hydrocarbon group, and $Z^b$ represents a counter ion that neutralizes a charge.

In Formula 2 and Formula 3, $R^{19}$ represents a hydrocarbon group, each of $X^1$ and $X^2$ independently represents an oxygen atom or a sulfur atom, Y represents a group which is represented by Formula 1-1 and which is capable of cleaving a Y—S bond in Formula 2 or a Y—$X^2$ bond in Formula 3 upon exposure to heat or an infrared ray, and * represents a bonding site with a carbon atom in Formula 1, In Formula 1-1, • represents a bonding site with the sulfur atom in Formula 2 or a bonding site with $X^2$ in Formula 3, each of $R^{21}$'s independently represents a hydrogen atom, an alkyl group, or an aryl group, and $R^{22}$ represents an aryl group, an alkenyl group, an alkoxy group, or an onium group.

In Formula 6, Z is the same as Z in Formula 1, and a preferred aspect thereof is also identical.

In Formula 6, $R^{61}$ and $R^{63}$ each are independently the same as $R^1$ in Formula 1, and preferred aspects thereof are also identical.

In Formula 6, $R^{65}$ and $R^{67}$ each are independently the same as $R^{13}$ in Formula 1, and preferred aspects thereof are also identical.

In Formula 6, $R^{62}$ and $R^{66}$ each are the same as $R^{12}$ and $R^{14}$ in Formula 1, and preferred aspects thereof are also identical.

In Formula 6, Zb is the same as $Z^1$ in Formula 1, and a preferred aspect thereof is also identical.

In Formula 6, $W^{61}$ and $W^{62}$ each are independently preferably —$CR^{611}R^{612}$— or —$NR^{613}$.

$R^{611}$ to $R^{613}$ each is independently preferably an alkyl group, more preferably an alkyl group having 1 to 10 carbon atoms, still more preferably an alkyl group having 1 to 4 carbon atoms, and particularly preferably a methyl group.

Each of $Ar^{61}$ and $Ar^{62}$ independently represents a group forming a benzene ring or a naphthalene ring. The benzene ring or the naphthalene ring may have a substituent. As the substituent, an alkyl group, an alkoxy group, an aryloxy group, an amino group, an alkylthio group, an arylthio group, a halogen atom, a carboxy group, a carboxylate group, a sulfo group, a sulfonate group, an alkyloxycarbonyl group, an aryloxycarbonyl group, a group formed of a combination thereof, and the like are exemplified, but the substituent is preferably an alkyl group.

$R^{64}$ and $R^{68}$ in Formula 6 each are the same as $R^{16}$ and $R^{18}$ in Formula 1, and preferred aspects thereof are also identical.

[Groups Represented by Formula 7 to Formula 10]

In addition, from the viewpoint of the water solubility of the color developing composition and the developability of the lithographic printing plate precursor, $R^{64}$ and $R^{68}$ in Formula 6 are preferably a group represented by any of Formula 7 to Formula 10.

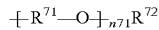  Formula 7

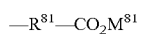  Formula 8

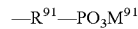  Formula 9

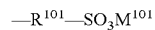  Formula 10

In Formulae 7 to 10, $R^{71}$ represents an alkylene group having 2 to 6 carbon atoms, n71 represents an integer of 1 to 45, $R^{72}$ represents an alkyl group having 1 to 12 carbon atoms or —C(=O)—$R^{73}$, each of $R^{81}$, $R^{91}$, and $R^{101}$ independently represents an alkylene group having 1 to 12 carbon atoms, $R^{73}$ represents an alkyl group having 1 to 12 carbon atoms, and $M^{81}$, $M^{91}$ and $M^{101}$ represent a hydrogen atom, a Na atom, a K atom, or an onium group salt.

$R^{71}$ in Formula 7 preferably represents an alkylene group having 2 or 3 carbon atoms. The alkylene group may have a linear shape or a branch.

$R^{72}$ in Formula 7 preferably represents an alkyl group having 1 to 8 carbon atoms or —C(=O)—$R^{73}$ and is more preferably a methyl group or an ethyl group.

n71 in Formula 7 is preferably an integer of 1 to 30 and more preferably an integer of 1 to 10.

Each of $R^{81}$, $R^{91}$, and $R^{101}$ in Formula 8 to Formula 10 independently preferably represents an alkylene group having 1 to 8 carbon atoms.

Each of $M^{81}$, $M^{91}$, and $M^{101}$ in Formula 8 to Formula 10 independently represents a hydrogen atom, a Na atom, a K atom, or an onium salt and is preferably a Na atom or a K atom.

$M^{81}$, $M^{91}$, and $M^{101}$ may be dissociated in the color developing composition and be present in a counter cation form.

Hereinafter, as preferred examples of the compound represented by Formula 1, compound A-1 to compound A-65 ((A-1) to (A-65)) will be illustrated, but the present invention is not limited thereto. Meanwhile, in the following specific examples, Me represents a methyl group.

(A-1)

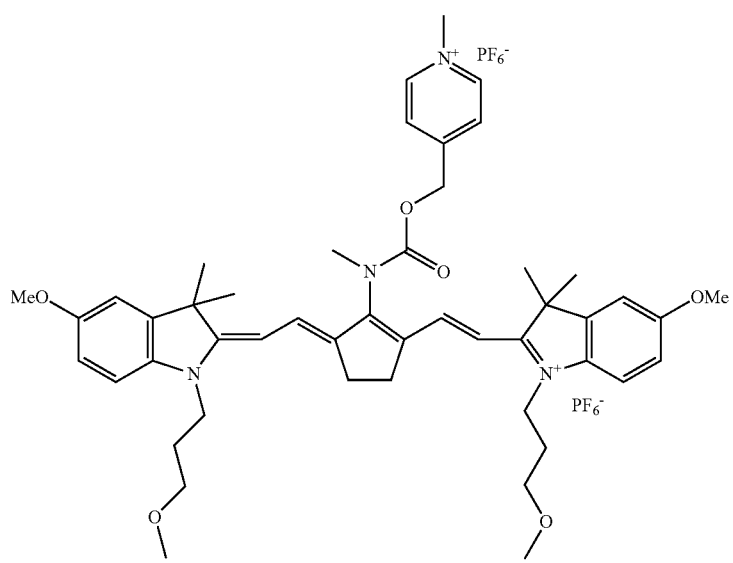

-continued
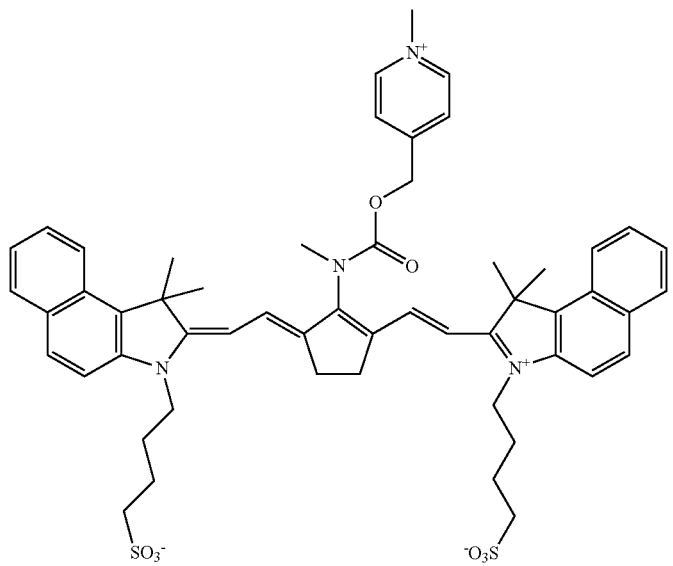
(A-2)
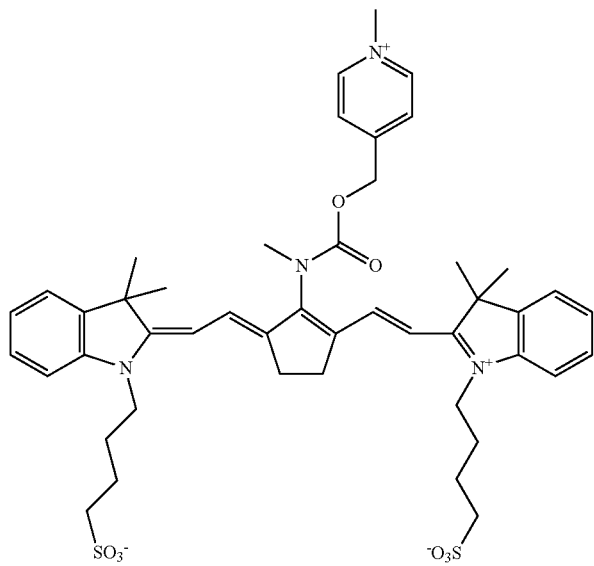
(A-3)

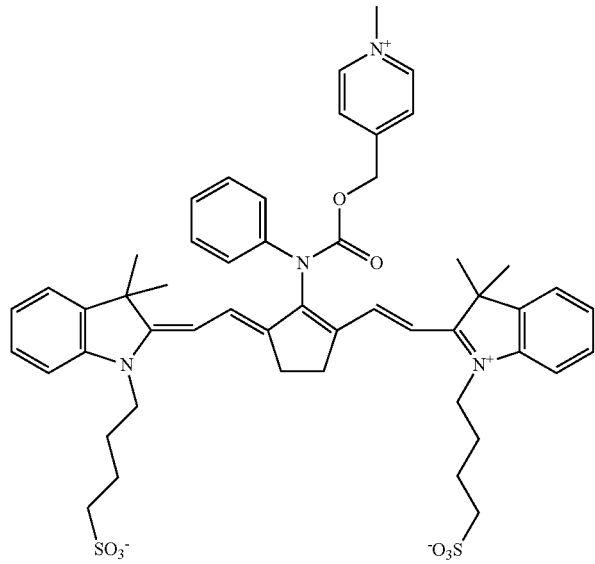
(A-4)
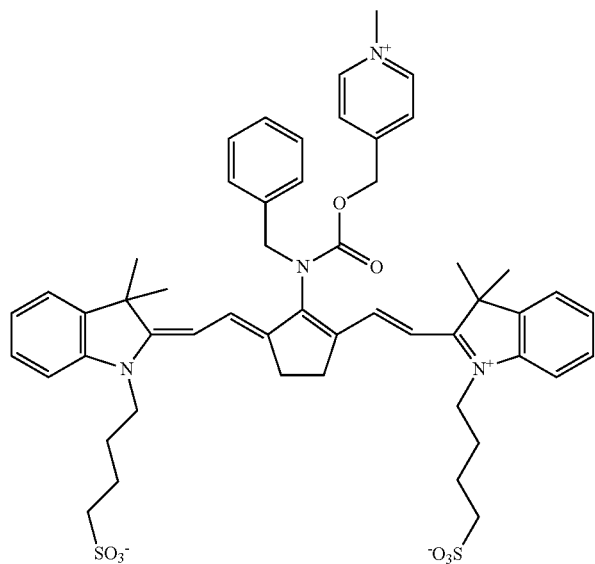
(A-5)

(A-6)
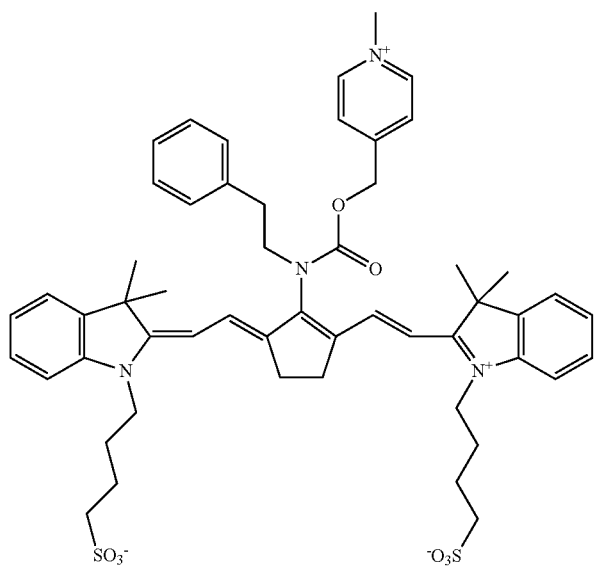
(A-7)
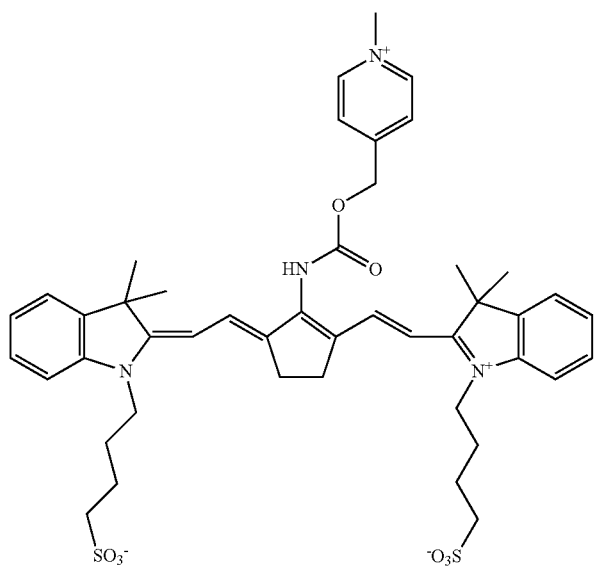

(A-8)
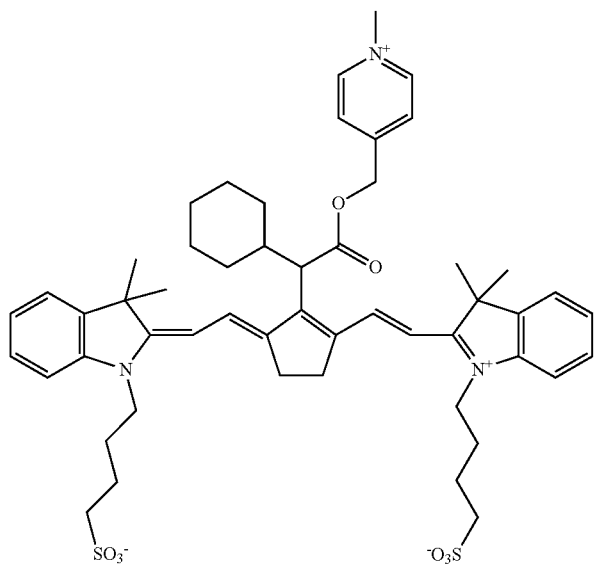
(A-9)
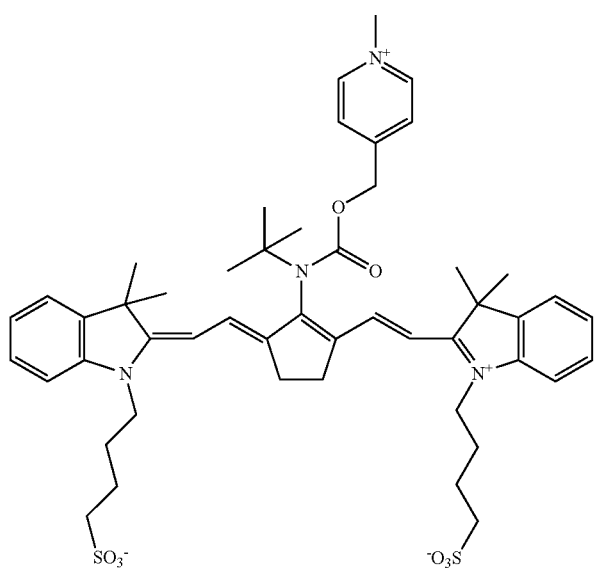

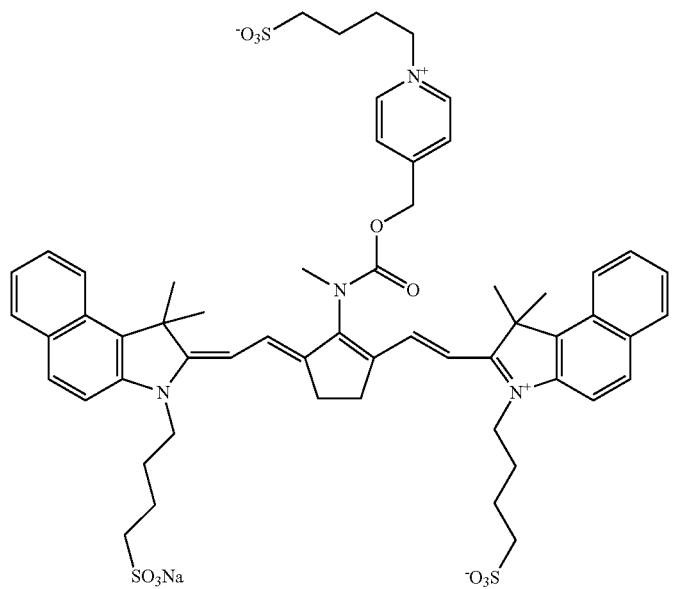
(A-10)
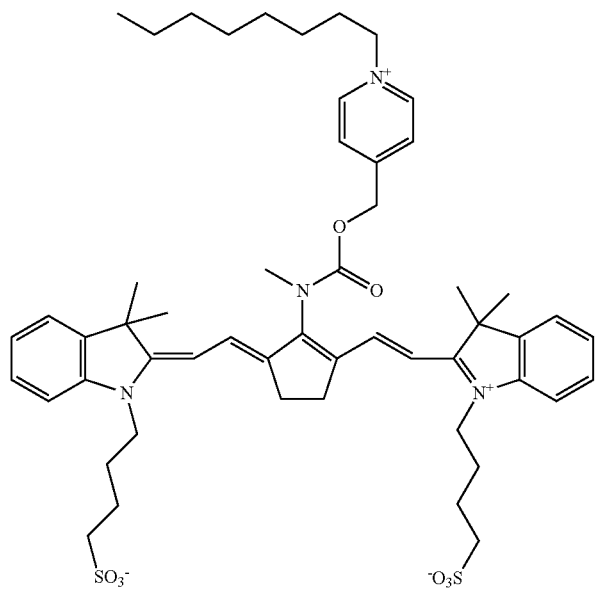
(A-11)

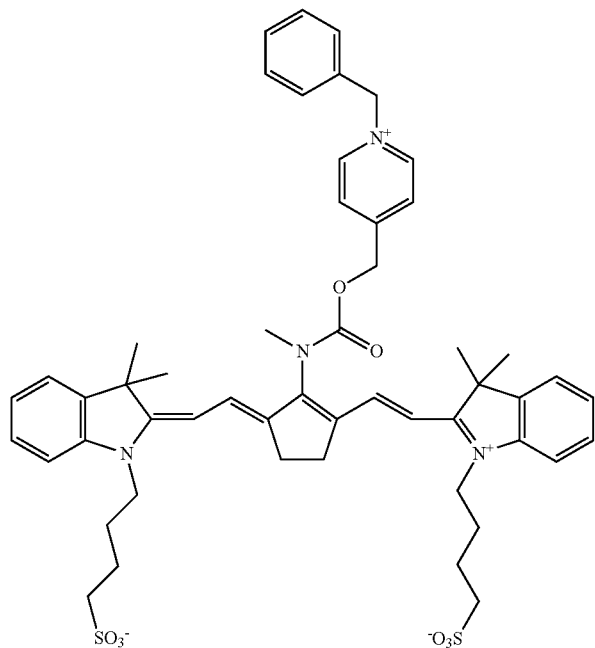
(A-12)
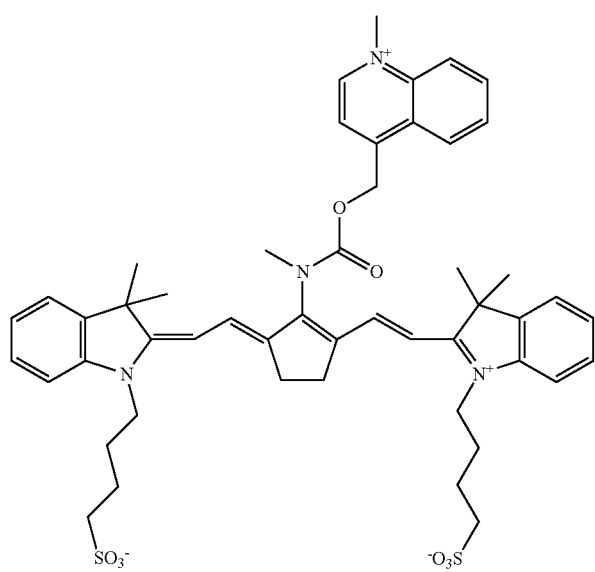
(A-13)

(A-14)
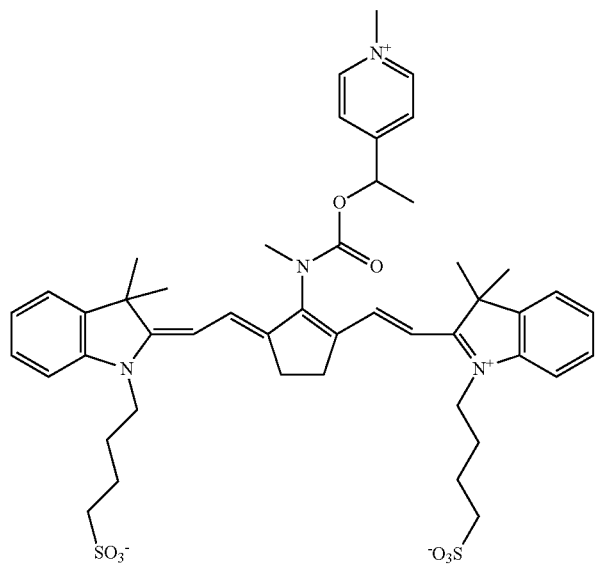
(A-15)
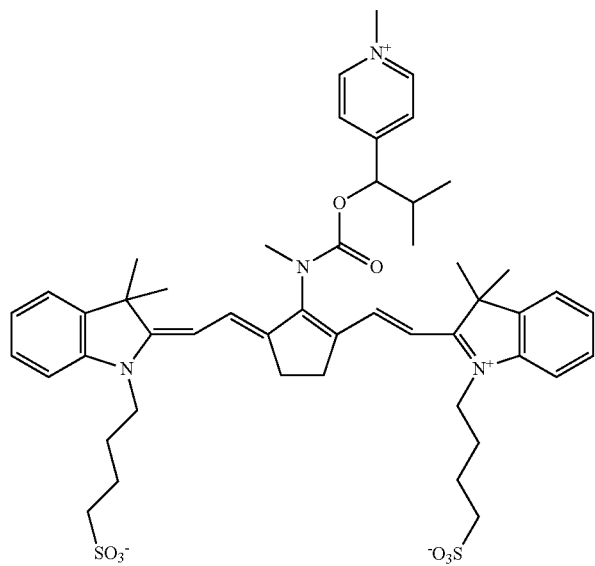

(A-16)
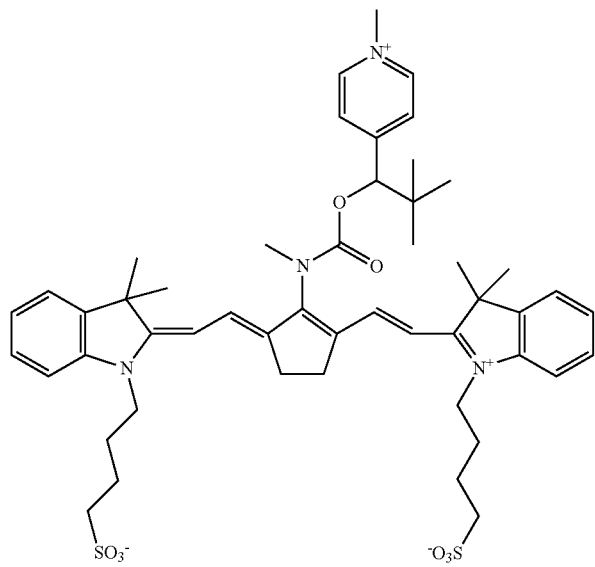
(A-17)
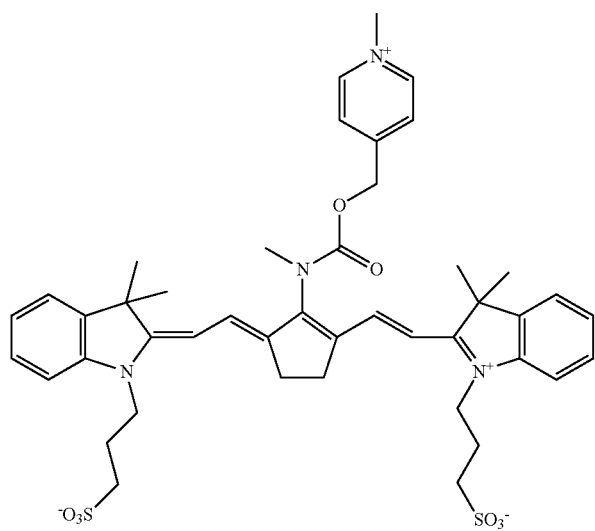
(A-18)
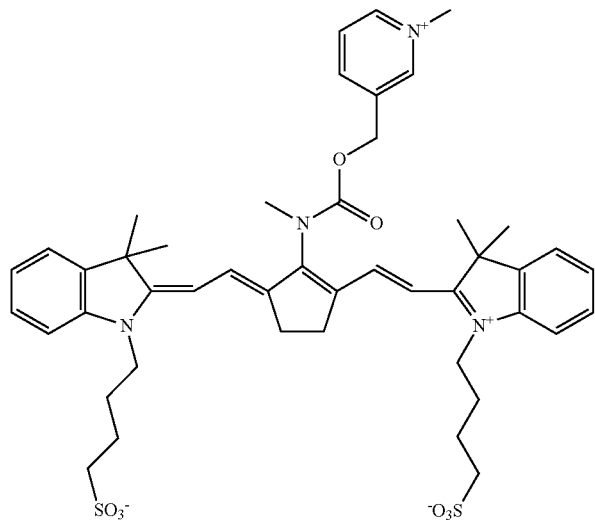

(A-19)
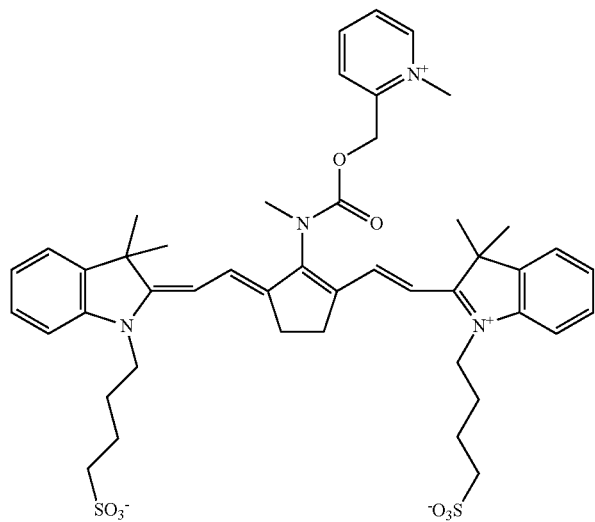
(A-20)
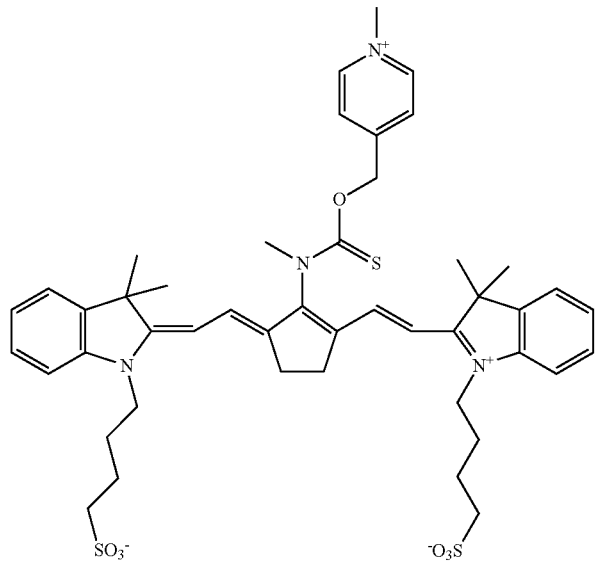
(A-21)
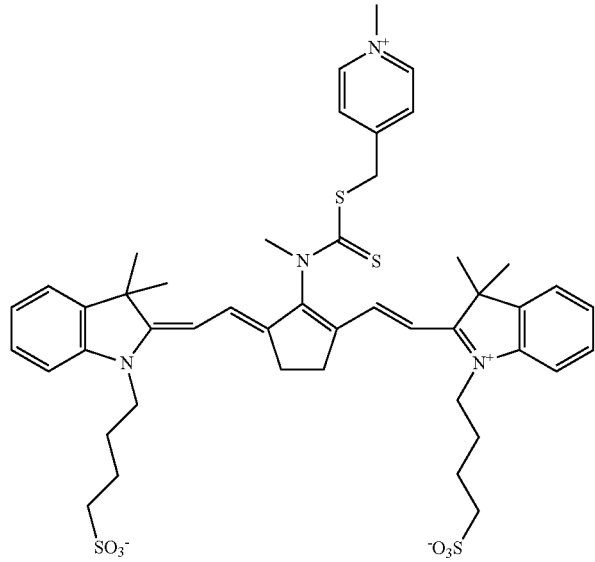

-continued
(A-22)
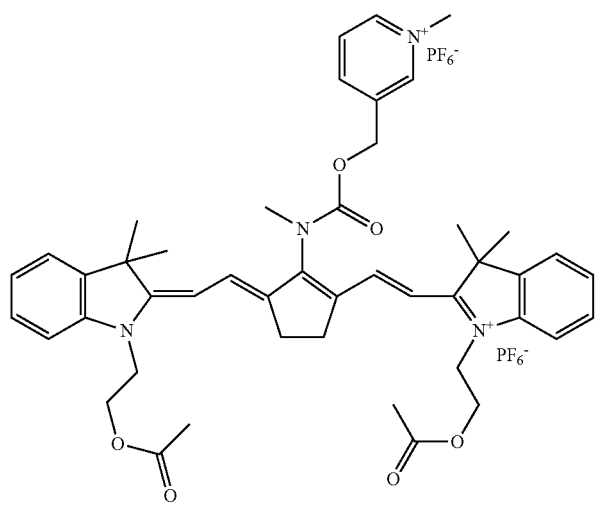
(A-23)
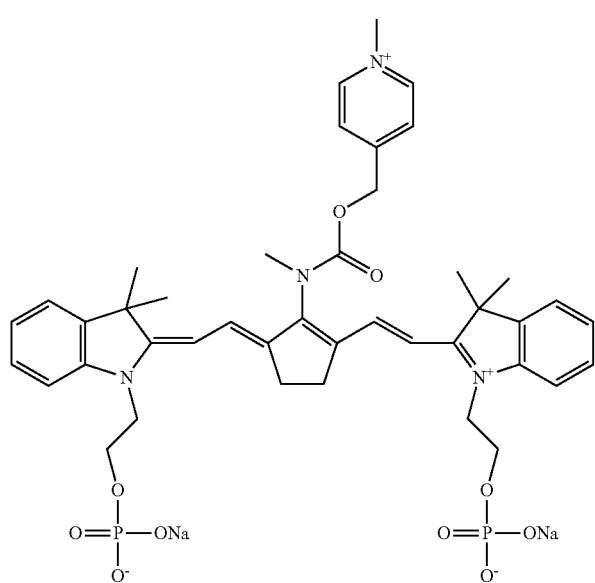
(A-24)
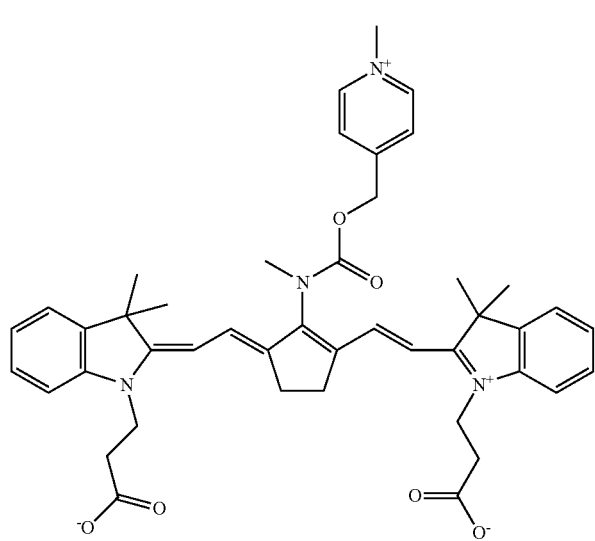

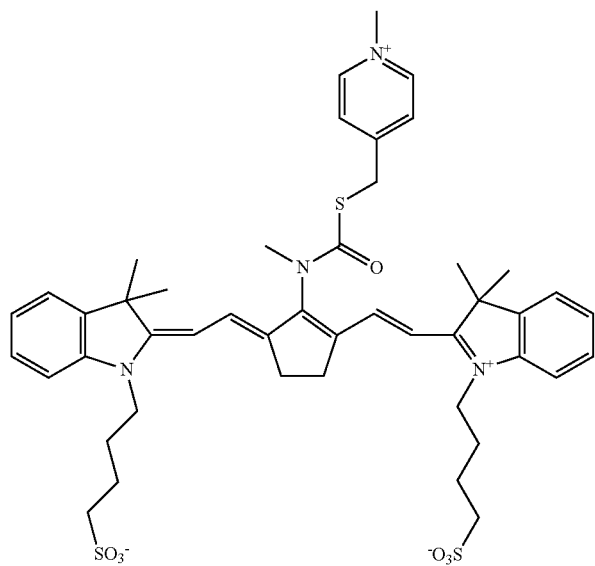
(A-25)
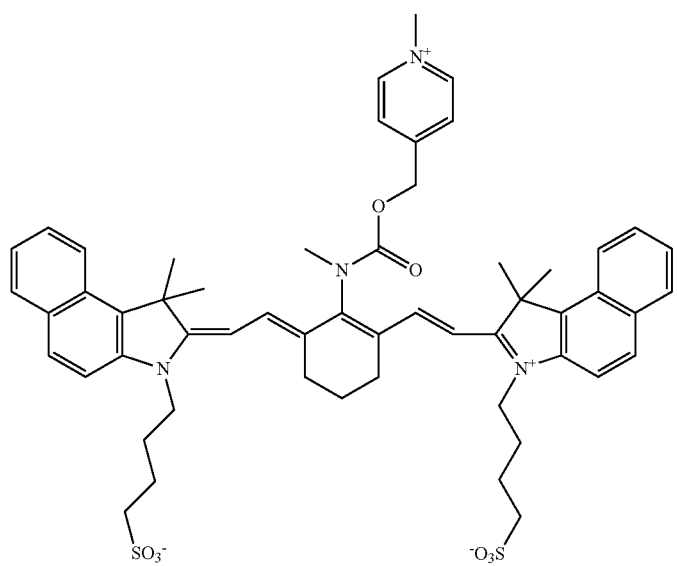
(A-26)

(A-27)
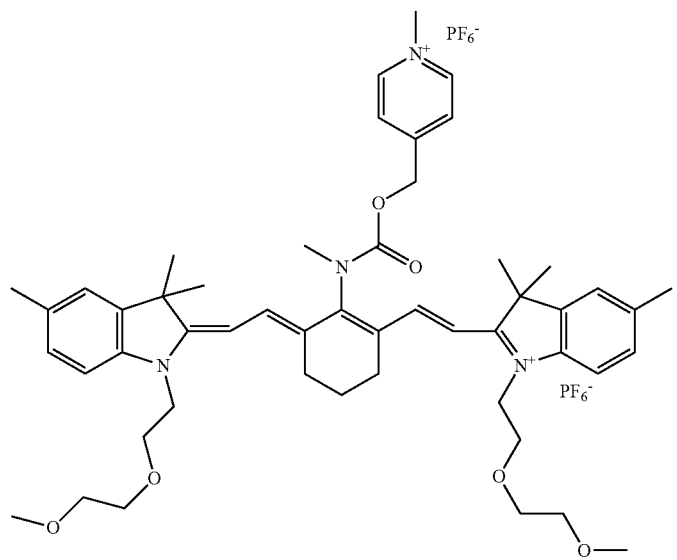
(A-28)
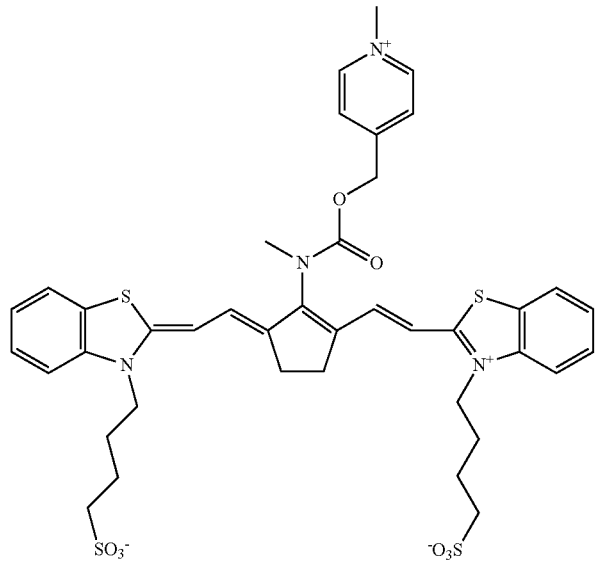

-continued
(A-29)
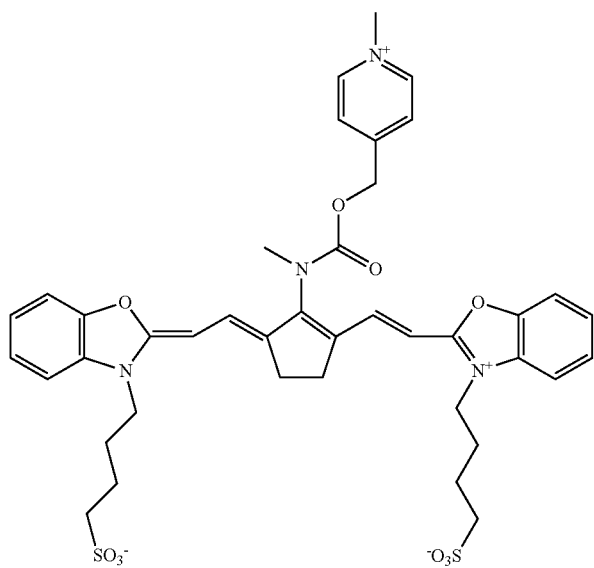
(A-30)
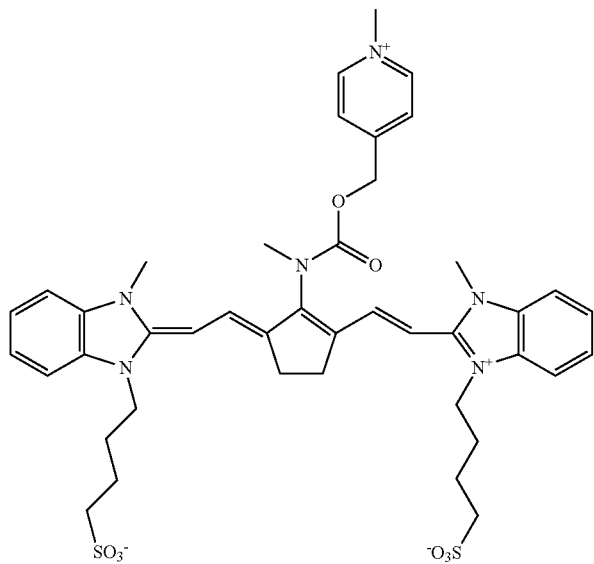
(A-31)
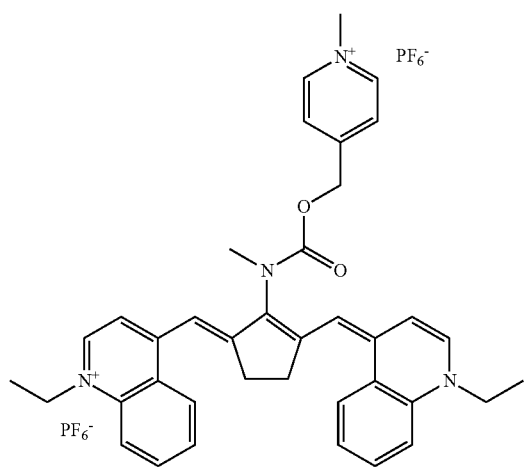

(A-32)
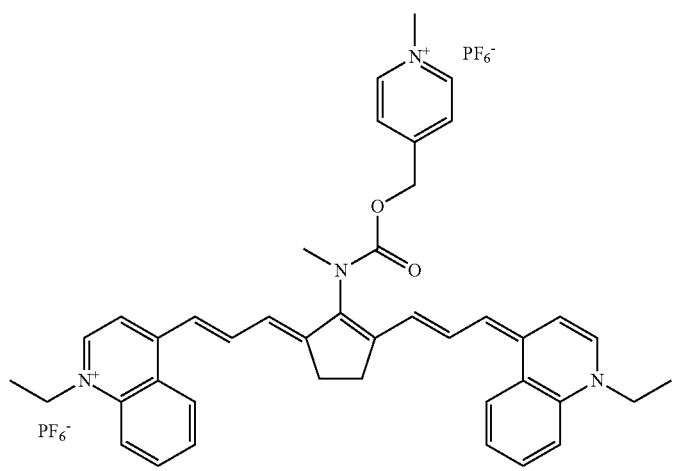
(A-33)
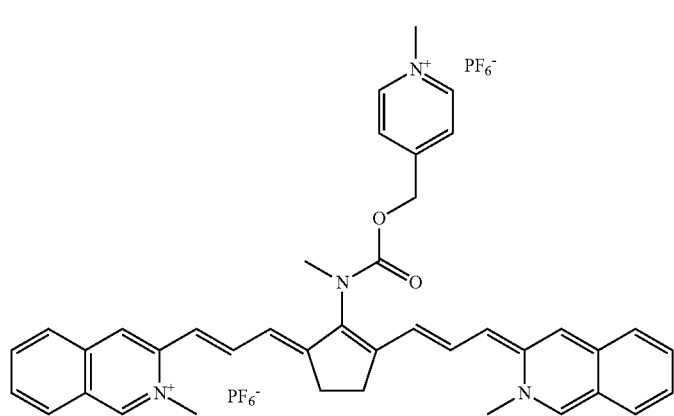
(A-34)
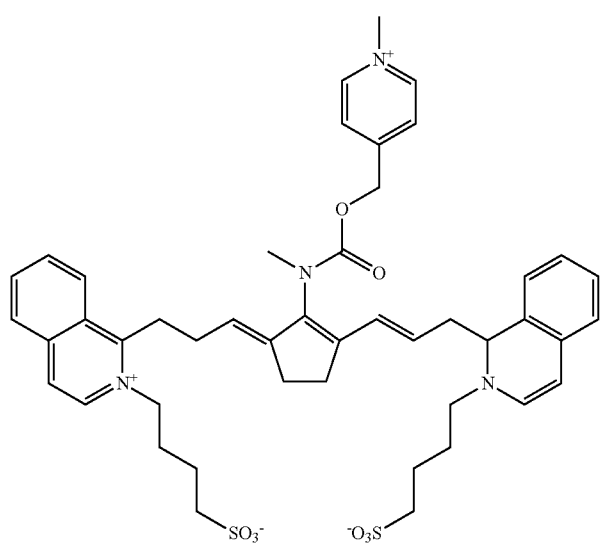

-continued
(A-35)
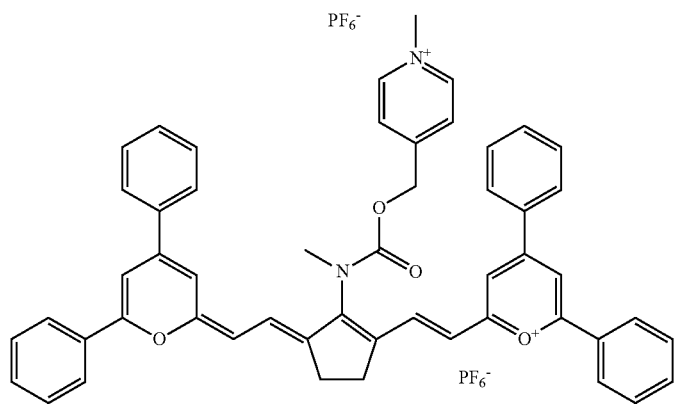
(A-36)
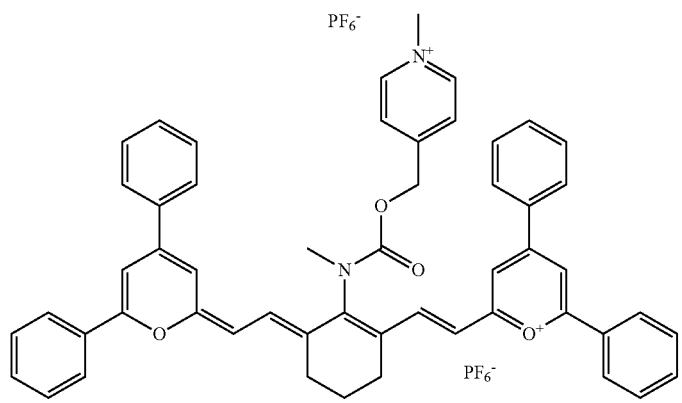
(A-37)
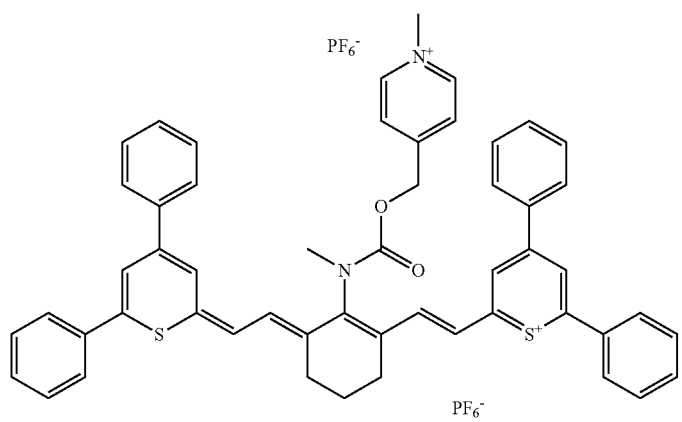
(A-38)
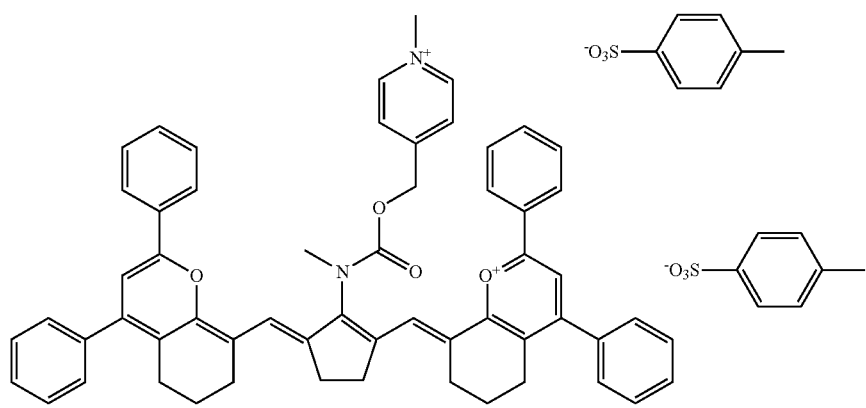

(A-39)
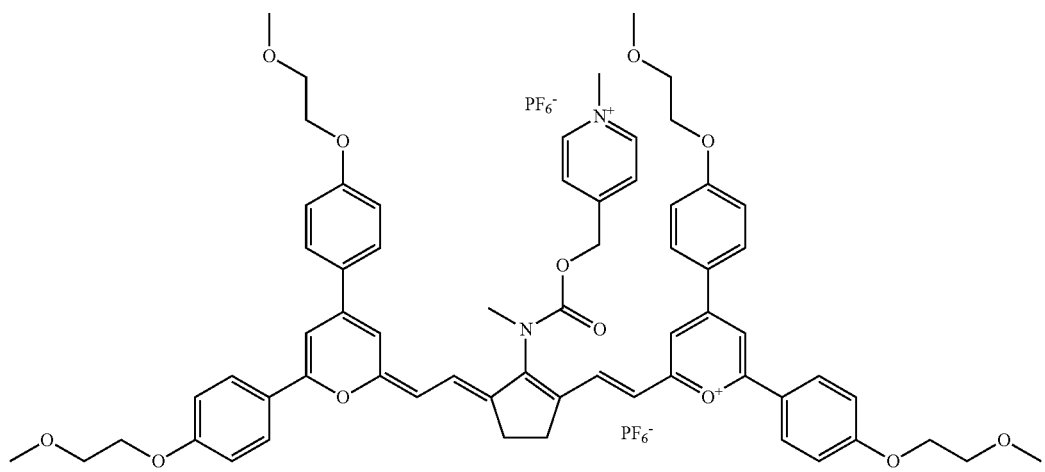
(A-40)
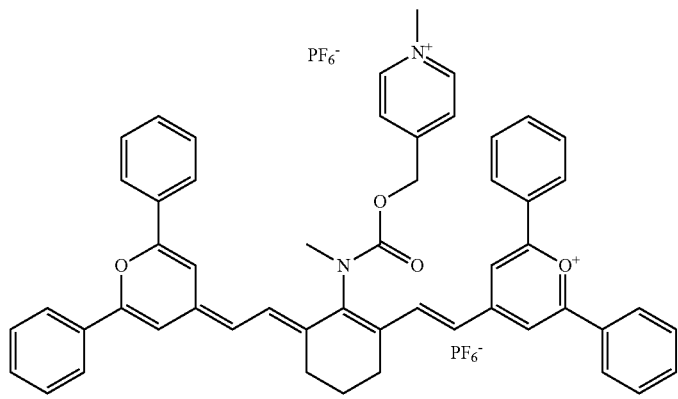
(A-41)
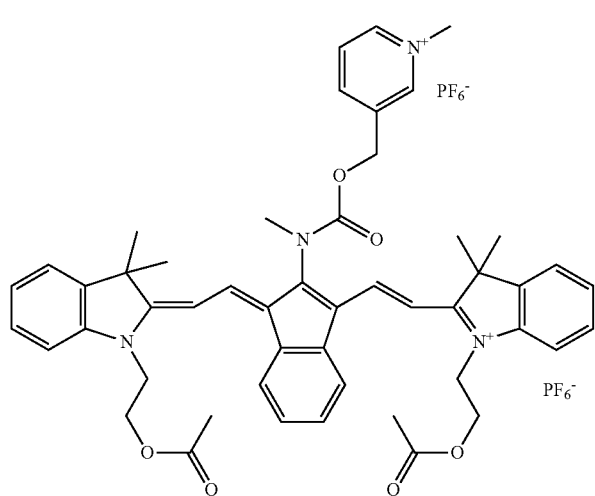

(A-42)
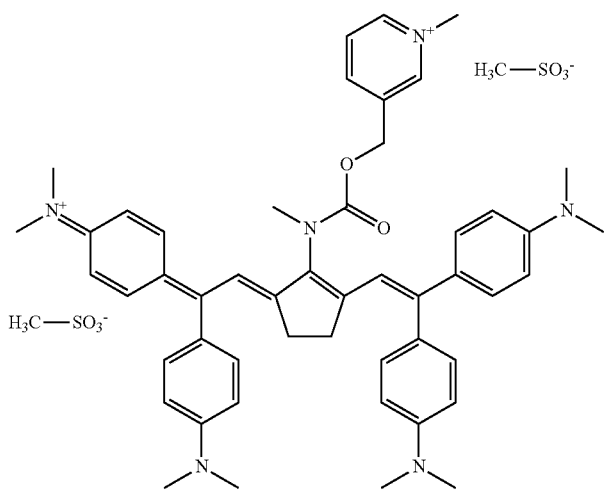
(A-43)
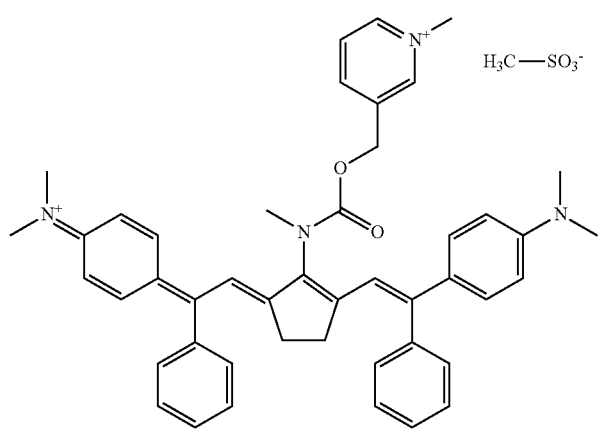
(A-44)
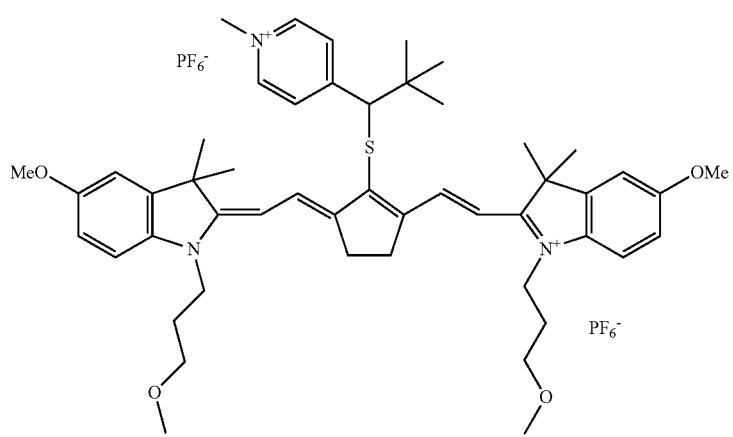

(A-45)
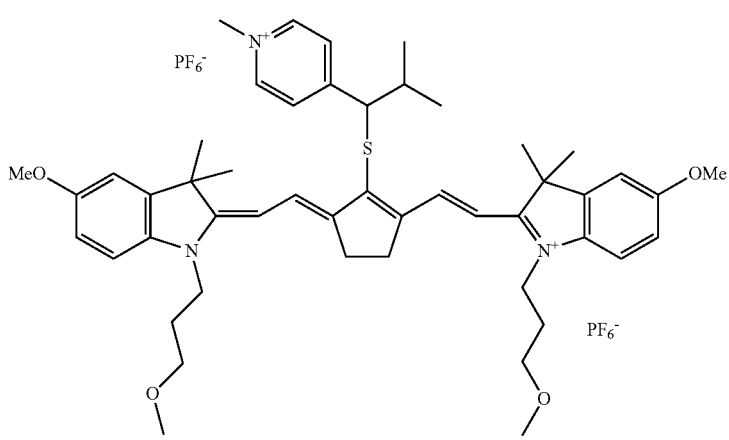
(A-46)
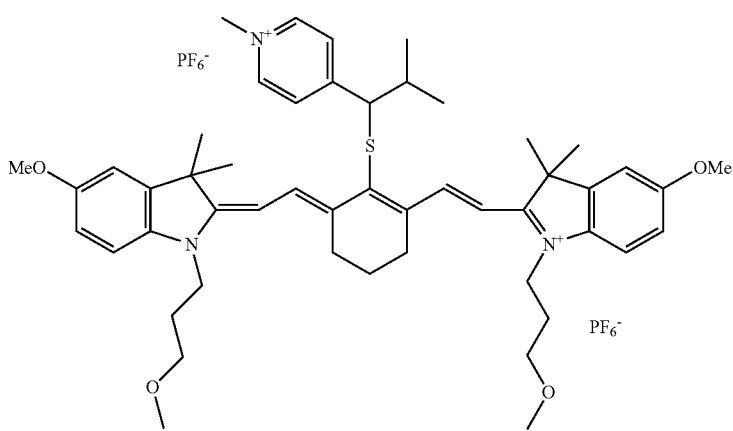
(A-47)
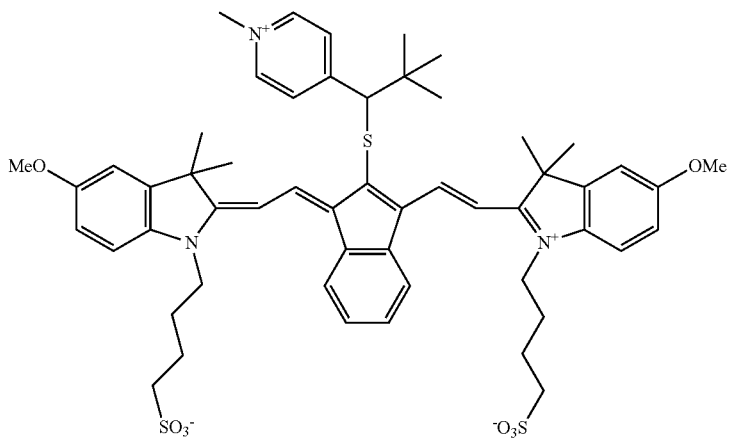

(A-48)
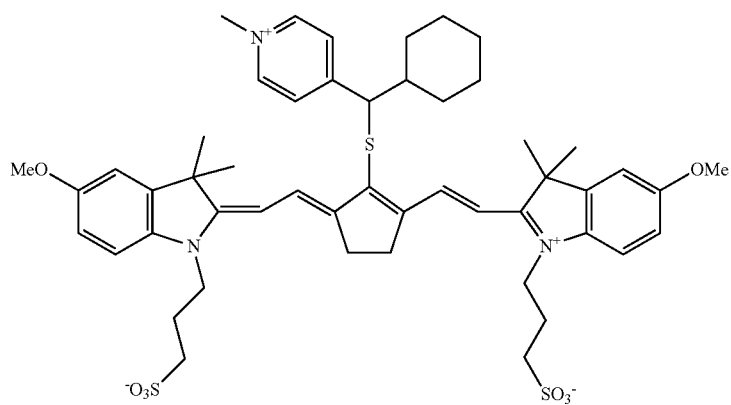
(A-49)
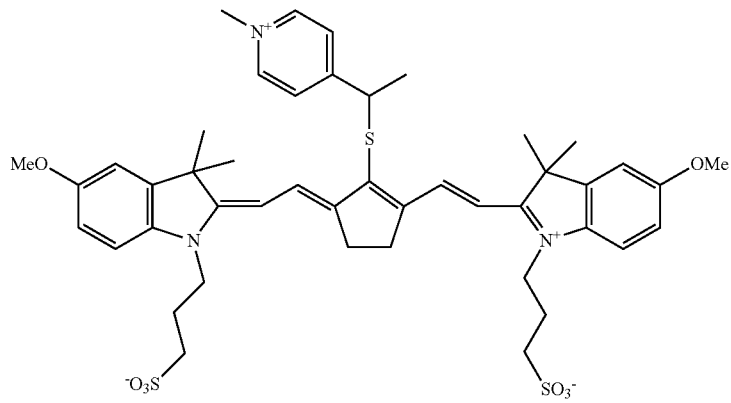
(A-50)
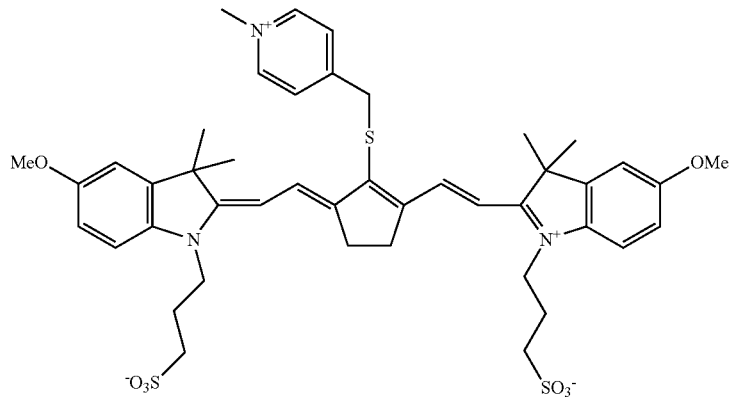
(A-51)
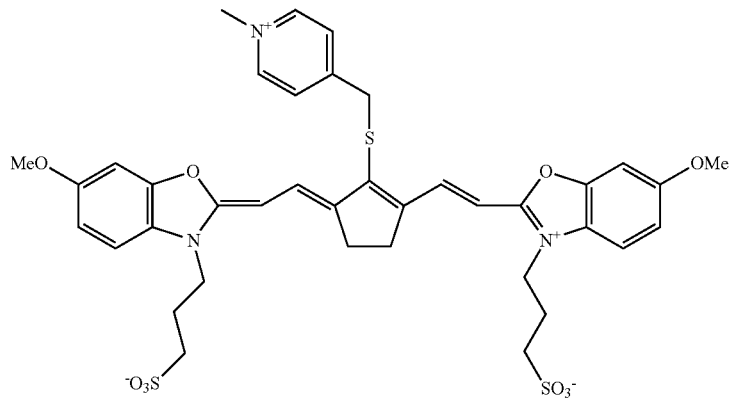

-continued
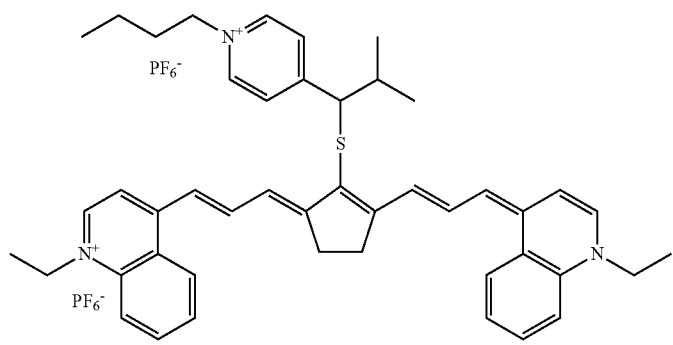
(A-52)
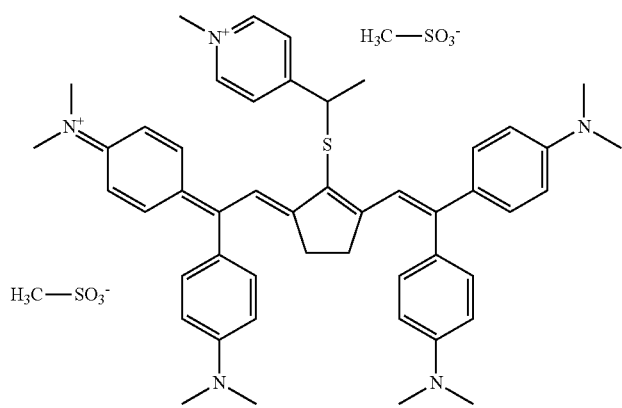
(A-53)
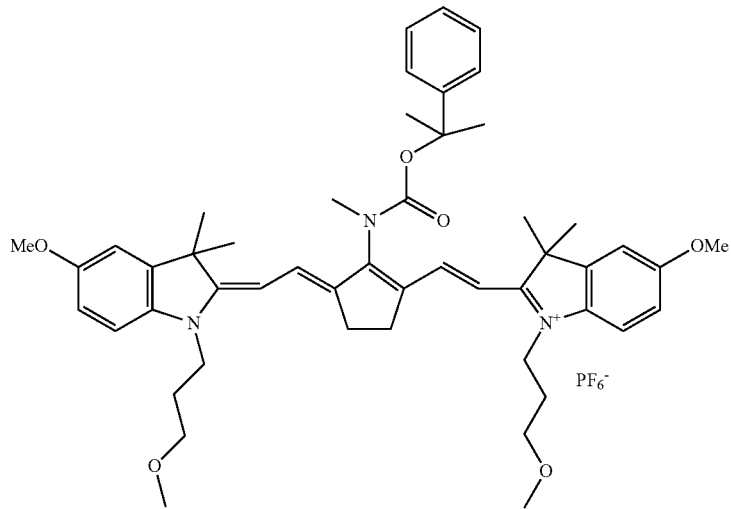
(A-54)

(A-55)
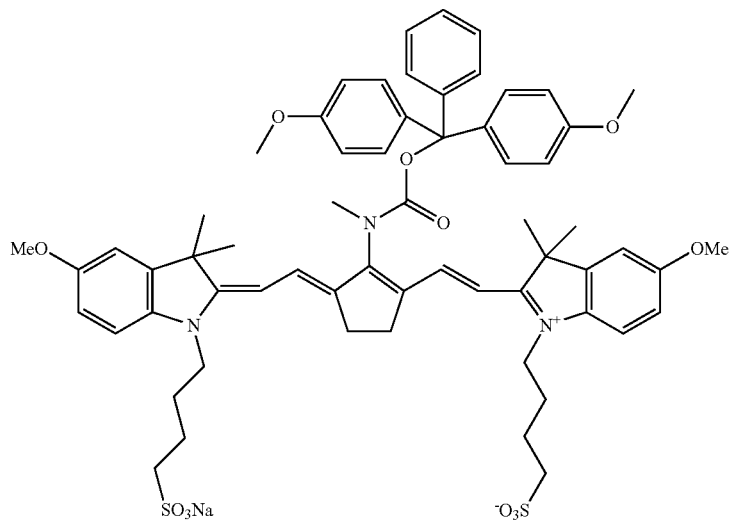
(A-56)
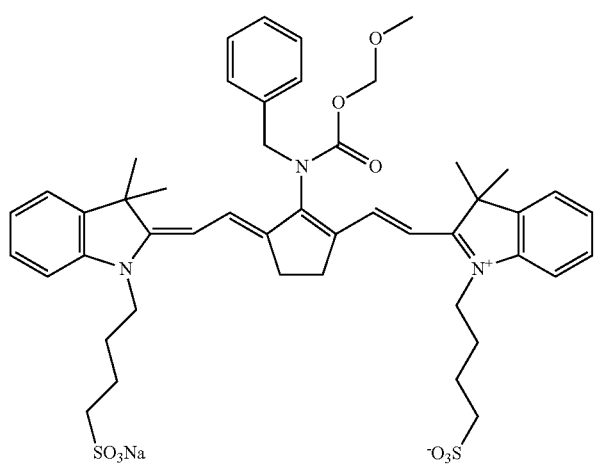
(A-57)
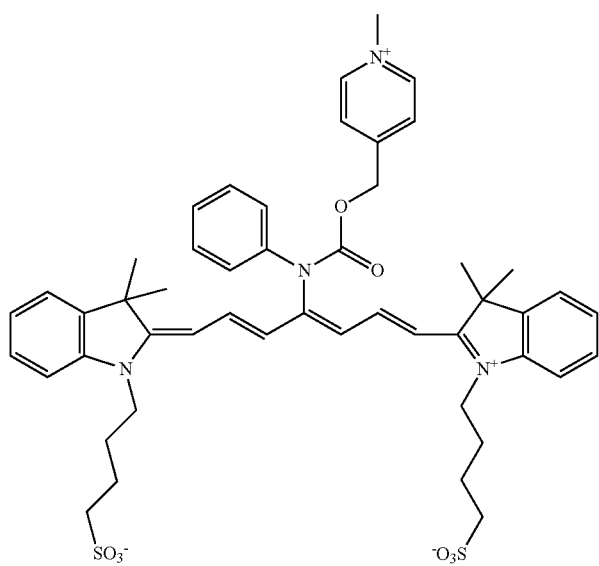

(A-58)
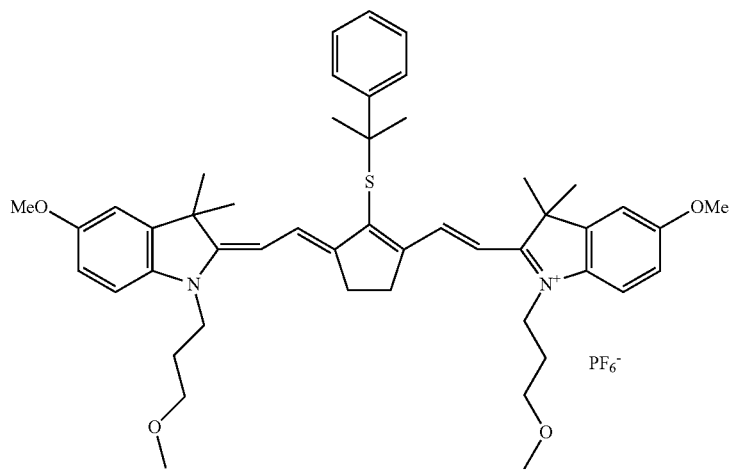
(A-59)
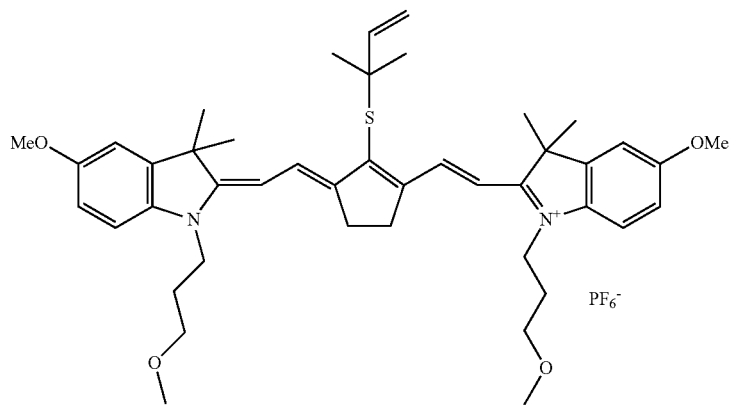
(A-60)
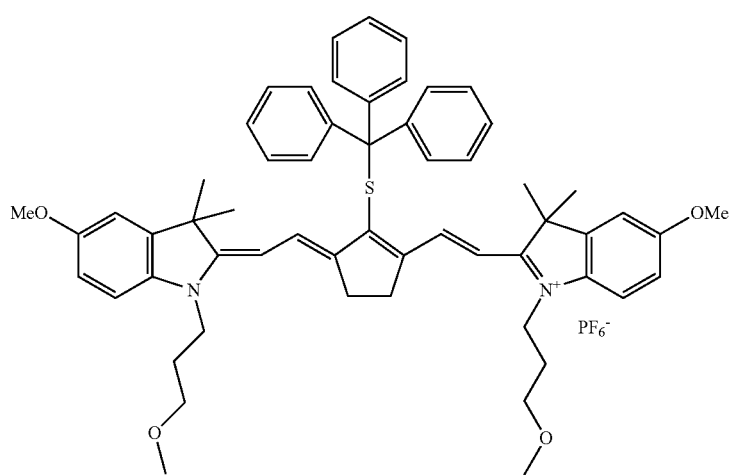

(A-61)
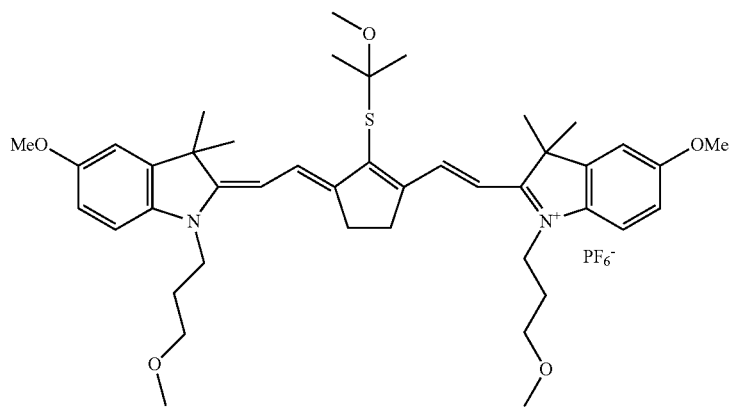
(A-62)
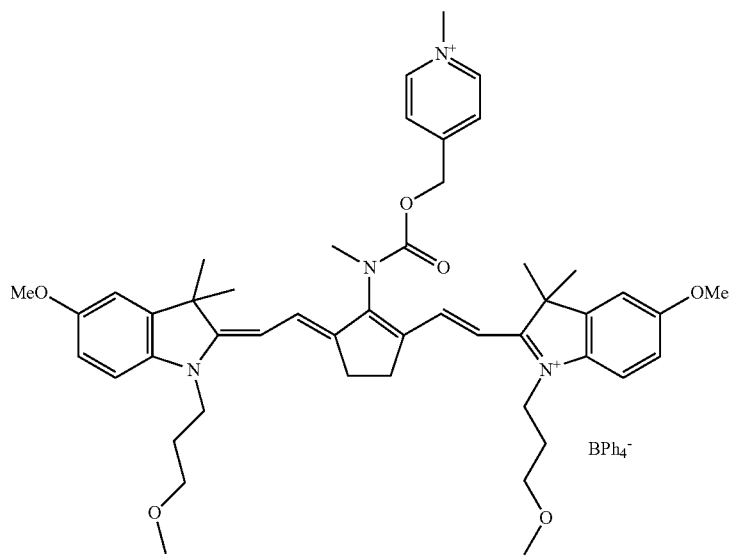
(A-63)
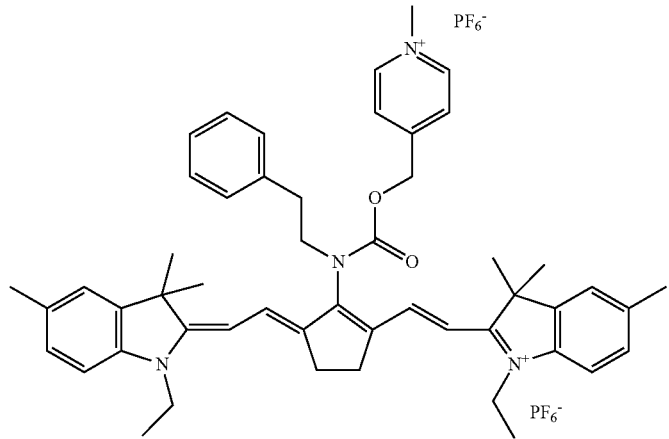

-continued

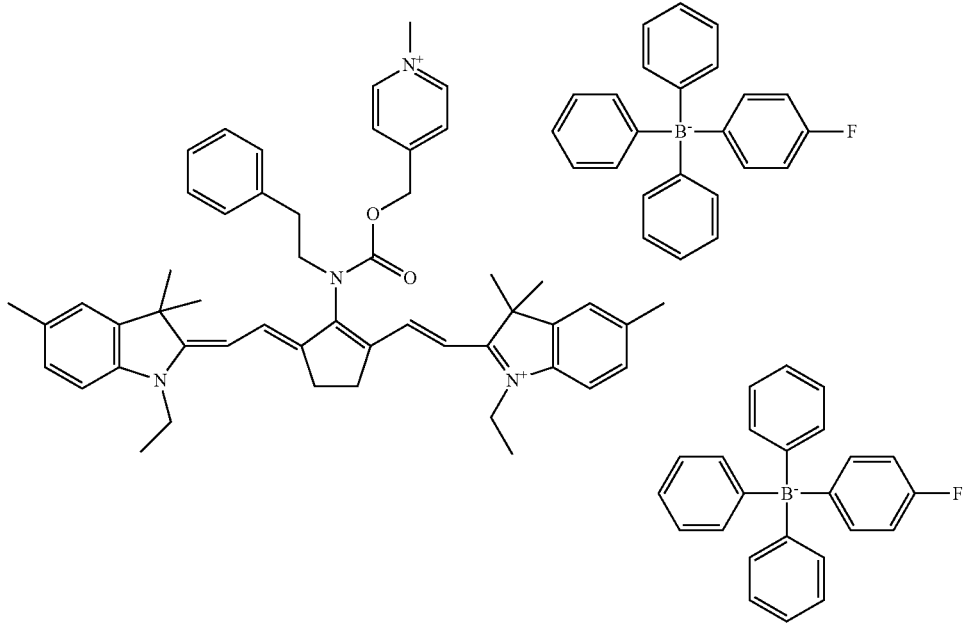

(A-64)

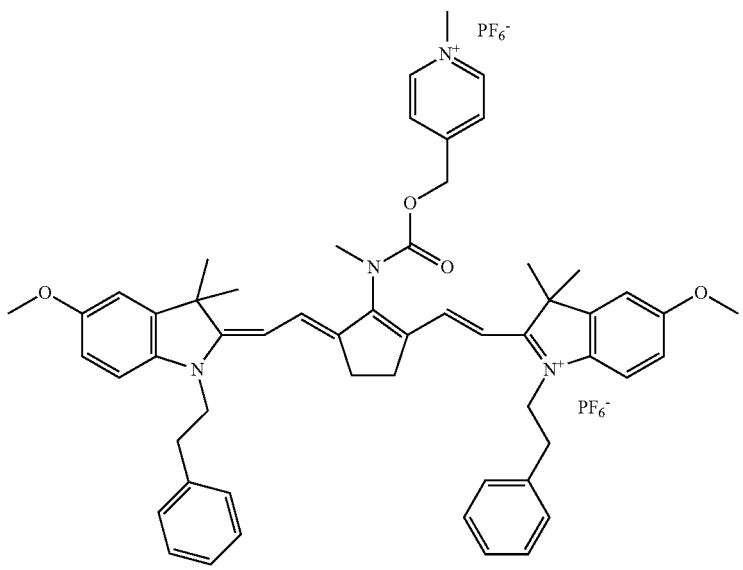

(A-65)

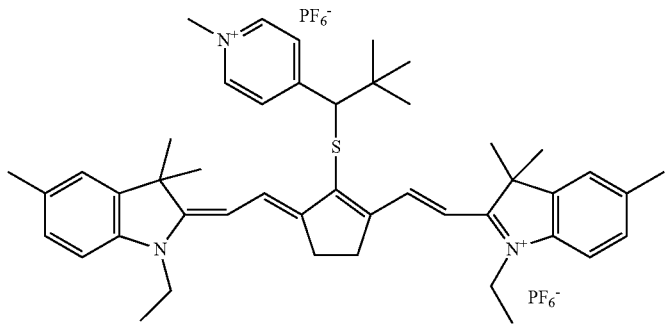

(A-66)

The compound represented by Formula 1 may be used singly or two or more of the compounds may be jointly used.

In the color developing composition according to the embodiment of the disclosure, the content of the compound represented by Formula 1 is preferably in a range of 0.1% to 95% by mass, more preferably in a range of 1% to 50% by mass, and still more preferably in a range of 1% to 20% by mass of the total solid content of the color developing composition. Meanwhile, the total solid content in the present disclosure refers to the total amount of components in the composition excluding volatile components such as a solvent.

The compound represented by Formula 1 is synthesized according to the following scheme 1 or 2.

For example, in the case of a compound having a group represented by Formula 2, the following scheme 1 is preferably exemplified, and, in the case of a compound having a group represented by Formula 3, the following scheme 2 is preferably exemplified.

(Scheme 1)

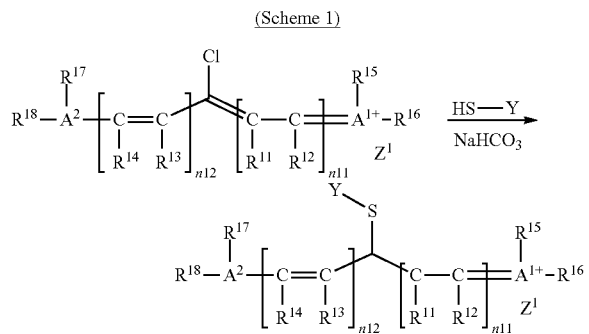

(Scheme 2)

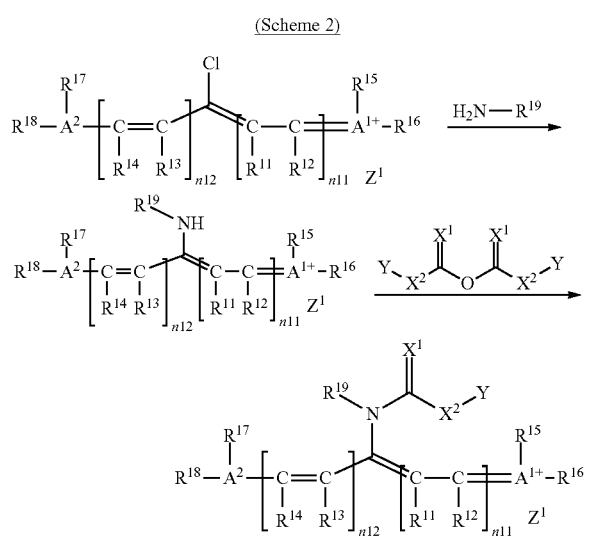

The color developing composition of the embodiment of the disclosure preferably includes a binder polymer.

In addition, the color developing composition of the embodiment of the disclosure preferably includes a borate compound.

Furthermore, the color developing composition of the embodiment of the disclosure is preferably the following first embodiment or the following second embodiment.

The first embodiment includes the compound represented by Formula 1 and a thermally adhesive particle.

The second embodiment includes the compound represented by Formula 1, a polymerizable compound, and a polymerization initiator.

In the second embodiment, an embodiment further including a thermally adhesive particle is also preferred.

Hereinafter, components that the color developing composition according to the embodiment of the disclosure other than the compound represented by Formula 1 will be described.

<Binder Polymer>

The color developing composition according to the embodiment of the disclosure preferably contains a binder polymer from the viewpoint of the coating property and the film-forming property. The kind of the polymer is not particularly limited as long as the polymer is a well-known polymer, but a polymer for forming a membrane is preferably exemplified. As the polymer for forming a membrane, a (meth)acrylic resin, polyurethane, polyester, polyamide, polyether, polycarbonate, polyurea, polyolefin, a vinyl resin, polyamine, and the like are exemplified. Regarding a form of the polymer that is used in the color developing composition, the polymer may be dissolved in and added to the composition. As the polymer that is dissolved in and added to the composition, a (meth)acrylic resin, polyurethane, polyester, and a vinyl resin are preferred.

In the case of being dissolved in and added to the composition, as the binder polymer preferable for on-machine development-type lithographic printing plate precursors (also referred to as the binder polymer for on-machine development), a (meth)acrylic resin, polyurethane, polyester, or a vinyl resin is preferred, and a (meth)acrylic resin or polyurethane is more preferred.

The binder polymer is particularly preferably a polymer having alkylene oxide chains. The polymer having alkylene oxide chains may have poly(alkylene oxide) portions in main chains or side chains and may be graft polymers having poly(alkylene oxide) in side chains or block copolymers of blocks constituted of repeating units containing poly(alkylene oxide) and blocks constituted of repeating units not containing poly(alkylene oxide).

In a case in which the binder polymer has poly(alkylene oxide) portions in main chains, polyurethane is preferred. Examples of polymers in main chains in a case in which the binder polymer has poly(alkylene oxide) portions in side chains include (meth)acrylic resins, polyvinyl acetal, polyurethane, polyurea, polyimide, polyamide, epoxy resins, polystyrene, novolac-type phenol resins, polyester, synthetic rubber, and natural rubber, and (meth)acrylic resins are particularly preferred.

The alkylene oxide is preferably an alkylene oxide having 2 to 6 carbon atoms and particularly preferably an ethylene oxide or a propylene oxide.

The repeating number of the alkylene oxide in the poly(alkylene oxide) portion is preferably in a range of 2 to 120, more preferably in a range of 2 to 70, and still more preferably in a range of 2 to 50.

In a case in which the repeating number of the alkylene oxide is 120 or smaller, a decrease in the membrane hardness is suppressed.

The poly(alkylene oxide) portion is preferably included in a structure represented by Formula (AO) as the side chain of the polymer and more preferably included in the structure represented by Formula (AO) as the side chain of the (meth)acrylic resin.

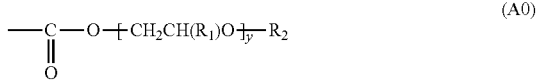

In Formula (AO), y represents 2 to 120, $R_1$ represents a hydrogen atom or an alkyl group, and $R_2$ represents a hydrogen atom or a monovalent organic group.

The monovalent organic group is preferably an alkyl group having 1 to 6 carbon atoms. Specific examples thereof include a methyl group, an ethyl group, an n-propyl group, an isopropyl group, an n-butyl group, a sec-butyl group, an isobutyl group, a tert-butyl group, an n-pentyl group, an isopentyl group, a neopentyl group, an n-hexyl group, an isohexyl group, 1,1-dimethyl butyl group, 2,2-dimethyl butyl group, a cyclopentyl group, and cyclohexyl group.

In Formula (AO), y is preferably 2 to 70 and more preferably 2 to 50. $R_1$ is preferably a hydrogen atom or a methyl group and particularly preferably a hydrogen atom. $R_2$ is particularly preferably a hydrogen atom or a methyl group.

In order to improve the membrane hardness of layers, the binder polymer preferably has a crosslinking property. In order to impart the crosslinking property to the binder polymer, it is necessary to impart a photocrosslinking property by introducing a crosslinking group such as an ethylenic unsaturated bond or impart a thermal crosslinking property by providing thermal plasticity to the binder polymer. The crosslinking group can be introduced to any place of the main chain or a side chain of a polymer, and, as an introduction method, an introduction method by copolymerization and an introduction method by polymerization and the subsequent polymer reaction are exemplified. In order to impart thermal plasticity, the glass transition temperature of the polymer needs to be adjusted.

Examples of the binder polymer having an ethylenic unsaturated bond in the main chain include polybutadiene, polyisoprene, and the like.

Examples of the binder polymer having an ethylenic unsaturated bond in a side chain include polymers having a (meth)acrylate group, a (meth)acrylamide group, a vinyl group, or an allyl group in a side chain.

As a method for adjusting the glass transition temperature, it is possible to change and adjust the composition of a monomer to be copolymerized or the molecular weight of the polymer.

The content of the crosslinking groups in the binder polymer (the content of unsaturated double bonds that can be radical-polymerized by means of iodimetry) is preferably in a range of 0.1 to 10.0 mmol, more preferably in a range of 1.0 to 7.0 mmol, and particularly preferably in a range of 2.0 to 5.5 mmol per gram of the binder polymer from the viewpoint of the membrane hardness.

Hereinafter, specific examples 1 to 11 of the binder polymer will be illustrated, but the present disclosure is not limited thereto. In the following exemplary compounds, numeric values shown beside individual repeating units (numeric values shown beside main chain repeating units) represent the molar percentages of the repeating units. The numeric value shown beside the repeating unit of a side chain represents the number of the repeating portion repeated. In addition, Me represents a methyl group, Et represents an ethyl group, and Ph represents a phenyl group.

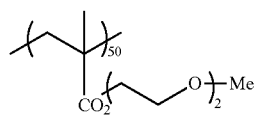

(1)

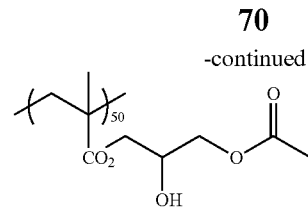

(2)

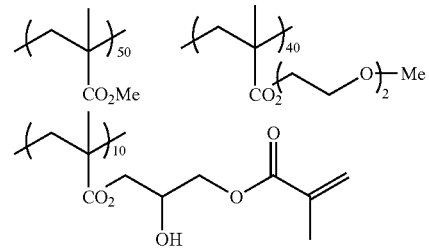

(3)

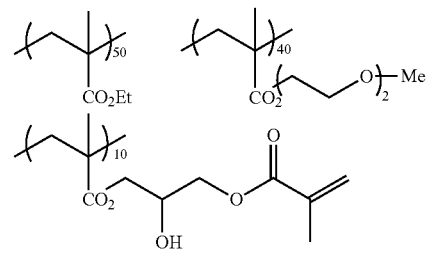

(4)

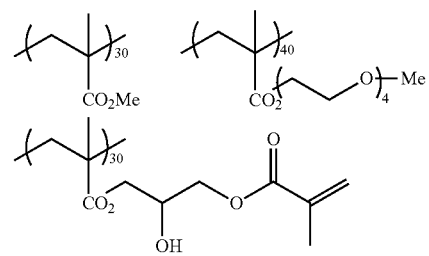

(5)

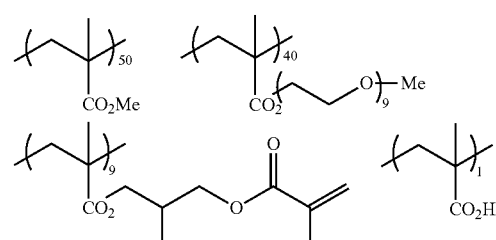

(6)

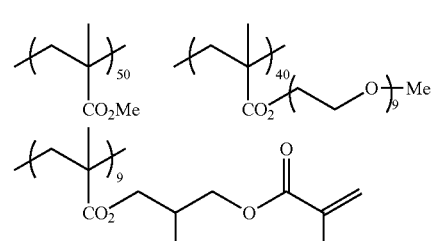

(7)

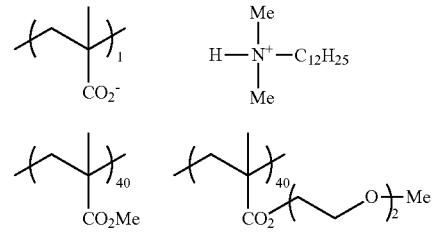

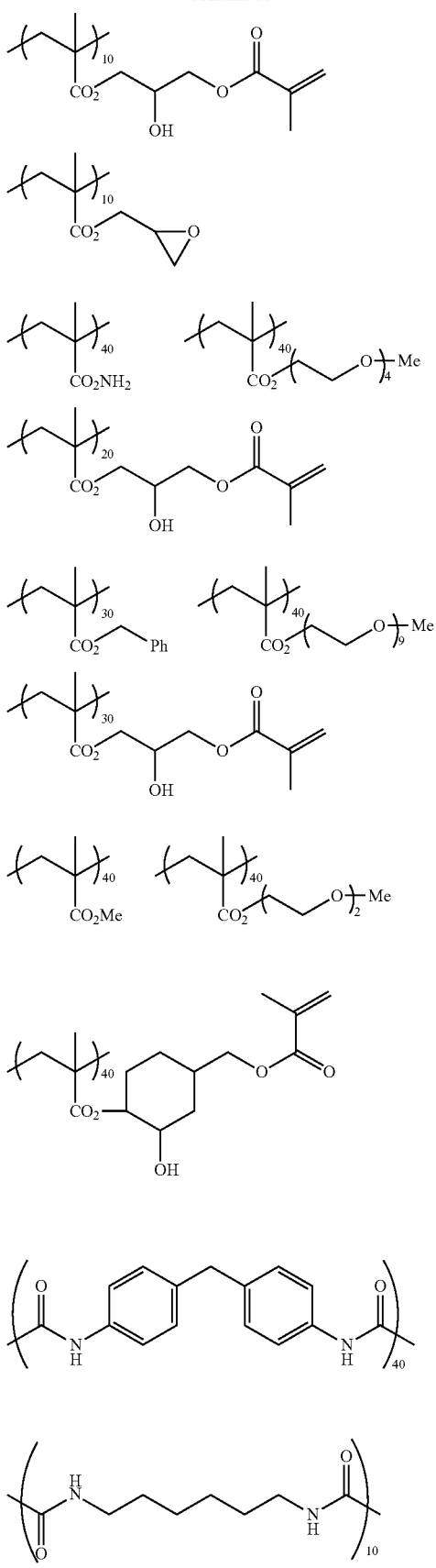

(8)

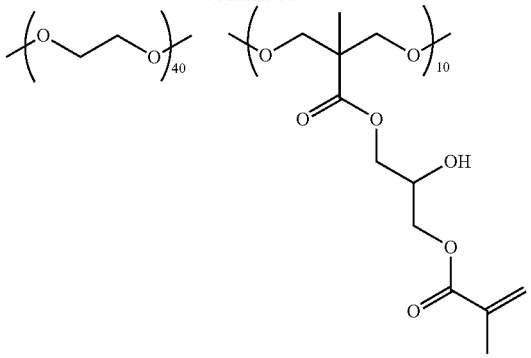

(9)

(10)

(11)

Regarding the molecular weight of the binder polymer that is used in the present disclosure, the weight average molecular weight (Mw) as a polystyrene equivalent value obtained by a gel permeation chromatography (GPC) method is preferably 2,000 or greater, more preferably 5,000 or greater, and still more preferably in a range of 10,000 to 300,000.

In addition, in the present disclosure, an oligomer refers to a substance having Mw of 800 or More and less than 2,000, and a polymer refers to a substance having Mw of 2,000 or more.

In the present invention, it is possible to jointly use hydrophilic polymers such as polyacrylic acid and polyvinyl alcohols described in JP2008-195018A as necessary. In addition, it is also possible to jointly use lipophilic polymers and hydrophilic polymers.

In the color developing composition according to the embodiment of the disclosure, the binder polymer may be used singly, or two or more binder polymers may be jointly used.

An arbitrary amount of the binder polymer can be added to the color developing composition.

The content of the binder polymer can be appropriately selected depending on the use or the like of the color developing composition, but is preferably 1% to 90% by mass and more preferably 5% to 80% by mass of the total solid content of the color developing composition.

<Micro Gel and Polymer Particle>

In order to improve the water solubility of the color developing composition and improve the on-machine developability in the case of using the color developing composition in a lithographic printing plate precursor, the color developing composition may contain at least one selected from the group consisting of a micro gel and a polymer particle. The micro gel or the polymer particle preferably crosslinks, melts, or crosslinks and melts by light or heat generated by the radiation of an infrared ray or changes in the hydrophobicity. The micro gel or the polymer particle is preferably at least one selected from the group consisting of a non-crosslinking micro gel, a crosslinking micro gel, a thermally adhesive particle, a thermally reactive polymer particle, and a polymer particle having a polymerizable group. These may have a core-shell structure and may include another compound.

As the thermally adhesive particle, polymer particles described in Research Disclosure No. 33303 of January 1992 and the specifications of JP1997-123387A (JP-H09-123387A), JP1997-131850A (JP-H09-131850A), JP1997-171249A (JP-H09-171249A), JP1997-171250A (JP-H09-171250A), and EP931647B are preferably exemplified.

Specific examples of a polymer that constitutes the thermally adhesive particle include homopolymers or copolymers of a monomer such as ethylene, styrene, vinyl chloride, methyl acrylate, ethyl acrylate, methyl methacrylate, ethyl methacrylate, vinylidene chloride, acrylonitrile, vinylcarbazole, or acrylate or methacrylate having a polyalkylene structure, and a mixture thereof. Preferred examples thereof include a copolymer having polystyrene, styrene, and acrylonitrile and methyl polymethacrylate.

As the thermally reactive polymer particle, a polymer particle having a thermally reactive group is exemplified. The polymer particle having a thermally reactive group forms a hydrophobic region by crosslinking by a thermal reaction or a change in a functional group during the crosslinking.

The thermally reactive group in the polymer particle having a thermally reactive group may be a functional group that causes any reaction as long as a chemical bond is formed, but is preferably a polymerizable group. Examples thereof include an ethylenic unsaturated group that causes a radical polymerization reaction (for example, an acryloyl group, a methacryloyl group, a vinyl group, an allyl group, or the like), a cationic polymerizable group (for example, a vinyl group, a vinyloxy group, an epoxy group, an oxetanyl group, or the like), an isocyanato group that causes an addition reaction or a blocked body thereof, an epoxy group, a vinyloxy group, a functional group having an active hydrogen atom that is a reaction partner thereof (for example, an amino group, a hydroxy group, a carboxy group, or the like), a carboxy group that causes a condensation reaction, a hydroxy group or an amino group that is a reaction partner, an acid anhydride that causes a ring-opening addition reaction, an amino group or a hydroxy group which is a reaction partner, and the like.

Examples of a microcapsule include a microcapsule including all or part of the constituent components of the color developing composition as described in JP2001-277740A and JP2001-277742A. The constituent components of the color developing composition can also be added outside the microcapsules. A preferred aspect of the color developing composition including the microcapsule is a color developing composition including hydrophobic constituent components in the microcapsule and containing hydrophilic constituent components outside the microcapsule.

The micro gel is capable of containing some of the constituent components of the color developing composition in at least one of the inside or surface thereof. Particularly, an aspect of a micro capsule that has a radical polymerizable group on the surface and thus turns into a reactive micro gel is preferred from the viewpoint of the image-forming sensitivity or the printing resistance.

In order to turn the components of the color developing composition into the microcapsule or the micro gel, a well-known method can be used.

In a case in which the polymer is included in the color developing composition according to the embodiment of the disclosure in a microcapsule, micro gel, or polymer particle form, the average primary particle diameter of the microcapsule, the micro gel, or the polymer particles is preferably in a range of 10 to 1,000 nm, more preferably in a range of 20 to 300 nm, and still more preferably in a range of 30 to 120 nm.

The average primary particle diameter can be measured using a light scattering method.

The content of the micro gel or the polymer particle is preferably 5% to 90% by mass of the total solid content of the color developing composition.

<Polymerization Initiator>

The color developing composition according to the embodiment of the disclosure may include a polymerization initiator. The polymerization initiator that is used in the color developing composition is a compound that generates polymerization-initiating species such as radicals or cations using the energy of either or both light and heat, and it is possible to appropriately select and use well-known thermopolymerization initiators, compounds having bonds with a small bond dissociation energy, photopolymerization initiators, and the like.

The polymerization initiator is preferably an infrared-sensitive polymerization initiator. In addition, the polymerization initiator is preferably a radical polymerization initiator.

Examples of the radical polymerization initiator include (a) organic halides, (b) carbonyl compounds, (c) azo compounds, (d) organic peroxides, (e) metallocene compounds, (f) azide compounds, (g) hexaarylbiimidazole compounds, (h) disulfone compounds, (i) oxime ester compounds, and (j) onium salt compounds.

(a) The organic halides are preferably, for example, compounds described in Paragraphs 0022 and 0023 of JP2008-195018A.

(b) The carbonyl compounds are preferably, for example, compounds described in Paragraph 0024 of JP2008-195018A.

(c) Examples of the azo compounds include azo compounds described in JP1996-108621A (JP-H08-108621A).

(d) The organic peroxides are preferably, for example, compounds described in Paragraph 0025 of JP2008-195018A.

(e) The metallocene compounds are preferably, for example, compounds described in Paragraph 0026 of JP2008-195018A.

(f) Examples of the azide compounds include compounds such as 2,6-bis(4-azidebenzylidene)-4-methylcyclohexanone.

(g) The hexaarylbiimidazole compounds are preferably, for example, compounds described in Paragraph 0027 of JP2008-195018A.

(h) Examples of the disulfone compounds include compounds described in each of JP1986-166544A (JP-S61-166544A) and JP2002-328465A.

(i) The oxime ester compounds are preferably, for example, compounds described in Paragraphs 0028 to 0030 of JP2008-195018A.

Among the polymerization initiators, from the viewpoint of curing properties, more preferred examples of the polymerization initiator include oxime esters and onium salts, and still more preferred examples thereof include onium salts such as iodonium salts, sulfonium salts, and azinium salts. In a case in which the polymerization initiator is used in the lithographic printing plate precursor, iodonium salts and sulfonium salts are particularly preferred. Specific examples of the iodonium salts and the sulfonium salts will be described below, but the present disclosure is not limited thereto.

Examples of the iodonium salts are preferably diphenyl iodonium salts, particularly preferably diphenyl iodonium salts having an electron-donating group as a substituent, for example, diphenyl iodonium salts substituted with alkyl groups or alkoxyl groups, and preferably asymmetric diphenyl iodonium salts. Specific examples thereof include diphenyliodonium=hexafluorophosphate, 4-methoxyphenyl-4-(2-methylpropyl) phenyliodonium=hexafluorophosphate, 4-(2-methylpropyl)phenyl-p-tolyliodonium=hexafluorophosphate, 4-hexyloxyphenyl-2,4,6-trimethoxyphenyl iodonium=hexafluorophosphate, 4-hexyloxyphenyl-2,4-diethoxyphenyl iodonium=tetrafluoroborate, 4-octyloxyphenyl-2,4,6-trimethoxyphenyl iodonium=1-perfluorobutane sulfonate, 4-octyloxyphenyl-2,4,6-trimethoxyphenyliodonium=hexafluorophosphate, and bis (4-t-butylphenyl)iodonium=hexafluorophosphate.

Examples of the sulfonium salts are preferably triarylsulfonium salts, particularly preferably triarylsulfonium salts having an electron-donating group as a substituent, for example, triarylsulfonium salts in which at least some of electron-attracting groups, for example, groups on aromatic rings are substituted with halogen atoms, and more preferably triarylsulfonium salts in which the total number of substituted halogen atoms on aromatic rings is four or greater. Specific examples thereof include triphenylsulfonium=hexafluorophosphate, triphenylsulfonium=benzoyl formate, bis(4-chlorophenyl) phenylsulfonium=benzoyl formate, bis(4-chlorophenyl)-4-methylphenylsulfonium=tetrafluoroborate, tris(4-chlorophenyl) sulfonium=3,5-bis(methoxycarbonyl) benzenesulfonate, tris(4-chlorophenyl) sulfonium=hexafluorophosphate, and tris(2,4-dichlorophenyl)sulfonium=hexafluorophosphate.

The polymerization initiator may be used singly or two or more polymerization initiators may be jointly used.

The content of the polymerization initiator is preferably in a range of 0.1% to 50% by mass, more preferably in a range of 0.5% to 30% by mass, and particularly preferably in a range of 0.8% to 20% by mass of the total solid content of the color developing composition.

<Polymerizable Compound>

It is preferable that the color developing composition according to the embodiment of the disclosure may include a polymerizable compound. The color developing composition according to the embodiment of the disclosure including the polymerizable compound is a curable color developing composition having a polymerization curing function in addition to color developability by means of heat supply or exposure to infrared rays.

In addition, from the viewpoint of curing properties, the color developing composition according to the embodiment of the disclosure can be preferably used as a curable composition including the polymerization initiator and the polymerizable compound and can be more preferably used as an infrared ray-curable or infrared-sensitive color developing composition.

The polymerizable compound that is used in the color developing composition may be, for example, a radical polymerizable compound or a cationic polymerizable compound, but is preferably an addition polymerizable compound having at least one ethylenic unsaturated bond (ethylenic unsaturated compound). The ethylenic unsaturated compound is preferably a compound having at least one terminal ethylenic unsaturated bond and more preferably a compound having two or more terminal ethylenic unsaturated bonds. The polymerizable compound may have a chemical form, for example, a monomer, a prepolymer, that is, a dimer, a trimer, or an oligomer, or a mixture thereof.

Examples of the monomer include unsaturated carboxylic acids (for example, acrylic acid, methacrylic acid, itaconic acid, crotonic acid, isocrotonic acid, and maleic acid), esters thereof, and amides thereof, and esters of unsaturated carboxylic acids and polyvalent amine compounds and amides of unsaturated carboxylic acids and polyvalent alcohol compounds are preferably used. In addition, addition reaction products between unsaturated carboxylic acid esters or amides having nucleophilic substituents such as hydroxy groups, amino groups, or mercapto groups and monofunctional or polyfunctional isocyanates or epoxies, dehydration condensation reaction products with monofunctional or polyfunctional carboxylic acids, and the like are also preferably used. In addition, addition reaction products between unsaturated carboxylic acid esters or amides having electrophilic substituents such as isocyanate groups and epoxy groups and monofunctional or polyfunctional alcohols, amines, or thiols, furthermore, substitution reaction products between unsaturated carboxylic acid esters or amides having dissociable substituents such as halogen atoms and tosyloxy groups and monofunctional or polyfunctional alcohols, amines, or thiols are also preferred. In addition, as additional examples, compound groups obtained by substituting the unsaturated carboxylic acids with unsaturated phosphonic acids, styrene, vinyl ethers, or the like can also be used. These compounds are described in JP2006-508380A, JP2002-287344A, JP2008-256850A, JP2001-342222A, JP1997-179296A (JP-H09-179296A), JP1997-179297A (JP-H09-179297A), JP1997-179298A (JP-H09-179298A), JP2004-294935A, JP2006-243493A, JP2002-275129A, JP2003-064130A, JP2003-280187A, JP1998-333321A (JP-H10-333321A), and the like.

As specific examples of monomers of esters of polyvalent alcohol compounds and unsaturated carboxylic acids, acrylic acid esters include ethylene glycol diacrylate, 1,3-butanediol diacrylate, tetramethylene glycol diacrylate, propylene glycol diacrylate, trimethylolpropane triacrylate, hexanediol diacrylate, tetraethylene glycol diacrylate, pentaerythritol tetraacrylate, sorbitol triacrylate, isocyanuric acid ethylene oxide (EO)-modified triacrylate, polyester acrylate oligomers, and the like are exemplified. As methacrylic acid esters, tetramethylene glycol dimethacrylate, neopentyl glycol dimethacrylate, trimethylolpropane trimethacrylate, ethylene glycol dimethacrylate, pentaerythritol trimethacrylate, bis[p-(3-methacryloxy-2-hydroxypropoxy)phenyl] dimethyl methane, bis[p-(methacryloxyethoxy)phenyl] dimethyl methane, and the like. In addition, specific examples of monomers of amides of polyvalent amine compounds and unsaturated carboxylic acids include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide, xylylene bismethacrylamide, and the like are exemplified.

In addition, urethane-based addition polymerizable compounds produced using an addition reaction between an isocyanate and a hydroxy group are also preferred, and specific examples thereof include vinyl urethane compounds having two or more polymerizable vinyl groups in one molecule obtained by adding vinyl monomers having a hydroxy group represented by Formula (M) to a polyisocyanate compound having two or more isocyanate groups in one molecule which is described in, for example, JP1973-41708B (JP-S48-41708B).

$$CH_2=C(R^{M4})COOCH_2CH(R^{M5})OH \qquad (M)$$

In Formula (M), each of $R^{M4}$ and $R^{M5}$ independently represents a hydrogen atom or a methyl group.

In addition, urethane acrylates described in JP1976-037193A (JP-S51-037193A), JP1990-32293B (JP-H02-32293B), JP1990-16765B (JP-H02-16765B), JP2003-

344997A, and JP2006-065210A, urethane compounds having ethylene oxide-based skeletons described in JP1983-49860B (JP-S58-49860B), JP1981-17654B (JP-S56-17654B), JP1987-39417B (JP-S62-39417B), JP1987-39418B (JP-S62-39418B), JP2000-250211A, and JP2007-094138A, and urethane compounds having hydrophilic groups described in U.S. Pat. No. 7,153,632B, JP1996-505958A (JP-H08-505958A), JP2007-293221A, and JP2007-293223A are also preferred.

The details of the structures of the polymerizable compound and the method for using the polymerizable compound such as whether to use the polymerizable compound singly or jointly and the amount of the polymerizable compound added can be arbitrarily set in consideration of the applications and the like of the final color developing composition.

The content of the polymerizable compound is preferably in a range of 5% to 75% by mass, more preferably in a range of 10% to 70% by mass, and particularly preferably in a range of 15% to 60% by mass of the total solid content of the color developing composition.

<Radical Production Aid>

The color developing composition according to the embodiment of the disclosure may contain a radical production aid. The radical production aid contributes to the improvement of the printing resistance in lithographic printing plates in a case in which the color developing composition is used for image-recording layers in the lithographic printing plate precursors. Examples of the radical production aid include five kinds of radical production aids described below.

(i) Alkyl or arylate complexes: It is considered that carbon-hetero bonds are oxidatively cleaved and active radicals are generated. Specific examples thereof include borate compounds and the like.

(ii) Amino acetate compounds: It is considered that C—X bonds on carbon adjacent to nitrogen are cleaved due to oxidation and active radicals are generated. X is preferably a hydrogen atom, a carboxy group, a trimethylsilyl group, or a benzyl group. Specific examples thereof include N-phenylglycines (which may have a substituent in a phenyl group), N-phenyl iminodiacetic acids (which may have a substituent in a phenyl group), and the like.

(iii) Sulfur-containing compounds: The above-described amino acetate compounds in which a nitrogen atom is substituted with a sulfur atom are capable of generating active radicals by means of the same action. Specific examples thereof include phenylthioacetic acids (which may have a substituent in a phenyl group) and the like.

(iv) Tin-containing compounds: The above-described amino acetate compounds in which a nitrogen atom is substituted with a tin atom are capable of generating active radicals by means of the same action.

(v) Sulfinates: Active radicals can be generated by means of oxidation. Specific examples thereof include sodium aryl sulfinate and the like.

Among these radical production aids, the color developing composition preferably contains a borate compound. The borate compound is preferably a tetraaryl borate compound or a monoalkyltriaryl borate compound, more preferably a tetraaryl borate compound from the viewpoint of the stability of the compound and the potential difference described below, and particularly preferably a tetraaryl borate compound having one or more aryl groups having an electron-attracting group from the viewpoint of the potential difference described below.

The electron-attracting group is preferably a group having a positive σ value of the Hammett equation and more preferably a group having a σ value of the Hammett equation in a range of 0 to 1.2. The σ value of the Hammett (the σp value and the σm value) are described in detail in Hansch, C.; Leo, A.; Taft, R. W., Chem. Rev., 1991, 91, 165 to 195.

The electron-attracting group is preferably a halogen atom, a trifluoromethyl group, or a cyano group and more preferably a fluorine atom, a chlorine atom, a trifluoromethyl group, or a cyano group.

A counter cation in the borate compound is preferably an alkali metal ion or a tetraalkyl ammonium ion and more preferably a sodium ion, a potassium ion, or a tetrabutylammonium ion.

In addition, in a case in which the color developing composition of the present invention includes the borate compound, the potential difference $\Delta G2$ between the highest occupied molecular orbital (HOMO) of the compound represented by Formula 1 and the highest occupied molecular orbital of the borate compound ($\Delta G2$=the HOMO of a HOMO borate compound of the compound represented by Formula (1)) is preferably 0.500 eV or more, more preferably 0.585 eV or more, and particularly preferably 0.608 to 1.000 eV.

In a case in which the potential difference between the HOMO of the compound represented by Formula 1 and the HOMO of the borate compound is in the above-described range, and the compound represented by Formula 1 has a group represented by Formula 5, it is considered that the stability of the borate compound while not exposed to heat or infrared rays is excellent, and, in a case in which the borate compound is exposed to heat or infrared rays, electrons migrate from the HOMO of the borate compound to the HOMO of the compound represented by Formula 1, and thus the excitation of electrons to the lowest unoccupied molecular orbital (LUMO) of the compound represented by Formula 1 is accelerated, and the decomposition of the compound represented by Formula 1 is accelerated. In addition, it is considered that the electron migration from the compound represented by Formula 1 to the polymerization initiator is also accelerated, and contribution is made to the improvement of the printing resistance in lithographic printing plates in a case in which the color developing composition is used for an image-recording layer in the lithographic printing plate precursor.

The HOMO and LUMO of the compound represented by Formula 1 are computed using the following method.

First, counter anions in compounds which are computation subjects are ignored.

Quantum chemical calculation software Gaussian 09 is used, and structure optimization is carried out in DFT (B3LYP/6-31G(d)).

The molecular orbital (MO) energy is calculated using the structure obtained by means of the structure optimization in DFT (B3LYP/6-31+G(d,p)/CPCM (solvent=methanol)).

The MO energy Epre (unit: hartree) obtained by the above-described MO energy calculation is converted to Eaft (unit: eV) which is used as the HOMO and LUMO values in the present disclosure using the following expression.

$$Eaft = 0.823168 \times 27.2114 \times Epre - 1.07634$$

Meanwhile, 27.2114 is simply a coefficient for converting hartree to eV, 0.823168 and −1.07634 are adjustment coefficients, and the HOMO and LUMO of compounds which are computation subjects are specified so that computation matches actually measured values.

ΔG2 is obtained from the difference between the HOMO of the compound represented by Formula 1 and the HOMO of the borate compound (ΔG2=the HOMO of the compound represented by Formula 1—the HOMO of the borate compound).

Specific examples of the borate compound include compounds illustrated below. Here, $X_c^+$ represents a monovalent cation and is preferably an alkali metal ion or a tetraalkyl ammonium ion and more preferably an alkali metal ion or a tetrabutyl ammonium ion. In addition, Bu represents an n-butyl group.

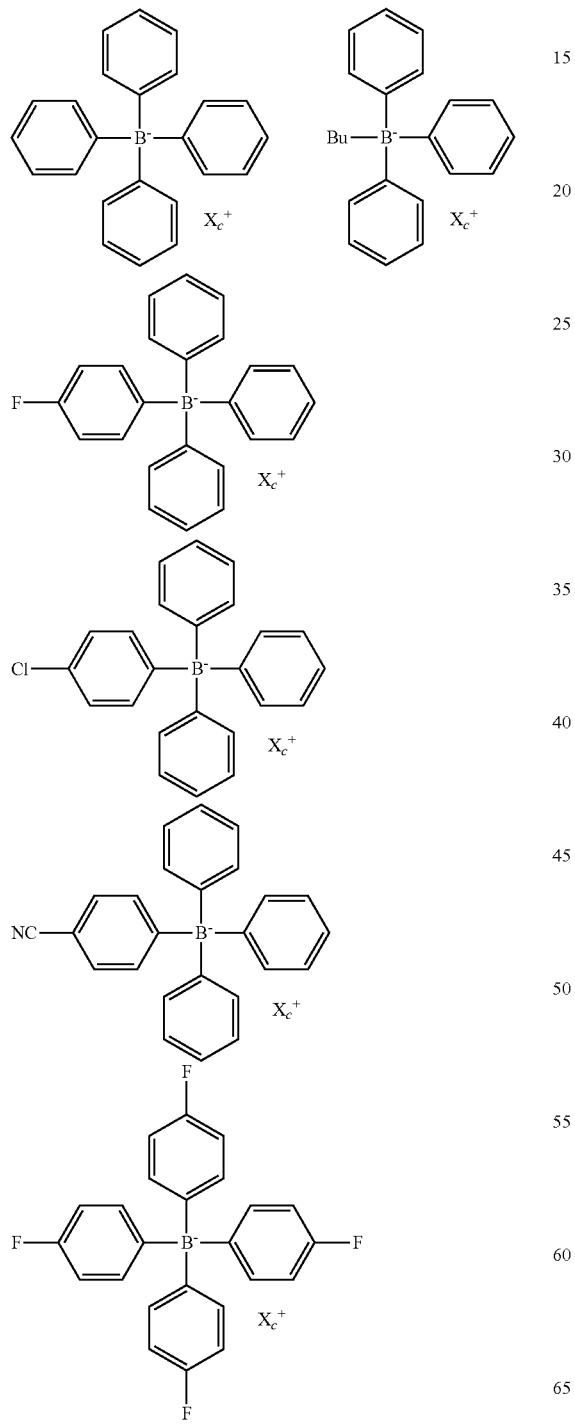

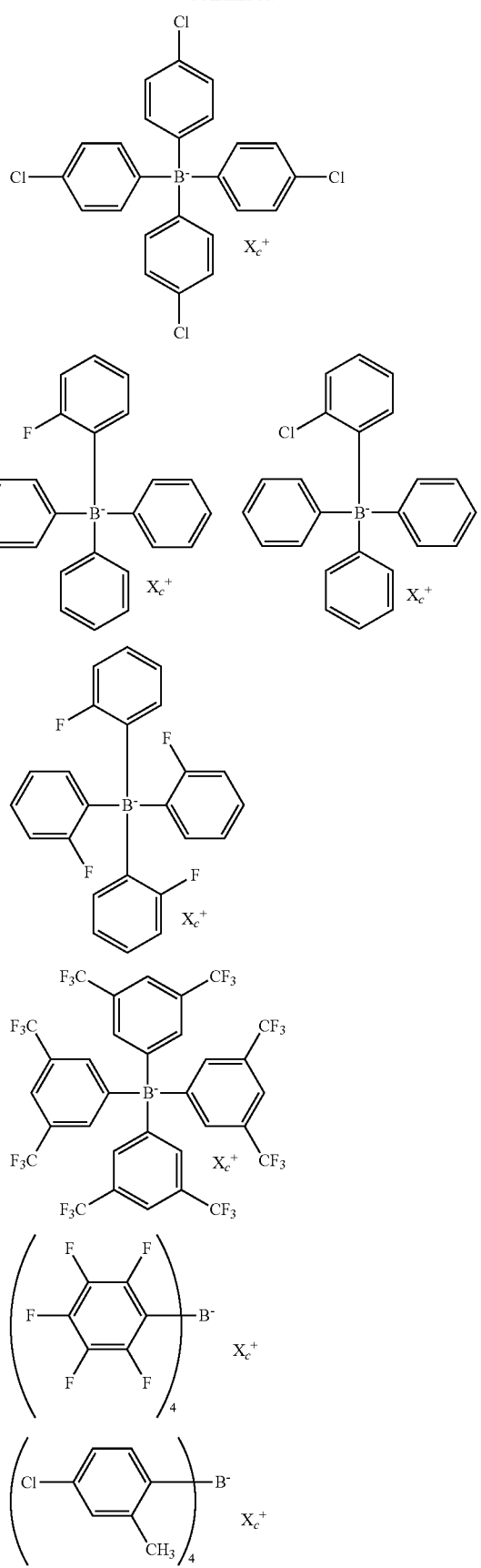

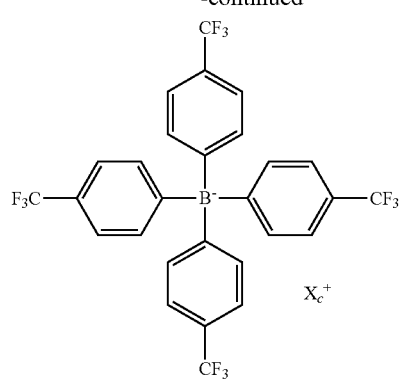
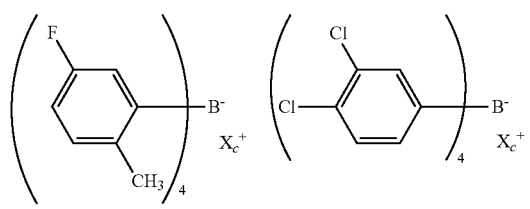
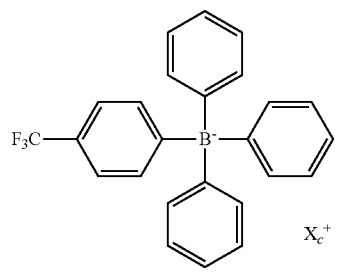
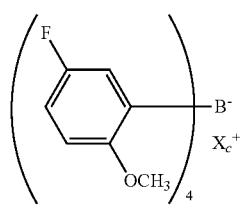
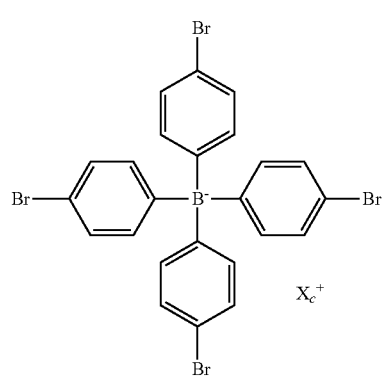
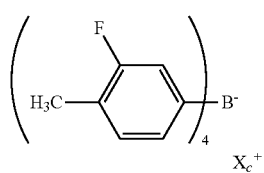
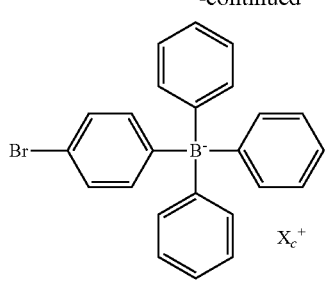
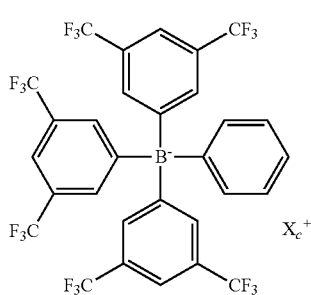
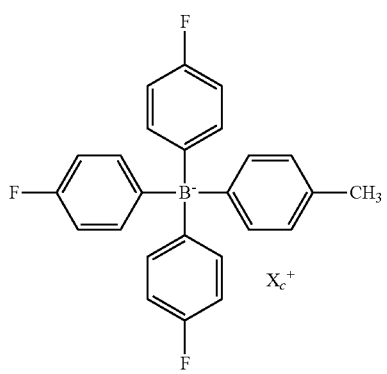
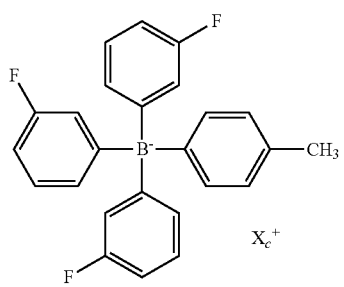
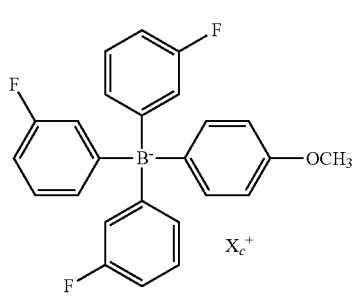

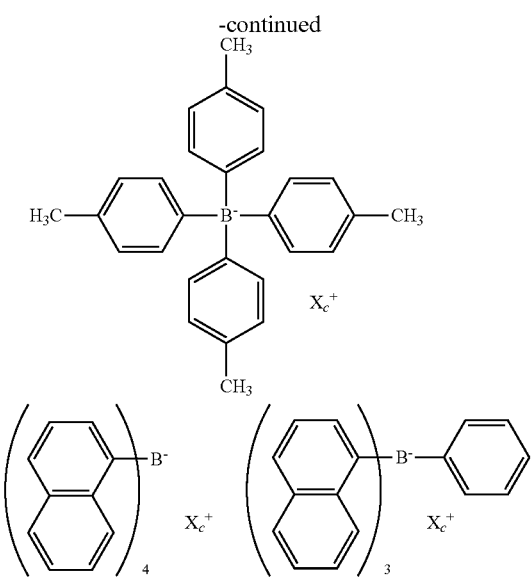

Only one radical production aid may be added thereto or two or more radical production aids may be jointly used.

The content of the radical production aid is preferably 0.01% to 30% by mass, more preferably 0.05% to 25% by mass, and still more preferably 0.1% to 20% by mass of the total solid content of the color developing composition.

<Chain Transfer Agent>

The color developing composition according to the embodiment of the disclosure may contain a chain transfer agent. The chain transfer agent contributes to the improvement of the printing resistance in lithographic printing plates in a case in which the color developing composition is used for the image-recording layer in the lithographic printing plate precursor.

The chain transfer agent is preferably a thiol compound, more preferably a thiol having 7 or more carbon atoms from the viewpoint of the boiling point (difficulty of being volatilized), and still more preferably a compound having a mercapto group on an aromatic ring (aromatic thiol compound). The thiol compound is preferably a monofunctional thiol compound.

Specific examples of the chain transfer agent include the following compounds:

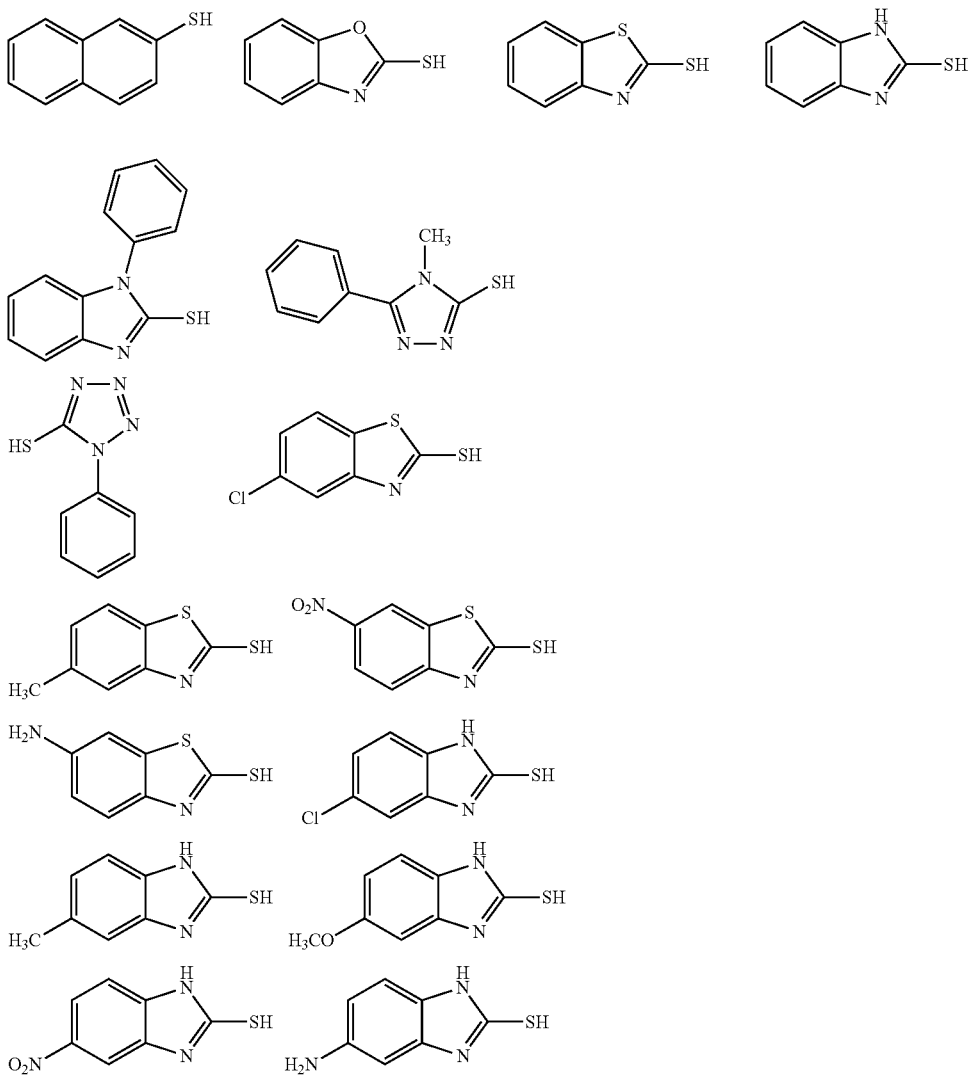

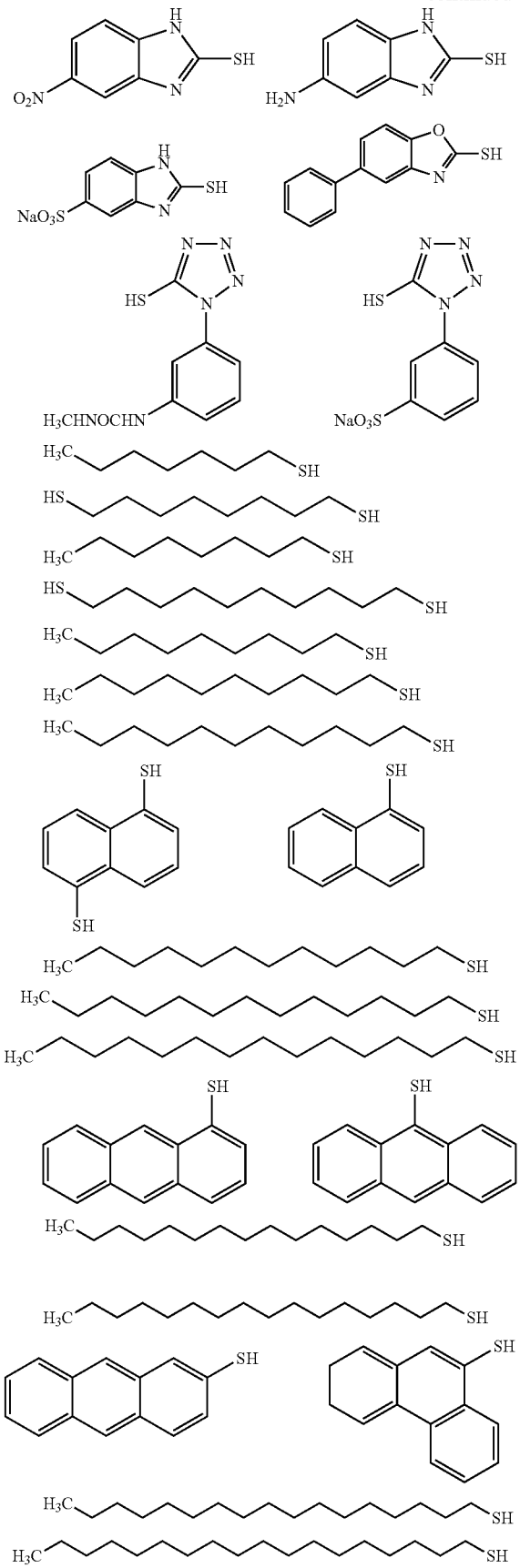
-continued

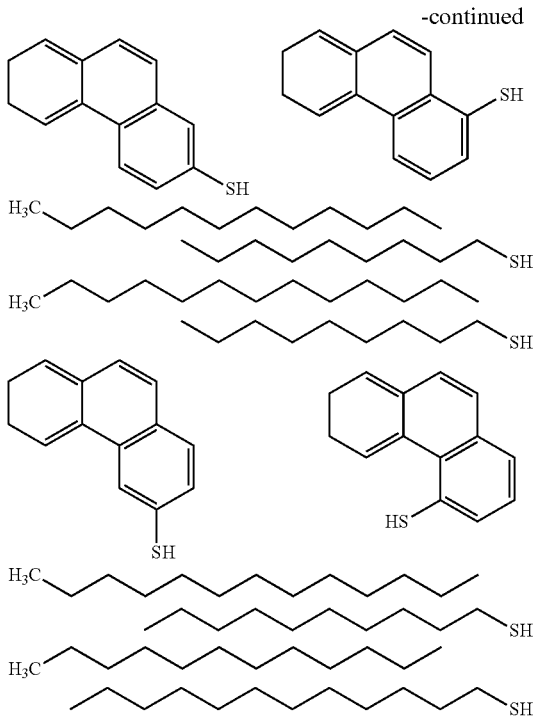

Only one chain transfer agent may be added thereto or two or more chain transfer agents may be jointly used.

The content of the chain transfer agent is preferably 0.01% to 50% by mass, more preferably 0.05% to 40% by mass, and still more preferably 0.1% to 30% by mass of the total solid content of the color developing composition.

<Infrared Absorber>

The color developing composition according to the embodiment of the disclosure may contain an infrared absorber. In the case of containing an infrared absorber, the color developing composition according to the embodiment of the disclosure can be more preferably used as an infrared-sensitive color developing composition.

In addition, even in the case of being used as a thermosensitive color developing composition, the color developing composition according to the embodiment of the disclosure may contain an infrared absorber.

The infrared absorber is a compound having a function of converting absorbed infrared rays to heat. In addition, the infrared absorber may also have a function of migrating electrons or energy to a polymerization initiator or the like described below by being excited by infrared rays.

The infrared absorber preferably has the maximum absorption in a wavelength range of 750 to 1,400 nm. As the infrared absorber, a dye or a pigment is preferably used.

As the dye, a commercially available dye and a well-known dye described in documents such as "Dye Handbook" (edited by The Society of Synthetic Organic Chemistry, Japan, published on 1970) can be used. Specific examples thereof include dyes such as azo dyes, metal complex salt azo dyes, pyrazolone azo dyes, naphthoquinone dyes, anthraquinone dyes, phthalocyanine dyes, carbonium dyes, quinone imine dyes, methine dyes, cyanine dyes, squarylium colorants, pyrylium salts, and metal thiolate complexes.

Among these dyes, preferred examples include cyanine colorants, squarylium colorants, and pyrylium salts. Among these, cyanine colorants are preferred, and indolenine cyanine colorants are particularly preferred.

Specific examples of the cyanine colorants include the compounds described in Paragraphs 0017 to 0019 of JP2001-133969A, the compounds described in Paragraphs 0016 to 0021 of JP2002-023360A, and Paragraphs 0012 to 0037 of JP2002-040638A, preferably, the compounds described in Paragraphs 0034 to 0041 of JP2002-278057A and Paragraphs 0080 to 0086 of JP2008-195018A, and, particularly preferably, the compounds described in Paragraphs 0035 to 0043 of JP2007-090850A.

In addition, the compounds described in Paragraphs 0008 and 0009 of JP1993-005005A (JP-H05-005005A) and Paragraphs 0022 to 0025 of JP2001-222101A can also be preferably used.

As the pigment, the compounds described in Paragraphs 0072 to 0076 of JP2008-195018A are preferred.

The infrared absorber may be used singly, two or more infrared absorbers may be jointly used. In addition, a pigment and a dye may be jointly used as the infrared absorber.

An arbitrary amount of the infrared absorber can be added to the color developing composition. The content of the infrared absorber is preferably in a range of 0.05% to 30% by mass, more preferably in a range of 0.1% to 20% by mass, and still more preferably in a range of 0.2% to 10% by mass with respect to 100 parts by mass of the total solid content in the color developing composition.

The color developing composition according to the embodiment of the disclosure may contain additives other than the above-described components (for example, a surfactant) as necessary.

The respective components that are included in the color developing composition according to the embodiment of the disclosure can be dissolved or dispersed in an appropriate solvent so as to prepare a coating fluid, applying and drying the coating fluid on a support or the like, and forming a color developing composition film.

As the solvents, well-known solvents can be used. Specific examples thereof include water, acetone, methyl ethyl ketone (2-butanone), cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 1-methoxy-2-propanol, 3-methoxy-1-propanol, methoxy methoxy ethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethyl formamide, dimethyl sulfoxide, γ-butyrolactone, methyl lactate, ethyl lactate, and the like. These solvent may be used singly or two or more solvents may be used in a mixed form. The concentration of the solid content in the coating fluid is preferably in a range of approximately 1% to 50% by mass.

The color developing composition according to the embodiment of the disclosure can be used for thermosensitive color developing materials, infrared-sensitive color developing materials, and the like. Thermosensitive color developing materials can be used in a broad range as thermosensitive recording media such as tickets or receipts in terminal printers of facsimiles or computers, automatic vending machines, measurement recorders, cash counters in supermarkets or convenience stores, and the like.

In addition, the color developing composition according to the embodiment of the disclosure is preferably used as image-forming materials. Examples of the image-forming materials include image-forming materials in which color development is used by means of image exposure such as lithographic printing plate precursors, print wiring substrates, color filters, and photo masks and image-forming materials in which color development and polymerization curing is used.

Image-forming materials for which the color developing composition according to the embodiment of the disclosure is used form a color developing image by means of heating or exposure to light sources that radiate infrared rays. As heating means, well-known heating means can be used, and examples thereof include heaters, ovens, hot plates, infrared lamps, infrared lasers, and the like. Examples of the light sources that radiate infrared rays include solid-state lasers that radiate infrared rays, semiconductor lasers, and the like.

(Lithographic Printing Plate Precursor)

Next, an example of applying the color developing composition according to the embodiment of the disclosure to a lithographic printing plate precursor will be described.

The lithographic printing plate precursor according to the embodiment of the disclosure preferably has at least one layer including the color developing composition according to the embodiment of the disclosure on the support. The color developing composition according to the embodiment of the disclosure can be used for any of the undercoat layer, the image-recording layer, and the protective layer in the lithographic printing plate precursor, but is particularly preferably used for the image-recording layer. The kind of the lithographic printing plate precursor according to the embodiment of the disclosure is not particularly limited, an alkali development-type lithographic printing plate precursor and an on-machine development-type lithographic printing plate precursor can be exemplified, and an on-machine development-type lithographic printing plate precursor is particularly preferred.

Hereinafter, an on-machine development-type lithographic printing plate precursor in which the characteristics of the color developing composition according to the embodiment of the disclosure are significantly developed will be described as an example.

[Image-Recording Layer]

For the image-recording layer in the lithographic printing plate precursor, development aptitude and printing aptitude are required. The color developing composition preferably contains the compound represented by Formula 1 and the binder polymer. In the case of an on-machine development-type lithographic printing plate precursor, as the binder polymer, a binder polymer for on-machine development is preferably used.

The color developing composition that is used for the image-recording layer is preferably the color developing composition of the first embodiment or the second embodiment.

Regarding the respective constituent components such as the compound represented by Formula 1, the binder polymer, the polymerizable compound, the polymerization initiator, the radical production aid, and the chain transfer agent which are included in the image-recording layer and the contents thereof, it is also possible to refer to the description in the section of the color developing composition according to the embodiment of the disclosure.

The image-recording layer may further contain a low-molecular-weight hydrophilic compound, a sensitization agent, a solvent, and other components in addition to the above-described constituent components.

(Low-Molecular-Weight Hydrophilic Compound)

In order to improve on-machine developability without degrading printing resistance, the image-recording layer may include a low-molecular-weight hydrophilic compound. Meanwhile, the low-molecular-weight hydrophilic compound is preferably a compound having a molecular weight of smaller than 1,000, more preferably a compound having a molecular weight of smaller than 800, and still more preferably a compound having a molecular weight of smaller than 500.

As the low-molecular-weight hydrophilic compound, examples of water-soluble organic compounds include glycols such as ethylene glycol, diethylene glycol, triethylene glycol, propylene glycol, dipropylene glycol, and tripropylene glycol and ethers or ester derivative thereof, polyols such as glycerin, pentaerythritol, and tris(2-hydroxyethyl) isocyanurate, organic amines such as triethanolamine, diethanolamine, and monoethanolamine and salts thereof, organic sulfonic acids such as alkyl sulfonic acid, toluenesulfonic acid, and benzenesulfonic acid and salts thereof, organic sulfamic acids such as alkyl sulfamate and salts thereof, organic sulfuric acids such as alkyl sulfates and alkyl ether sulfates and salts thereof, organic phosphonic acids such as phenylphosphonic acid and salts thereof, organic carboxylic acids such as tartaric acid, oxalic acid, citric acid, malic acid, lactic acid, gluconic acid, and amino acid and salts thereof, betaines, and the like.

As the low-molecular-weight hydrophilic compound, it is preferable to add at least one selected from the group consisting of polyols, organic sulfates, organics sulfonates, and betaines.

Specific examples of the organic sulfonates include alkyl sulfonates such as sodium n-butyl sulfonate, sodium n-hexyl sulfonate, sodium 2-ethylhexyl sulfonate, sodium cyclohexyl sulfonate, and sodium n-octyl sulfonate; alkyl sulfonates having ethylene oxide chains such as sodium 5,8,11-trioxapentadecane-1-sulfonate, sodium 5,8,11-trioxaheptadecane-1-sulfonate, sodium 13-ethyl-5,8,11-trioxaheptadecane-1-sulfonate, sodium 5,8,11,14-tetraoxatetracosane-1-sulfonate; aryl sulfonates such as sodium benzene sulfonate, sodium p-toluenesulfonate, sodium p-hydroxybenzene sulfonate, sodium p-styrene sulfonate, sodium dimethyl isophthalate-5-sulfonate, sodium 1-naphthyl sulfonate, sodium 4-hydroxynaphthylsulfonate, sodium 1,5-naphthalene disulfonate, and trisodium 1,3,6-naphthalene trisulfonate; compounds described in Paragraphs 0026 to 0031 of JP2007-276454A and Paragraphs 0020 to 0047 of JP2009-154525A; and the like. The salts may be potassium salts or lithium salts.

Examples of the organic sulfates include sulfates of alkyls, alkenyls, alkynyls, aryls, or heterocyclic monoethers such as polyethylene oxides. The number of ethylene oxide units is preferably in a range of 1 to 4, and the salts are preferably sodium salts, potassium salts, or lithium salts. Specific examples thereof include compounds described in Paragraphs 0034 to 0038 of JP2007-276454A.

The betaines are preferably compounds in which the number of carbon atoms in hydrocarbon substituents into nitrogen atoms is in a range of 1 to 5, and specific examples thereof include trimethyl ammonium acetate, dimethyl propyl ammonium acetate, 3-hydroxy-4-trimethyl ammonio butyrate, 4-(1-pyridinio) butyrate, 1-hydroxyethyl-1-imidazolio acetate, trimethyl ammonium methanesulfonate, dimethyl propyl ammonium methanesulfonate, 3-trimethylammonio-1-propane sulfonate, 3-(1-pyridinio)-1-propane sulfonate, and the like.

Since the low-molecular-weight hydrophilic compound has a small structure in hydrophobic portions and barely has surfactant actions, there are no cases in which dampening water permeates exposed portions (image areas) in the image-recording layer and thus the hydrophobic properties or membrane hardness of the image areas degrade, and it is possible to favorably maintain the ink-receiving properties and printing resistance of the image-recording layer.

The content of the low-molecular-weight hydrophilic compound is preferably in a range of 0.5% to 20% by mass, more preferably in a range of 1% to 15% by mass, and still more preferably in a range of 2% to 10% by mass of the total solid content of the image-recording layer. In a case in which the content is in the above-described range, favorable on-machine developability and printing resistance can be obtained.

The low-molecular-weight hydrophilic compound may be used singly or two or more low-molecular-weight hydrophilic compound may be used in a mixed form.

(Sensitization Agent)

In order to improve ink-absorbing properties, the image-recording layer may contain a sensitization agent such as a phosphonium compound, a nitrogen-containing low-molecular-weight compound, or an ammonium group-containing polymer. Particularly, in a case in which an inorganic lamellar compound is added to the protective layer, these compounds function as surface coating agents for the inorganic lamellar compound and are capable of suppressing the ink-absorbing properties from being degraded in the middle of printing due to the inorganic lamellar compound.

Among these, a phosphonium compound, a nitrogen-containing low-molecular-weight compound, and an ammonium group-containing polymer are preferably jointly used as the sensitization agent, and a phosphonium compound, quaternary ammonium salts, and an ammonium group-containing polymer are more preferably jointly used.

Examples of a preferred phosphonium compound include phosphonium compounds described in JP2006-297907A and JP2007-050660A. Specific examples thereof include tetrabutylphosphonium iodide, butyltriphenylphosphonium bromide, tetraphenylphosphonium bromide, 1,4-bis(triphenylphosphonio)butane=di(hexafluorophosphate), 1,7-bis(triphenylphosphonio)heptane=sulfate, 1,9-bis(triphenylphosphonio)nonane=naphthalene-2,7-disulfonate, and the like.

Examples of the nitrogen-containing low-molecular-weight compound include amine salts and quaternary ammonium salts. In addition, examples thereof include imidazolinium salts, benzo imidazolinium salts, pyridinium salts, and quinolinium salts. Among these, quaternary ammonium salts and pyridinium salts are preferred. Specific examples thereof include tetramethylammonium=hexafluorophosphate, tetrabutylammonium=hexafluorophosphate, dodecyltrimethylammonium=p-toluene sulfonate, benzyltriethylammonium=hexafluorophosphate, benzyldimethyloctylammonium=hexafluorophosphate, benzyldimethyldodecylammonium=hexafluorophosphate, compounds described in Paragraphs 0021 to 0037 of JP2008-284858A and Paragraphs 0030 to 0057 of JP2009-090645A, and the like.

The ammonium group-containing polymer needs to have an ammonium group in the structure, and polymers including 5% by mol to 80% by mol of (meth)acrylate having ammonium groups in side chains as copolymerization components are preferred. Specific examples thereof include polymers described in Paragraphs 0089 to 0105 of JP2009-208458A.

In the ammonium group-containing polymer, the value of the reducing specific viscosity (unit: ml/g) obtained according to the measurement method described in JP2009-208458A is preferably in a range of 5 to 120, more preferably in a range of 10 to 110, and particularly preferably in a range of 15 to 100. In a case in which the reducing specific viscosity is converted to the weight average molecular weight (Mw), the weight average molar mass is preferably in a range of 10,000 to 150,000, more preferably in a range of 17,000 to 140,000, and particularly preferably in a range of 20,000 to 130,000.

Hereinafter, specific examples of the ammonium group-containing polymer will be described.

(1) 2-(Trimethylammonio)ethyl methacrylate=p-toluenesulfonate/3,6-dioxaheptyl methacrylate copolymer (molar ratio: 10/90, Mw: 45,000)

(2) 2-(Trimethylammonio)ethyl methacrylate=hexafluorophosphate/3,6-dioxaheptyl methacrylate copolymer (molar ratio: 20/80, Mw: 60,000)

(3) 2-(Ethyldimethylammonio)ethyl methacrylate=p-toluenesulfonate/hexyl methacrylate copolymer (molar ratio: 30/70, Mw: 45,000)

(4) 2-(Trimethylammonio)ethyl methacrylate=hexafluorophosphate/2-ethylhexyl methacrylate copolymer (molar ratio: 20/80, Mw: 60,000)

(5) 2-(Trimethylammonio)ethyl methacrylate=methylsulfate/hexyl methacrylate copolymer (molar ratio: 40/60, Mw: 70,000)

(6) 2-(Butyldimethylammonio)ethyl methacrylate=hexafluorophosphate/3,6-dioxaheptyl methacrylate copolymer (molar ratio: 25/75, Mw: 65,000)

(7) 2-(Butyldimethylammonio)ethyl acrylate=haxafluorophosphate/3,6-dioxaheptyl methacrylate copolymer (molar ratio: 20/80, Mw: 65,000)

(8) 2-(Butyldimethylammonio)ethyl methacrylate=13-ethyl-5,8,11-trioxa-1-heptadecanesulfonate/3,6-dioxaheptyl methacrylate copolymer (molar ratio: 20/80, Mw: 75,000)

(9) 2-(Butyldimethylammonio)ethyl methacrylate=haxafluorophosphate/3,6-dioxaheptyl methacrylate/2-hydroxy-3-methacryloyloxypropyl methacrylate copolymer (molar ratio: 15/80/5, Mw: 65,000)

The content of the sensitization agent is preferably in a range of 0.01% to 30.0% by mass, more preferably in a range of 0.1% to 15.0% by mass, and still more preferably in a range of 1% to 10% by mass of the total solid content in the image-recording layer.

(Other Components)

Furthermore, to the image-recording layer, as other components, it is possible to add a surfactant, a polymerization inhibitor, a higher fatty acid derivative, a plasticizer, an inorganic particle, an inorganic lamellar compound, and the like. Specifically, it is possible to refer to the description in Paragraphs 0114 to 0159 of JP2008-284817A.

<Formation of Image-Recording Layer>

The image-recording layer in the lithographic printing plate precursor according to the embodiment of the disclosure is formed by, for example, as described in Paragraphs 0142 and 0143 of JP2008-195018A, dispersing or dissolving the necessary components described above in a well-known solvent so as to prepare a coating fluid, applying the coating fluid onto a support using a well-known method such as bar coating, and drying the coating fluid. The coating amount (solid content) of the image-recording layer after application and drying varies depending on applications, but is preferably in a range of 0.3 to 3.0 g/m$^2$. In a case in which the coating amount is in the above-described range, a favorable sensitivity and favorable membrane characteristics of the image-recording layer can be obtained.

[Undercoat Layer]

The lithographic printing plate precursor according to the embodiment of the disclosure preferably has an undercoat layer (in some cases, referred to as the interlayer) between the image-recording layer and the support. The undercoat layer strengthens adhesiveness between the support and the image-recording layer in exposed portions and facilitates peeling the support and the image-recording layer in non-exposed portions, and thus the undercoat layer contributes to improving developability without impairing printing resistance. In addition, in the case of exposure using infrared lasers, the undercoat layer functions as an adiabatic layer and thus has an effect of preventing the sensitivity from being degraded due to the diffusion of heat generated by exposure in the support.

Examples of compounds that can be used for the undercoat layer include polymers having adsorbent groups that can be adsorbed to the surface of the support and hydrophilic groups. In order to improve adhesiveness to the image-recording layer, polymers having adsorbent groups and hydrophilic groups and further having crosslinking groups are preferred. The compounds that can be used for the undercoat layer may be low-molecular-weight compounds or polymers. The compounds that can be used for the undercoat layer may be used in a mixed form of two or more kinds as necessary.

In a case in which the compounds that are used for the undercoat layer are polymers, copolymers of monomers having adsorbent groups, monomers having hydrophilic groups, and monomers having crosslinking groups are preferred.

The adsorbent groups that can be adsorbed to the surface of the support are preferably phenolic hydroxy groups, carboxy groups, —PO$_3$H$_2$, —OPO$_3$H$_2$, —CONHSO$_2$—, —SO$_2$NHSO$_2$—, —COCH$_2$COCH$_3$. The hydrophilic groups are preferably sulfo groups or salts thereof and salts of carboxy groups. The crosslinking groups are preferably acrylic groups, methacryl groups, acrylamide groups, methacrylamide groups, allyl groups, and the like.

The polymers may have crosslinking groups introduced due to the formation of salts between polar substituents of the polymers and compounds having substituents having opposite charges of the above-described polar substituents and ethylenic unsaturated bonds and may be further copolymerized with monomers other than the above-described monomers, preferably, hydrophilic monomers.

Specifically, preferred examples thereof include silane coupling agents having ethylenic double bond reactive groups that are capable of addition polymerization described in JP1998-282679A (JP-H10-282679A) and phosphorus compounds having ethylenic double bond reactive groups described in JP1990-304441A (JP-H02-304441A). Low-molecular-weight or high-molecular-weight compounds having crosslinking groups (preferably ethylenic unsaturated bond groups), functional groups that interact with the surface of the support, and hydrophilic groups described in JP2005-238816A, JP2005-125749A, JP2006-239867A, and JP2006-215263A are also preferably used.

More preferred examples thereof include high-molecular-weight polymers having adsorbent groups that can be adsorbed to the surface of the support, hydrophilic groups, and crosslinking groups described in JP2005-125749A and JP2006-188038A.

The content of ethylenic unsaturated bond groups in the polymer that is used in the undercoat layer is preferably in a range of 0.1 to 10.0 mmol and more preferably in a range of 0.2 to 5.5 mmol per gram of the polymer.

The weight average molecular weight (Mw) of the polymer that is used in the undercoat layer is preferably 5,000 or higher and more preferably in a range of 10,000 to 300,000.

In addition to the above-described compounds for the undercoat layer, the undercoat layer may also include a chelating agent, secondary or tertiary amines, a polymerization inhibitor, compounds having amino groups or functional groups having a polymerization-inhibiting function and groups that interact with the surfaces of supports (for example, 1,4-diazabicyclo[2.2.2]octane (DABCO), 2,3,5,6-tetrahydroxy-p-quinone, chloranil, sulfophthalic acid, hydroxyethyl ethylene diamine triacetic acid, dihydroxyethyl ethylenediamine diacetic acid, hydroxyethyl iminodiacetic acid, and the like), and the like in order to prevent contamination over time.

The undercoat layer is formed using well-known coating methods. The coating amount (solid content) of the undercoat layer is preferably in a range of 0.1 to 100 mg/m$^2$ and more preferably in a range of 1 to 30 mg/m$^2$.

<Protective Layer>

The lithographic printing plate precursor according to the embodiment of the disclosure preferably has a protective layer (in some cases, also referred to as the overcoat layer) on the image-recording layer. The protective layer has a function of suppressing image formation-inhibiting reactions caused by the shielding of oxygen and additionally has a function of preventing the generation of damage in the image-recording layer and abrasion prevention during exposure using high-illuminance lasers.

In addition, the protective layer in the lithographic printing plate precursor according to the embodiment of the disclosure may include the color developing composition according to the embodiment of the disclosure, that is, the compound represented by Formula 1.

Protective layers having the above-described characteristics are described in, for example, the specification of U.S. Pat. No. 3,458,311A and JP1980-49729B (JP-S55-49729B). As poor oxygen-transmissible polymers that can be used for the protective layer, it is possible to appropriately select and use any one of water-soluble polymers and water-insoluble polymers, and, if necessary, it is also possible to use two or more polymers in a mixed form. Specific examples thereof include polyvinyl alcohols, modified polyvinyl alcohols, polyvinyl pyrrolidone, water-soluble cellulose derivatives, poly(meth)acrylonitrile, and the like.

As the modified polyvinyl alcohols, acid-modified polyvinyl alcohols having carboxy groups or sulfo groups are preferably used. Specific examples thereof include modified-polyvinyl alcohols described in JP2005-250216A and JP2006-259137A.

The protective layer preferably includes inorganic lamellar compounds in order to enhance oxygen-shielding properties. The inorganic lamellar compound refers to a particle having thin flat plate shapes, and examples thereof include mica groups such as natural mica and synthetic mica, talc represented by Formula $3MgO.4SiO.H_2O$, taeniolite, montmorillonite, saponite, hectorite, zirconium phosphate, and the like.

The inorganic lamellar compounds that can be preferably used are mica compounds. Examples of mica compounds include mica groups such as natural mica and synthetic mica represented by Formula: $A(B, C)_{2-5}D_4O_{10}(OH, F, O)_2$ [here, A is at least one element selected from the group consisting of K, Na, and Ca, B and C are at least one element selected from the group consisting of Fe (II), Fe (III), Mn, Al, Mg, and V, and D is Si or Al.].

In the mica groups, examples of natural mica include white mica, soda mica, gold mica, black mica, and lepidolite. Examples of synthetic mica include non-swelling mica such as fluorphlogopite $KMg_3(AlSi_3O_{10})F_2$, potassium tetrasilic mica $KMg_{2.5}(Si_4O_{10})F_2$, and, Na tetrasilylic mica $NaMg_{2.5}(Si_4O_{10})F_2$, swelling mica such as Na or Li taeniolite $(Na, Li)Mg_2Li(Si_4O_{10})F_2$, montmorillonite-based Na or Li hectorite $(Na, Li)_{1/8}Mg_{2/5}Li_{1/8}(Si_4O_{10})F_2$, and the like. Furthermore, synthetic smectite is also useful.

In the present invention, among the above-described mica compounds, fluorine-based swelling mica is particularly useful. That is, swelling synthetic mica has a laminate structure consisting of unit crystal lattice layers having a thickness in a range of approximately 10 angstroms to 15 angstroms (1 angstrom is equal to 0.1 nanometers), and metal atoms in lattices are more actively substituted than in any other clay minerals. As a result, positive charges are deficient in the lattice layers, and positive ions such as $Li^+$, $Na^+$, $Ca^{2+}$, and $Mg^{2+}$ are adsorbed between the layers in order to compensate for the deficiency. Positive ions interposed between the layers are referred to as exchangeable positive ions and are exchangeable with various positive ions. Particularly, in a case in which the positive ions between the layers are $Li^+$ and $Na^+$, the ionic radii are small, and thus the bonds between lamellar crystal lattices are weak, and mica is significantly swollen by water. In a case in which shear is applied in this state, mica easily cleavages and forms a stable sol in water. The above-described tendency of swelling synthetic mica is strong, and the swelling synthetic mica is particularly preferably used.

From the viewpoint of diffusion control, regarding the shapes of the mica compounds, the thickness is preferably thin, and the planar size is preferably large as long as the smoothness and active light ray-transmitting properties of coated surfaces are not impaired. Therefore, the aspect ratio is preferably 20 or higher, more preferably 100 or higher, and particularly preferably 200 or higher. The aspect ratio is the ratio of the long diameter to the thickness of a particle and can be measured from projection views obtained from the microphotograph of the particle. As the aspect ratio increases, the obtained effect becomes stronger.

Regarding the particle diameters of the mica compound, the average long diameter thereof is preferably in a range of 0.3 to 20 µm, more preferably in a range of 0.5 to 10 µm, and particularly preferably in a range of 1 to 5 µm. The average thickness of the particles is preferably 0.1 µm or smaller, more preferably 0.05 µm or smaller, and particularly preferably 0.01 µm or smaller. Specifically, for example, in the case of swelling synthetic mica which is a typical compound, a preferred aspect has a thickness in a range of approximately 1 to 50 nm and a surface size (long diameter) in a range of approximately 1 to 20 µm.

The content of the inorganic lamellar compound is preferably in a range of 0% to 60% by mass and more preferably in a range of 3% to 50% by mass of the total solid content of the protective layer. Even in a case in which multiple kinds of inorganic lamellar compounds are jointly used, the total amount of the inorganic lamellar compounds is preferably the above-described content. In a case in which the total amount is in the above-described range, the oxygen-shielding properties improve, and a favorable sensitivity can be obtained. In addition, the degradation of the ink-absorbing properties can be prevented.

The protective layer may include well-known additives such as a plasticizer for imparting flexibility, a surfactant for improving coating properties, and an inorganic fine particle for controlling sliding properties on the surface. In addition, the sensitization agent described in the section of the image-recording layer may be added to the protective layer.

The protective layer is formed using a well-known coating method. The coating amount of the protective layer (solid content) is preferably in a range of 0.01 to 10 g/m$^2$, more preferably in a range of 0.02 to 3 g/m$^2$, and particularly preferably in a range of 0.02 to 1 g/m$^2$.

<Support>

A support in the lithographic printing plate precursor according to the embodiment of the disclosure can be appropriately selected from well-known supports for a lithographic printing plate precursor and used.

As the support, a support having a hydrophilic surface is preferred.

The support is preferably an aluminum plate which has been roughened using a well-known method and anode-oxidized.

On the aluminum plate, as necessary, enlargement processes or sealing processes of micropores in anode oxide films described in JP2001-253181A and JP2001-322365A, surface hydrophilization processes using alkali metal silicate as described in the specifications of U.S. Pat. Nos. 2,714,066A, 3,181,461A, 3,280,734A, and 3,902,734A, and surface hydrophilization processes using polyvinyl phosphate or the like as described in the specifications of U.S. Pat. Nos. 3,276,868A, 4,153,461A, and 4,689,272A may be appropriately selected and carried out.

In the support, the center line average roughness is preferably in a range of 0.10 to 1.2 µm.

The support may have, as necessary, a backcoat layer including an organic polymer compound described in JP1993-045885A (JP-H05-045885A) or an alkoxy compound of silicon described in JP1994-035174A (JP-H06-035174A) on the surface opposite to the image-recording layer.

(Method for Producing Lithographic Printing Plate)

A method for producing a lithographic printing plate according to the embodiment of the disclosure preferably includes a step of radiating an infrared ray to the lithographic printing plate precursor according to the embodiment of the disclosure (exposure step), and a step of supplying at least one selected from the group consisting of printing ink and dampening water to the lithographic printing plate precursor to which the infrared ray has been radiated on a printer to carry out on-machine development (on-machine development step).

<Exposure Step>

Exposure in an image pattern is preferably carried out using a method in which digital data are scanned and exposed using an infrared laser or the like.

The wavelength of the exposure light source is preferably in a range of 750 nm to 1,400 nm. The light source having a wavelength in a range of 750 nm to 1,400 nm is preferably a solid-state laser or a semiconductor laser that radiates infrared rays. The exposure mechanism may be any one of in-plane drum methods, external surface drum methods, flat head methods, and the like.

The exposure step can be carried out using platesetters or the like and well-known methods. In addition, exposure may be carried out on a printer using a printer including an exposure device after the lithographic printing plate precursor is mounted on the printer.

<On-Machine Development Step>

In the on-machine development step, in a case in which printing (on-machine development) is initiated by supplying at least one selected from the group consisting of printing ink and dampening water, preferably, printing ink and dampening water on the printer without carrying out any development processes on the lithographic printing plate precursor that has been exposed in an image pattern, non-exposed portions on the lithographic printing plate precursor are removed at the initial stage of printing, and accordingly, the hydrophilic surface of the support is exposed, and non-image areas are formed. As the printing ink and the dampening water, well-known printing ink and dampening water for lithographic printing are used. Any of printing ink and dampening water may be first supplied to the surface of the lithographic printing plate precursor, but it is preferable to first supply printing ink from the viewpoint of preventing contamination by the components of the image-recording layer from which dampening water is removed.

In the above-described manner, the lithographic printing plate precursor is on-machine-developed on an off-set printer and is used as it is for printing a number of pieces of paper.

The method for producing a lithographic printing plate according to the embodiment of the disclosure may also include other well-known steps in addition to the above-described steps. Examples of other steps include a plate-inspecting step of checking a position, a direction, or the like of a lithographic printing plate precursor before each step, or a checking step of checking a printed image after an on-machine development step.

The lithographic printing plate precursor according to the embodiment of the disclosure can be used to produce lithographic printing plates by means of a development process in which a development fluid is used by appropriately selecting the polymer and the like which are the constituent components of the image-recording layer. Examples of the development process in which a development fluid is used include an aspect in which a development fluid having a high pH of 14 or less which includes an alkaline agent is used (also referred to as alkali development) and an aspect in which a development fluid having a pH of approximately 2 to 11 which contains at least one compound selected from the group consisting of a surfactant and a water-soluble polymer compound is used (also referred to as simple development). The alkali development and the simple development can be carried out using a well-known method.

(Compound Represented by Formula 1 and Color Developer)

The compound represented by Formula 1 is a new compound and can be preferably used as a color developer, particularly, a thermosensitive color developer, an infrared-sensitive color developer, or a thermosensitive and infrared-sensitive color developer.

A preferred aspect of the compound represented by Formula 1 as a new compound is the same as the preferred aspect of the compound represented by Formula 1 described above in the section of the color developing composition according to the embodiment of the disclosure.

EXAMPLES

Hereinafter, an embodiment of the present invention will be described in detail using examples, but the present disclosure is not limited thereto. Meanwhile, for polymer compounds, unless particularly otherwise described, the molecular weight refers to the weight average molecular weight (Mw) converted to a polystyrene equivalent value by the gel permeation chromatography (GPC) method, and the ratio of a repeating unit refers to the molar percentage. In addition, "parts" indicates "parts by mass" unless particularly otherwise described.

In the following examples, Compounds A-1 to A-65 are the same as Compounds A-1 to A-65 described as the specific examples of the compound represented by Formula 1.

Synthesis examples of the compound represented by Formula 1 will be described below. Other compounds represented by Formula 1 (hereinafter, also referred to as "the compound A") can also be synthesized in the same manner by appropriately changing a raw material or a reaction intermediate.

Synthesis Example 1: Synthesis of Compound A-1

A synthesis scheme of A-1 will be illustrated below.

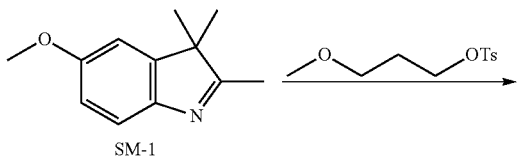

SM-1

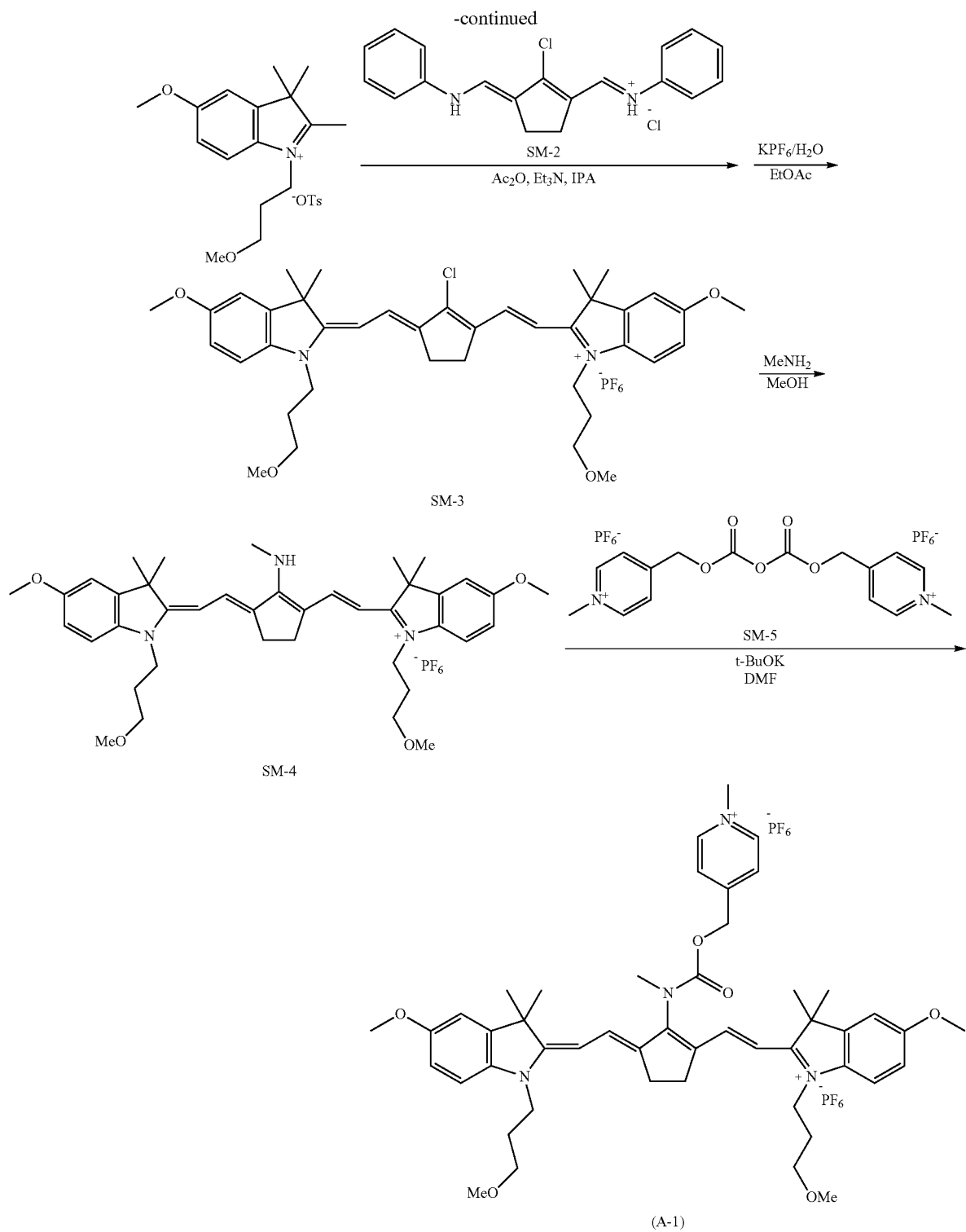

5-Methoxy-2,3,3-trimethyl indolenine (SM-1) (manufactured by Inui Corporation) (147.9 g, 0.782 mol) and 3-methoxypropyl tosylate (229.1 g, 0.938 mol) were added to a 3 L three-neck flask and stirred at 130° C. for two hours. The reaction liquid was cooled to 80° C., then, isopropanol (1,147 g) was added thereto, and the components were stirred at 20° C. Furthermore, SM-2 (105.8 g, 0.307 mol) and an acetic anhydride (68.8 g, 0.674 mol) were added thereto, and the reaction liquid was stirred while being cooled to 5° C. Triethylamine (170.6 g, 1.69 mol) was added dropwise thereto so as to prevent the inner temperature from exceeding 10° C., and the components were stirred at 20° C. for three hours. Separately, the reaction liquid was added dropwise under stirring to a solution to which distilled water (1,771 g), potassium hexafluorophosphate (93.1 g, 0.506 mol), and ethyl acetate (482 g) had been added, the reaction liquid in the 3 L three-neck flask was added dropwise thereto under stirring, the components were stirred for 30 minutes after the end of the dropwise addition, then, the stirring was stopped, and the components were left to stand. The obtained precipitates were collected by means of filtration and washed with distilled water (500 mL) four times and isopropanol (300 mL) three times. The obtained solid was dried at a reduced pressure, thereby obtaining SM-3 (222 g, 0.281 mol).

SM-3 (10.0 g, 12.64 mmol), acetone (20 mL), methanol (200 mL), and methylamine (40% methanol solution) (20 mL, 196 mmol) were added thereto and stirred at 40° C. for five hours. The reaction liquid was returned to room temperature (25° C.) and condensed at a reduced pressure until the liquid amount reached 40 mL. This condensed liquid was added to distilled water (1 L) under stirring and further stirred for 10 minutes. The obtained precipitates were collected by means of filtration and dried at a reduced pressure, thereby obtaining SM-4 (9.1 g, 11.58 mmol).

SM-4 (5.0 g, 6.36 mmol), potassium tert-butoxide (1.50 g, 13.36 mmol), N,N-dimethylformamide (DMF) (50 g), and SM-5 (7.74 g, 12.72 mmol) were added thereto and stirred at 40° C. for 10 hours. The reaction liquid was returned to room temperature, added to distilled water (1 L) under stirring, and further stirred for 10 minutes. The obtained precipitates were collected by means of filtration and dried at a reduced pressure. The obtained solid was dissolved in acetone (20 g) and added dropwise to a liquid mixture of hexane (600 mL) and ethyl acetate (300 mL). The obtained precipitates were collected by means of filtration and dried at a reduced pressure, thereby obtaining a compound A-1 (5.09 g, 4.71 mmol) of the present invention.

Synthesis Example 2: Synthesis of Compound A-45

A synthesis scheme of A-45 will be illustrated below.

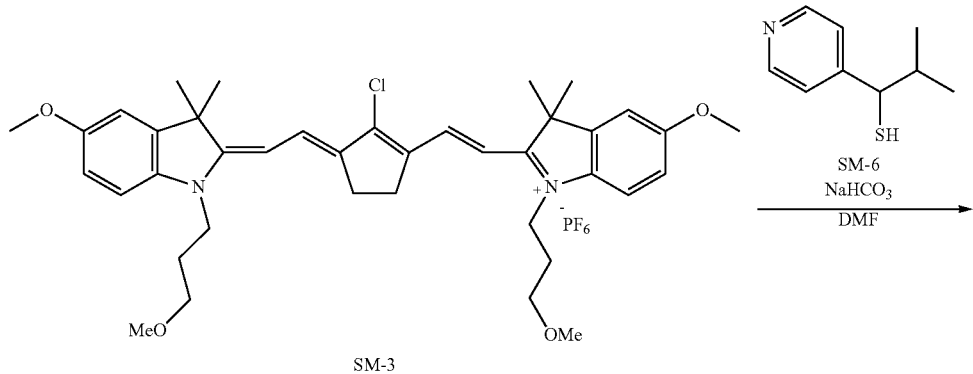

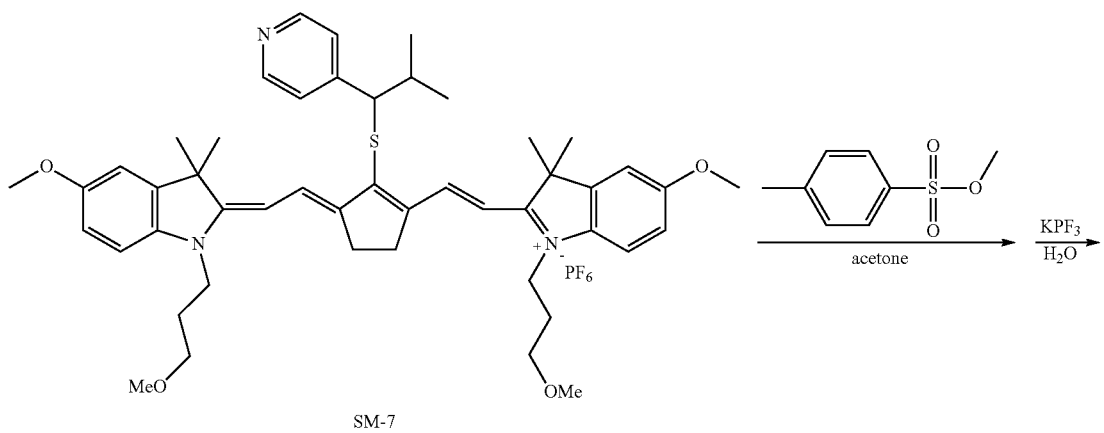

-continued

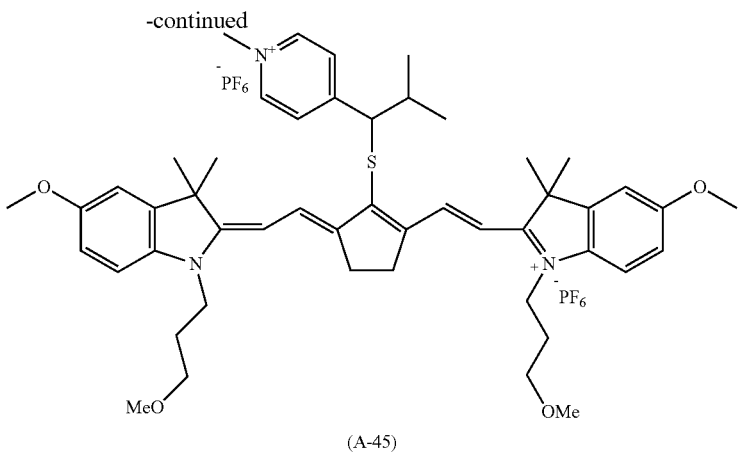

(A-45)

SM-3 (10.0 g, 12.64 mmol), DMF (50 g), SM-6 (2.54 g, 15.17 mmol), and sodium hydrogen carbonate (1.59 g, 18.96 mmol) were added thereto and stirred at room temperature for 24 hours. The reaction liquid was added dropwise to distilled water (500 g) under stirring and further stirred for 10 minutes after the end of the dropwise addition. The obtained precipitates were collected by means of filtration and dried at a reduced pressure. The obtained solid was dissolved in acetone (30 g) and added dropwise to a liquid mixture of hexane (600 mL) and ethyl acetate (300 mL) under stirring. The obtained precipitates were collected by means of filtration and dried at a reduced pressure, thereby obtaining SM-7 (9.55 g, 10.36 mmol).

SM-7 (5.0 g, 5.42 mmol), acetone (30 g), and methyl para-toluenesulfonate (3.02 g, 16.26 mmol) were added thereto and stirred at 40° C. for 24 hours. The reaction liquid was returned to room temperature and then added dropwise to a liquid mixture of hexane (600 mL) and ethyl acetate (300 mL) under stirring. The obtained precipitates were collected by means of filtration and dissolved in acetone (15 g). Potassium hexafluorophosphate (2.00 g, 10.84 mmol) was added thereto, and distilled water (100 g) was added dropwise thereto under stirring. The obtained precipitates were collected by means of filtration, washed with distilled water (300 g), and then dried at a reduced pressure, thereby obtaining a compound A-45 (5.33 g, 4.93 mmol) of the present invention.

Examples 1 to 15 and Comparative Examples 1 to 6

<Production of Support>

In order to remove rolling oil on the surface of a 0.3 mm-thick aluminum plate (material JIS A 1050), a defatting process was carried out thereon using an aqueous solution of 10% by mass of sodium aluminate at 50° C. for 30 seconds, and then, the surface of the aluminum plate was grained using three implanted nylon brushes having hair diameters of 0.3 mm and a suspension of pumice having a median diameter of 25 m and water (specific gravity: 1.1 g/cm$^3$) and well washed with water. The aluminum plate was etched by being immersed in an aqueous solution of 25% by mass of sodium hydroxide at 45° C. for nine seconds, was washed with water, then, was further immersed in an aqueous solution of 20% by mass of nitric acid at 60° C. for 20 seconds, and was washed with water. The etched amount of the grained surface was approximately 3 g/m$^2$.

Next, an electrochemical roughening process was continuously carried out thereon using alternating-current voltage of 60 Hz. An electrolytic solution was an aqueous solution of 1% by mass of nitric acid (including 0.5% by mass of aluminum ions), and the liquid temperature was 50° C. The electrochemical roughening process was carried out thereon using an alternating current source waveform in which the time TP taken for the current value to reach the peak from zero was 0.8 msec, a duty ratio of 1:1, a trapezoidal square-wave alternating current, and a carbon electrode as an opposite electrode. As an auxiliary anode, ferrite was used. The current density was 30 A/dm$^2$ in terms of the peak value of the current, and 5% of the current coming from the power supply was divided into the auxiliary positive electrode. Regarding the quantity of electricity during nitric acid electrolysis, the quantity of electricity was 175 C/dm$^2$ in a case in which the aluminum plate served as the positive electrode. After that, the plate was washed with water by means of spraying.

Subsequently, an electrochemical roughening process was carried out thereon using the same method as nitric acid electrolysis in an aqueous solution of 0.5% by mass of hydrochloric acid (including 0.5% by mass of aluminum ions) and an electrolytic solution having a liquid temperature of 50° C. under a condition of the quantity of electricity of 50 C/dm$^2$ in a case in which the aluminum plate served as the positive electrode, and then, the plate was washed with water by means of spraying.

Next, 2.5 g/m$^2$ of a direct current anode oxide film was formed on the aluminum plate at a current density of 15 A/dm$^2$ using an aqueous solution of 15% by mass of sulfuric acid (including 0.5% by mass of aluminum ions) as an electrolytic solution, and then water washing and drying were carried out thereon, thereby producing a support A. The average pore diameter of the surface layer of the anode oxide film (surface average pore diameter) was 10 nm.

The pore diameter of the surface layer of the anode oxide film was measured using a method in which the surface was observed an ultrahigh resolution SEM (S-900 manufactured by Hitachi, Ltd.) at a relatively low acceleration voltage of 12 V at a magnification of 150,000 times without carrying out a deposition process or the like for imparting conductive properties, 50 pores were randomly extracted, and the average value was obtained. The standard deviation was ±10% or less.

After that, in order to ensure the hydrophilicity of a non-image area, a silicate process was carried out on the support A using an aqueous solution of 2.5% by mass of No. 3 sodium silicate at 60° C. for ten seconds, and then the support was washed with water, thereby producing a support B. The attached amount of Si was 10 mg/m². The center line average roughness (Ra) of the support B was measured using a needle having a diameter of 2 m and was found to be 0.51 µm.

A support C was produced in the same manner as in the method for producing the support A except for the fact that, in the production of the support A, the electrolytic solution in the formation of the direct current anode oxide film was changed to an aqueous solution of 22% by mass of phosphoric acid. The average pore diameter of the surface layer of the anode oxide film (surface average pore diameter) was measured using the same method as described above and found out to be 25 nm.

After that, a silicate process was carried out on the support C using an aqueous solution of 2.5% by mass of No. 3 sodium silicate at 60° C. for 10 seconds in order to ensure the hydrophilicity of a non-image area and then washed with water, thereby producing a support D. The amount of Si attached was 10 mg/m². The center line average roughness (Ra) of the support D was measured using a needle having a diameter of 2 m and found out to be 0.52 µm.

1. Production of Infrared-Sensitive Color Developing Material

<Formation of Infrared-Sensitive Color Developing Composition Film>

Infrared-sensitive color developing compositions (color developing compositions) having a composition A or composition B below were prepared respectively, applied onto the aluminum support by means of bar coating so that the dried coating amount reached 1.0 g/m², dried in an oven at 120° C. for 40 seconds so as to form an infrared-sensitive color developing composition film, thereby respectively producing infrared-sensitive color developing materials for Examples 1 to 15 and Comparative Examples 1 to 6. The compositions of the infrared-sensitive color developing compositions used to produce the respective infrared-sensitive color developing materials and the compound A or a compound for comparison in the infrared-sensitive color developing compositions are summarized in Table 1 and Table 2.

<Infrared-Sensitive Color Developing Composition Composition A>

Polyacrylate (Mw: 25,000): 0.69 parts by mass

Compound A or compound for comparison shown in Table 1: 0.052 parts by mass

Tetraphenyl borate-sodium salt: 0.010 parts by mass

Distilled water: 11.3 parts by mass

<Infrared-Sensitive Color Developing Composition Composition B>

Polymethyl methacrylate (Mw: 120,000): 0.69 parts by mass

Compound A or compound for comparison shown in Table 2: 0.046 parts by mass

Tetraphenyl borate-sodium salt: 0.010 parts by mass

2-Butanone: 11.3 parts by mass

The structures of the compounds for comparison R-1 to R-6 ((R-1) to (R-6)) will be illustrated below.

The compounds for comparison below R-1 to R-6 were synthesized according to JP2008-544053A or JP2007-090850A.

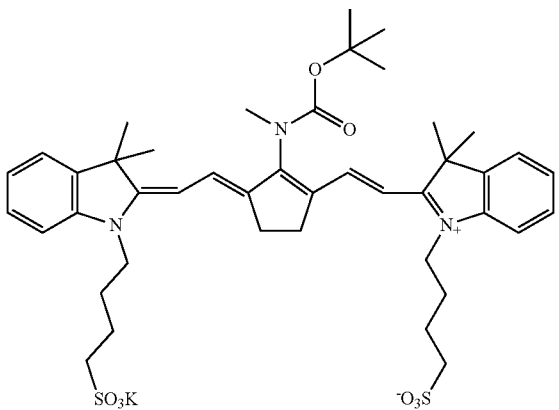

(R-1)

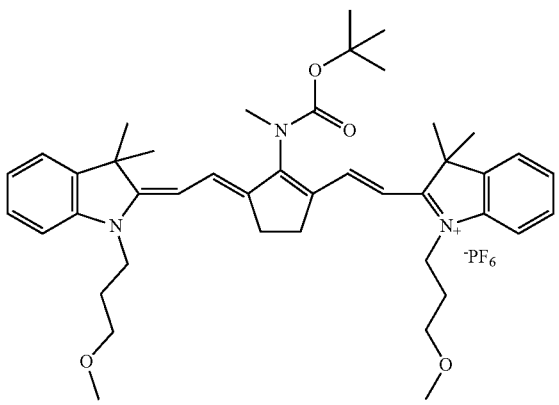

(R-2)

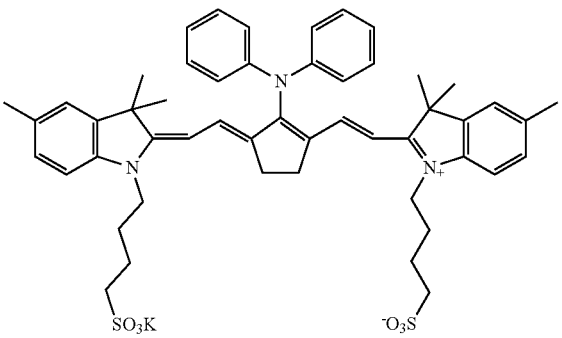

(R-3)

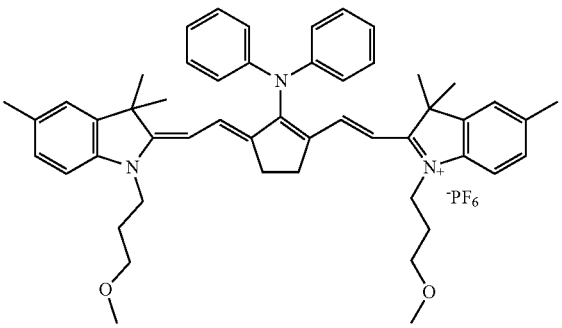

(R-4)

-continued

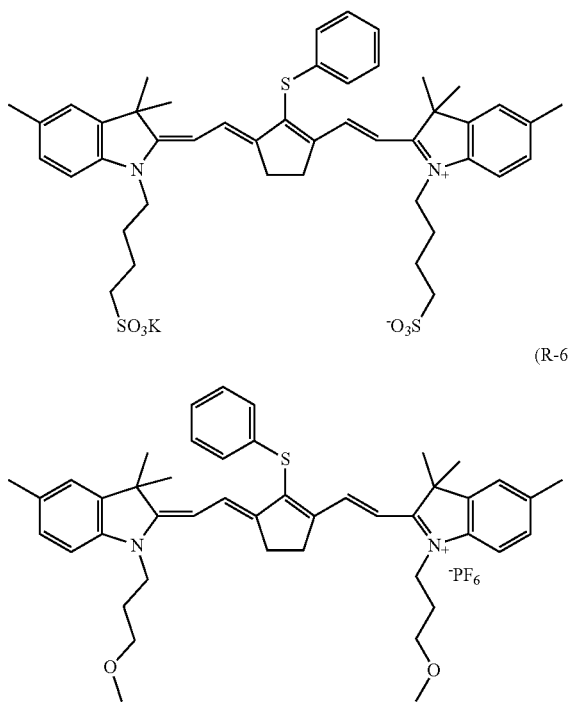

(R-5)

(R-6)

2. Evaluation of Color Developability of Infrared-Sensitive Color Developing Materials The infrared-sensitive color developing materials were exposed in a Trendsetter 3244VX equipped with a water cooling-type 40 W infrared semiconductor laser manufactured by Creo Co., Ltd. under conditions of an output of 11.7 W, an external surface drum rotation speed of 250 rpm, a resolution of 2,400 dpi (dot per inch, 1 inch=25.4 mm). The materials were exposed in an environment of 25° C. and 50% RH.

Color development of the infrared-sensitive color developing materials was measured immediately after the exposure and after two hours of storage in a dark place (25° C.) after the exposure. The color development was measured using a spectrophotometer CM2600d and operation software CM-S100W manufactured by Konica Minolta, Inc. by means of a specular component excluded (SCE) method. The color developability were evaluated using the difference ΔL between the L* value of an exposed portion and the L* value of a non-exposed portion using L* values (brightness) in the L*a*b* color specification system. A larger value of ΔL indicates superior color developability.

The evaluation results are summarized in Tables 1 and 2.

TABLE 1

| | Infrared-sensitive color developing composition | Compound A or compound for comparison | Color developability (immediately after exposure to light) | Color developability (after two hours) |
|---|---|---|---|---|
| Example 1 | A | A-3 | 7.1 | 7.2 |
| Example 2 | A | A-4 | 6.9 | 7.0 |
| Example 3 | A | A-7 | 7.3 | 7.1 |
| Example 4 | A | A-18 | 7.5 | 7.5 |

TABLE 1-continued

| | Infrared-sensitive color developing composition | Compound A or compound for comparison | Color developability (immediately after exposure to light) | Color developability (after two hours) |
|---|---|---|---|---|
| Example 5 | A | A-26 | 6.6 | 6.7 |
| Example 6 | A | A-46 | 8.3 | 8.0 |
| Example 7 | A | A-47 | 8.1 | 7.9 |
| Example 8 | A | A-52 | 7.3 | 7.1 |
| Comparative Example 1 | A | R-1 | 3.5 | 3.4 |
| Comparative Example 2 | A | R-3 | 2.2 | 1.4 |
| Comparative Example 3 | A | R-5 | 2.1 | 1.5 |

TABLE 2

| | Infrared-sensitive color developing composition | Compound A or compound for comparison | Color developability (immediately after exposure to light) | Color developability (after two hours) |
|---|---|---|---|---|
| Example 9 | B | A-1 | 6.5 | 6.5 |
| Example 10 | B | A-22 | 6.9 | 6.9 |
| Example 11 | B | A-32 | 7.1 | 7.2 |
| Example 12 | B | A-35 | 7.0 | 6.7 |
| Example 13 | B | A-37 | 6.6 | 6.6 |
| Example 14 | B | A-43 | 8.1 | 8.1 |
| Example 15 | B | A-45 | 8.2 | 8.1 |
| Comparative Example 4 | B | R-2 | 3.7 | 3.8 |
| Comparative Example 5 | B | R-4 | 2.1 | 1.5 |
| Comparative Example 6 | B | R-6 | 2.2 | 1.4 |

From the results shown in Tables 1 and 2, it is found that the infrared-sensitive color developing materials having the infrared-sensitive color developing composition film containing the compound A according to the present invention are infrared-sensitive color developing materials which have favorable color developability after exposure to infrared rays and are excellent in terms of the maintenance of color developability even after two hours.

Examples 16 to 57 and Comparative Examples 7 to 24

1. Production of Lithographic Printing Plate Precursor a

<Formation of Undercoat Layer>

A coating fluid for an undercoat layer (1) having the following composition was applied onto the support so that the dried coating amount reached 20 mg/m², thereby forming an undercoat layer.

<Coating Fluid for Undercoat Layer (1)>
Polymer (P-1) [the following structure]: 0.18 g
Hydroxyethyl iminodiacetic acid: 0.10 g
Water: 61.4 g

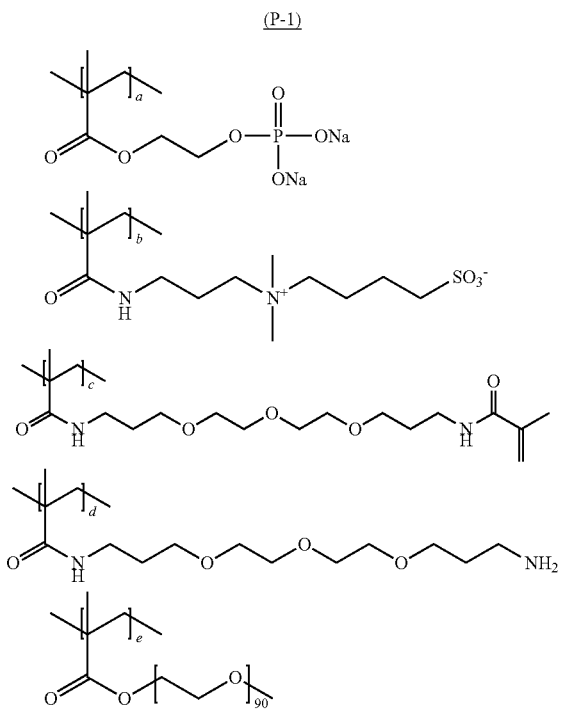

a/b/c/d/e = 14.2/71.8/8.9/0.1/5.0 (mass %)
a/b/c/d/e = 19.0/72.8/7.7/0.1/0.4 (mol%)
Weight-average molecular weight = 200,000

A method for synthesizing the polymer P-1 will be described below.

(Synthesis of Monomer M-1)
[Synthesis of Monomer M-1]

ANCAMINE 1922A (diethylene glycol di(aminopropyl) ether, manufactured by Air Products) (200 parts), distilled water (435 parts), and methanol (410 parts) were added to a 3 L three-neck flask and cooled to 5° C. Next, benzoic acid (222.5 parts) and 4-hydroxy-2,2,6,6-tetramethylpiperidine-1-oxyl (4-OH-TEMPO) (0.025 parts) were added thereto, and a methacrylic anhydride (280 parts) was added dropwise thereto so that the inner temperature of the reaction liquid reached 10° C. or lower. The reaction liquid was stirred at 5° C. for six hours and, subsequently, stirred at 25° C. for 12 hours, and then phosphoric acid (70 parts) was added thereto so as to adjust the pH to 3.3. The reaction liquid was moved to a stainless steel beaker, ethyl acetate (3,320 parts), methyl-tert butyl ether (MTBE) (1,120 parts), and distilled water (650 parts) were added thereto, and the components were strongly stirred and then left to stand. The upper layer (organic layer) was disposed of, then, ethyl acetate (1,610 parts, 1.8 L) was added thereto, the components were strongly stirred and then left to stand, and the upper layer was disposed of. Furthermore, ethyl acetate (1,350 parts) was added thereto, the components were strongly stirred and then left to stand, and the upper layer was disposed of. Next, MTBE (1,190 parts) was added thereto, the components were strongly stirred and then left to stand, and the upper layer was disposed of. 4-OH-TEMPO (0.063 parts) was added to the obtained aqueous solution, thereby obtaining an aqueous solution of a monomer M-1 (12,000 parts, 20.1% by mass in terms of the solid content).

(Purification of Monomer M-2)
LIGHT ESTER P-1M (2-methacryloyloxyethyl acid phosphate, manufactured by Kyoeisha Chemical Co., Ltd.) (420 parts), diethylene glycol dibutyl ether (1,050 parts), and distilled water (1,050 parts) were added to a separating funnel, strongly stirred, and then left to stand. The upper layer was disposed of, diethylene glycol dibutyl ether (1,050 parts) was added thereto, and the components were strongly stirred and then left to stand. The upper layer was disposed of, thereby obtaining an aqueous solution of a monomer M-2 (13,000 parts, 10.5% by mass in terms of the solid content).

(Synthesis of Polymer P-1)
Distilled water (600.6 parts), the aqueous solution of the monomer M-1 (33.1 parts), and a monomer M-3 described below (46.1 parts) were added to a three-neck flask and heated to 55° C. in a nitrogen atmosphere. Next, a dropwise addition liquid 1 described below was added dropwise thereto for two hours, the components were stirred for 30 minutes, then, VA-046B (manufactured by Wako Pure Chemical Industries Ltd.) (3.9 parts) was added thereto, and the components were heated to 80° C. and stirred for 1.5 hours. The reaction liquid was returned to room temperature (25° C., which shall apply below), and then an aqueous solution of 30% by mass of sodium hydroxide (175 parts) was added thereto, thereby adjusting the pH to 8.3. Next, 4-OH-TEMPO (0.152 parts) was added thereto, and the components were heated to 53° C. A methacrylic anhydride (66.0 parts) was added thereto, and the components were stirred at 53° C. for three hours. The components were returned to room temperature, then, the reaction liquid was moved to a stainless steel beaker, MTBE (1,800 parts) was added thereto, the components were strongly stirred and then left to stand, and the upper layer was disposed of. A washing operation using MTBE (1,800 parts) was further repeated twice in the same manner, and then distilled water (1,700 parts) and 4-OH-TEMPO (0.212 parts) were added to the obtained water layer, thereby obtaining a polymer P-1 (41,000 parts, 11.0% in terms of the solid content) as a homogeneous solution. The weight average molecular weight (Mw) converted to a polyethylene glycol equivalent value by the gel permeation chromatography (GPC) method was 200,000.

Dropwise addition liquid 1
The aqueous solution of the monomer M-1: 132.4 g
The aqueous solution of the monomer M-2: 376.9 g
Monomer M-3 [the following structure]: 184.3 g
BREMMER PME 4000 (manufactured by NOF Corporation): 15.3 g
VA-046B (manufactured by Wako Pure Chemical Industries Ltd.): 3.9 g
Distilled water: 717.4 g
BREMMER PME 4000: Methoxy polyethylene glycol methacrylate (the number of the oxyethylene unit repeated: 90)
VA-046B: 2,2'-Azobis[2-(2-imidazolin-2-yl)propane]disulfate dihydrate Monomer M-3

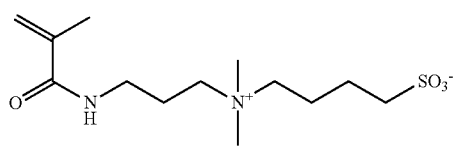

<Formation of Image-Recording Layer>

A coating fluid for an image-recording layer (1) having the following composition was applied onto the undercoat layer by means of bar coating and was dried in an oven at 100° C. for 60 seconds, thereby forming an image-recording layer having a dried coating amount of 1.0 g/m².

The coating fluid for the image-recording layer (1) was prepared by mixing and stirring the following photosensitive liquid (1) and a micro gel liquid immediately before the coating. Meanwhile, in a case in which the compound A-61 according to the present disclosure was used, the compound A-61 included a borate salt portion in the structure, and thus a borate compound (TPB) was not added thereto.

<Photosensitive Liquid (1)>

Binder polymer (1) [the following structure]: 0.240 parts

Polymerization initiator (1) [the following structure]: 0.245 parts

Compound A or compound for comparison shown in Table 3: 0.046 parts

Borate compound (TPB [the following structure]): 0.010 parts

Polymerizable compound: 0.192 parts, tris(acryloyloxy-ethyl)isocyanurate (NK ester A-9300, manufactured by Shin-Nakamura Chemical Co., Ltd.)

Low-molecular-weight hydrophilic compound: 0.062 parts Tris(2-hydroxyethyl)isocyanurate Low-molecular-weight hydrophilic compound (1) [the following structure]: 0.050 parts Sensitization agent: 0.055 parts, phosphonium compound (1) [the following structure]

Sensitization agent: 0.018 parts, benzyl-dimethyl-octy-lammonium.PF$_6$ salt

Sensitization agent: 0.035 parts, ammonium group-containing polymer (1) [the following structure, reducing specific viscosity of 44 ml/g]

Fluorine-based surfactant (1) [the following structure]: 0.008 parts

2-Butanone: 1.091 parts

1-Methoxy-2-propanol: 8.609 parts

<Micro Gel Liquid>

Micro gel (1): 2.640 parts

Distilled water: 2.425 parts

The structures of the binder polymer (1), the polymerization initiator (1), TPB, the low-molecular-weight hydrophilic compound (1), the phosphonium compound (1), the ammonium group-containing polymer (1), and the fluorine-based surfactant (1) which were used for the photosensitive liquid (1) will be illustrated below. Meanwhile, Me represents a methyl group, and a numeric value on the lower-right side of a parenthesis of each of constitutional units of the following polymer represents the molar ratio.

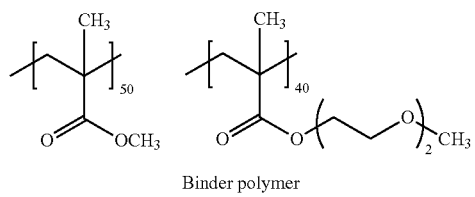

Binder polymer

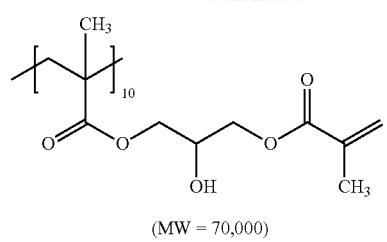

(MW = 70,000)

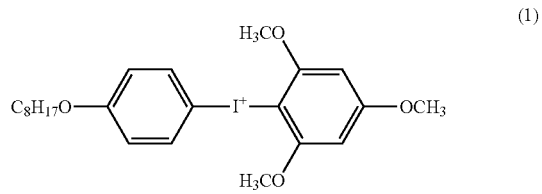

Polymerization initiator

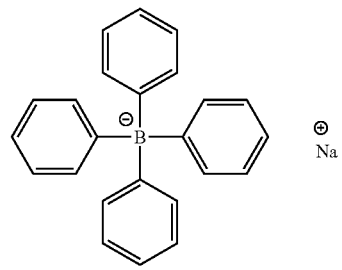

TPB

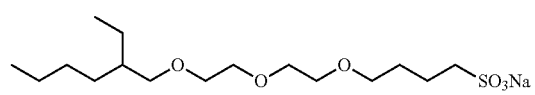

Low-molecular-weight hydophilic comound

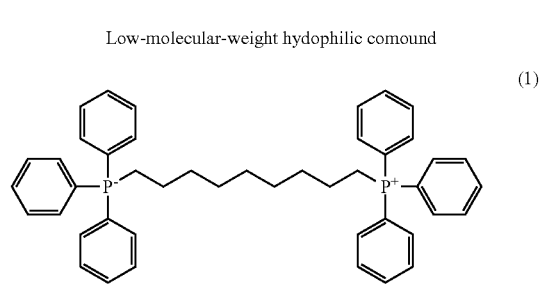

Phosphonium compound

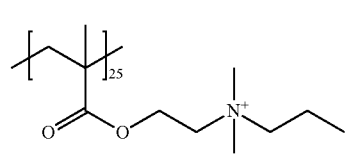

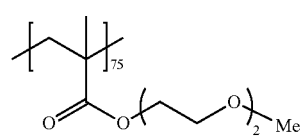

Ammonium group-containing polymer

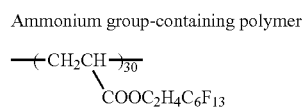

-continued

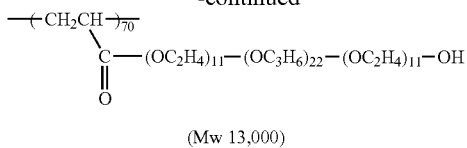

(Mw 13,000)

Fluorine-Based Surfactant (1)

A method for preparing a micro gel (1) used for the micro gel liquid will be described below.

<Preparation of Polyvalent Isocyanate Compound (1)>

Bismuth tris(2-ethylhexanoate) (NEOSTAN U-600, manufactured by Nitto Kasei Co., Ltd.) (43 mg) was added to an ethyl acetate (25.31 g) suspended solution of isophorone diisocyanate (17.78 g, 80 mmol) and the following polyvalent phenol compound (1) (7.35 g, 20 mmol), and the components were stirred. The reaction temperature was set to 50° C. in a case in which the generation of heat settled, and the components were stirred for three hours, thereby obtaining an ethyl acetate solution of a polyvalent isocyanate compound (1) (50% by mass).

Polyhydric phenol compound (1)

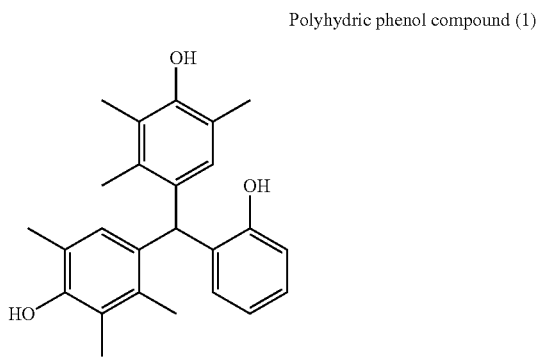 [SMILES: Cc1cc(C(c2ccccc2O)c2cc(C)c(O)c(C)c2C)c(C)c(C)c1O]

<Preparation of Micro Gel (1)>

Oil-phase components described below and a water-phase component described below were mixed together and emulsified at 12,000 rpm for 10 minutes using a homogenizer. The obtained emulsion was stirred at 45° C. for four hours, an aqueous solution of 10% by mass of 1,8-diazabicyclo[5.4.0]undec-7-ene-octanoic acid salt (U-CAT SA102, manufactured by San-Apro Ltd.) (5.20 g) was added thereto, and the components were stirred at room temperature for 30 minutes and left to stand at 45° C. for 24 hours. Adjustment was made using distilled water so that the concentration of the solid content reached 20% by mass, thereby obtaining a water dispersion liquid of a micro gel (1). The number-average particle diameter was measured by a light scattering method using a laser diffraction/scattering-type particle size distribution analyzer (LA-920, manufactured by Horiba, Ltd.) and found out to be 0.28 μm.

(Oil-Based Components)

(Component 1) Ethyl acetate: 12.0 g (Component 2) An adduct obtained by adding trimethylolpropane (6 mol) and xylene diisocyanate (18 mol) and adding methyl terminal polyoxy ethylene (1 mol, the number of the oxyethylene unit repeated: 90) thereto (a solution of 50% by mass of ethyl acetate, manufactured by Mitsui Chemicals Inc.): 3.76 g (Component 3) Polyvalent isocyanate compound (1) (as a solution of 50% by mass of ethyl acetate): 15.0 g (Component 4) An ethyl acetate solution of 65% by mass of dipentaerythritol pentaacrylate (SR-399, Sartomer Japan Inc.): 11.54 g (Component 5) An ethyl acetate solution of 10% by mass of a sulfonate-type surfactant (BIONINE A-41-C, manufactured by Takemoto Oil & Fat Co., Ltd.): 4.42 g (Water-Phase Component)

Distilled water: 46.87 g

<Formation of Protective Layer>

A coating fluid for a protective layer having the following composition was applied onto the image-recording layer by means of bar coating and dried in an oven at 120° C. for 60 seconds, thereby forming a protective layer having a dried coating amount of 0.15 g/m² and thus producing each of lithographic printing plate precursors A for Examples 16 to 24 and Comparative Examples 7 to 10. Supports and compounds A or compounds for comparison in the coating fluid for an image-recording layer (1) which were used to produce the respective lithographic printing plate precursors are summarized in Table 3.

<Coating Fluid for Protective Layer>

Inorganic lamellar compound dispersion liquid (1) [described below]: 1.5 parts

Aqueous solution of 6% by mass of polyvinyl alcohol (CKS50 manufactured by The Nippon Synthetic Chemical Industry Co., Ltd., sulfonic acid-modified, degree of saponification of 99% by mol or higher, degree of polymerization of 300): 0.55 parts Aqueous solution of 6% by mass of polyvinyl alcohol (PVA-405 manufactured by Kuraray Co., Ltd., degree of saponification of 81.5% by mol, degree of polymerization of 500): 0.03 parts Aqueous solution of 1% by mass of a surfactant (polyoxyethylene lauryl ether, EMALEX 710, manufactured by Nihon Emulsion Co., Ltd.): 0.86 parts Ion exchange water: 6.0 parts A method for preparing the inorganic lamellar compound dispersion liquid (1) used for the coating fluid for a protective layer will be described below.

<Preparation of Inorganic Lamellar Compound Dispersion Liquid (1)>

Synthetic mica (SOMASIF ME-100 manufactured by Co-op Chemical Co., Ltd.) (6.4 g) was added to ion exchange water (193.6 g) and was dispersed using a homogenizer until the average particle diameter (the laser scattering method) reached 3 μm. The aspect ratio of the obtained dispersed particle was 100 or higher.

2. Production of Lithographic Printing Plate Precursor B

Lithographic printing plate precursors B for Examples 25 to 37 and Comparative Examples 11 to 15 were respectively produced in the same manner as in the production of the lithographic printing plate precursor A except for the fact that the following coating fluid for an image-recording layer (2) was used instead of the coating fluid for an image-recording layer (1) in the production of the lithographic printing plate precursor A. The coating fluid for an image-recording layer (2) was prepared by mixing and stirring the following photosensitive liquid (2) and the following micro gel liquid immediately before application. Supports, compounds A or compounds for comparison in the coating fluid for an image-recording layer (2), and chain transfer agents which were used to produce the respective lithographic printing plate precursors are summarized in Table 4. Meanwhile, in a case in which the compound A-63 according to the present disclosure was used, the compound A-63 included a borate salt portion in the structure, and thus a borate compound (TPB) was not added thereto.

<Photosensitive Liquid (2)>
Binder polymer (1) [described above]: 0.240 parts
Chain transfer agent [the following structure]: 0.060 g (in the case of being contained)
Compound A or compound for comparison shown in Table 4: 0.038 parts
Borate compound: 0.010 parts TPB [described above]
Polymerizable compound: 0.192 parts
  Tris(acryloyloxyethyl)isocyanurate
  (NK ester A-9300, manufactured by Shin-Nakamura Chemical Co., Ltd.)
Low-molecular-weight hydrophilic compound: 0.062 parts
  Tris(2-hydroxyethyl)isocyanurate
Low-molecular-weight hydrophilic compound (1) [described above]: 0.050 parts
Sensitization agent: 0.055 parts
  Phosphonium compound (1) [described above]
Sensitization agent: 0.018 parts, benzyl-dimethyl-octylammonium.PF$_6$ salt
Sensitization agent: 0.035 parts
  Ammonium group-containing polymer (1) [described above]
Fluorine-based surfactant (1) [described above]: 0.008 parts
2-Butanone: 1.091 parts
1-Methoxy-2-propanol: 8.609 parts
<Micro Gel Liquid>
Micro gel (1) [described above]: 2.640 parts
Distilled water: 2.425 parts The structure of the chain transfer agent used for the photosensitive liquid (2) will be illustrated below. Meanwhile, Me represents a methyl group.

(S-1)

(S-2)

(S-3)

3. Production of Lithographic Printing Plate Precursor C

Lithographic printing plate precursors C for Examples 38 to 43 and Comparative Examples 16 to 19 were respectively produced by applying a coating fluid for an image-recording layer (3) having the following composition by means of bar coating instead of the coating fluid for an image-recording layer (1) and drying the coating fluid in an oven at 70° C. for 60 seconds, thereby forming an image-recording layer having a dried coating amount of 0.6 g/m$^2$ in the production of the lithographic printing plate precursor A. The lithographic printing plate precursor C was a lithographic printing plate precursor having no protective layer. Supports and compounds A or compounds for comparison in the coating fluid for an image-recording layer (3) which were used to produce the respective lithographic printing plate precursors are summarized in Table 5.

<Coating Fluid for Image-Recording Layer (3)>
Compound A or compound for comparison shown in Table 5: 0.046 parts
Polymerization initiator (1) [described above]: 0.245 parts
Borate compound: 0.010 parts
  TPB [described above]
Polymer fine particle water dispersion liquid (1) (22% by mass) [described below]: 10.0 parts
Polymerizable compound: 1.50 parts, SR-399 (manufactured by Sartomer Japan Inc.)
Mercapt-3-triazole: 0.2 parts
Byk 336 (manufactured by BYK Additives & Instruments): 0.4 parts
Klucel M (manufactured by Hercules Incorporated): 4.8 parts
ELVACITE 4026 (manufactured by Ineos Acrylics): 2.5 parts
n-Propanol: 55.0 parts
2-Butanone: 17.0 parts The compounds which were used for the coating fluid for an image-recording layer (3) and are expressed using trade names are as described below.

SR-399: Dipentaerythritol pentaacrylate
Byk 336: Modified dimethyl polysiloxane copolymer (a solution of 25% by mass of xylene and methoxypropyl acetate)
Klucel M: Hydroxypropyl cellulose (2% by mass aqueous solution)
ELVACITE 4026: Highly branched polymethyl methacrylate (a solution of 10% by mass of 2-butanone)

A method for preparing the polymer fine particle water dispersion liquid (1) used for the coating fluid for an image-recording layer (3) will be described below.

<Preparation of Polymer Fine Particle Water Dispersion Liquid (1)>

A stirrer, a thermometer, a dropping funnel, a nitrogen introduction pipe, and a reflux cooler were provided to a four-neck flask, nitrogen gas was introduced thereinto, polyethylene glycol methyl ether methacrylate (PEGMA, the average repeating unit number of ethylene glycol: 50) (10 g), distilled water (200 g), and n-propanol (200 g) were added thereto while carrying out deoxidation, and the components were heated until the inner temperature reached 70° C. Next, a mixture obtained by mixing styrene (St) (10 g), acrylonitrile (AN) (80 g), and 2,2'-azobisisobutyronitrile (0.8 g) in advance was added dropwise thereto for one hour. A reaction continued for five hours after the end of the dropwise addition, then, 2,2'-azobisisobutyronitrile (0.4 g) was added thereto, and the inner temperature was increased up to 80° C. Subsequently, 2,2'-azobisisobutyronitrile (0.5 g) was added thereto for six hours. At a stage of continuing the reaction for a total of 20 hours, 98% or more of polymerization had progressed, and a polymer fine particle water dispersion liquid (1) including PEGMA/St/AN in a volume ratio of 10/10/80 was prepared.

The number-average particle diameter was measured by a light scattering method using a laser diffraction/scattering-type particle size distribution analyzer (LA-920, manufactured by Horiba, Ltd.) and found out to be 0.15 m.

4. Production of Lithographic Printing Plate Precursor D

Lithographic printing plate precursors D for Examples 44 to 57 and Comparative Examples 20 to 24 were respectively produced by applying a coating fluid for an image-recording layer (4) having the following composition after coating by means of bar coating instead of the coating fluid for an image-recording layer (1) and drying the coating aqueous solution in an oven at 50° C. for 60 seconds, thereby forming an image-recording layer having a dried coating amount of 0.93 g/m² in the production of the lithographic printing plate precursor A. The lithographic printing plate precursor D was a lithographic printing plate precursor having no protective layer. Supports and compounds A or compounds for comparison in the coating fluid for an image-recording layer (4) which were used to produce the respective lithographic printing plate precursors are summarized in Table 6.

<Coating Fluid for Image-Recording Layer (4)>

Compound A or compound for comparison shown in Table 6: 0.065 g/m²

Borate compound: 0.015 g/m²

TPB [described above]

Polymer fine particle water dispersion liquid (2): 0.693 g/m²

Glascol E15: 0.09 g/m², (manufactured by Allied Colloids Manufacturing GMBH)

ERKOL WX48/20 (manufactured by ERKOL): 0.09 g/m²

Zonyl FSO100 (manufactured by DuPont): 0.0075 g/m²

The compounds which were used for the coating fluid for an image-recording layer (4) and are expressed using trade names and the polymer particle water dispersion liquid (2) are as described below.

Glascol E15: Polyacrylic acid

ERKOL WX48/20: Polyvinyl alcohol/polyvinyl acetate copolymer

Zonyl FSO100: Surfactant

Polymer fine particle water dispersion liquid (2): A styrene/acrylonitrile copolymer stabilized with an anionic wetting agent (the molar ratio: 50/50, the average particle diameter: 61 nm, and the solid content: approximately 20%)

The structures of compounds for comparison will be illustrated below.

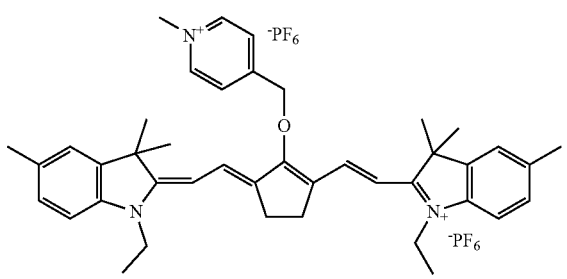

(R-7)

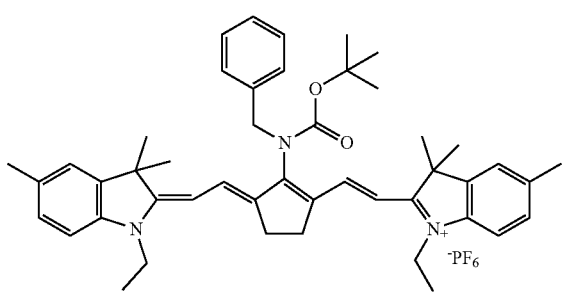

(R-8)

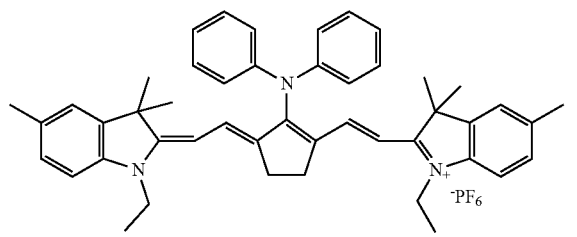

(R-9)

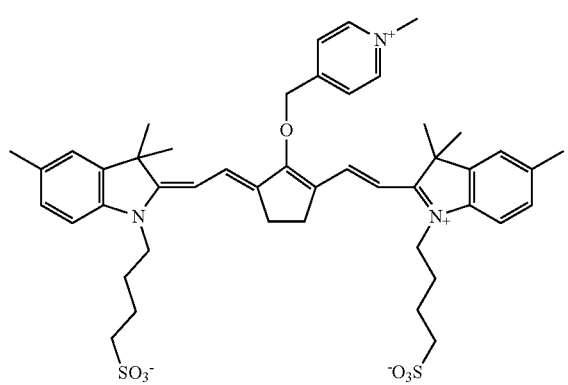

(R-10)

The compounds R-7 to R-10 were synthesized according to WO2016/027886A or JP2008-544053A.

5. Evaluation of Lithographic Printing Plate Precursors

For the respective lithographic printing plate precursors described above, the color developability, the on-machine developability, the white light stability, and the printing resistance were evaluated in the following manner. The evaluation results are shown in Tables 3 to 6.

(1) Color Developability

The obtained lithographic printing plate precursors were exposed using a TRENDSETTER 3244VX manufactured by Creo Co., Ltd. which was equipped with a water cooling-type 40 W infrared semiconductor laser under conditions of an output of 11.7 W, an external surface drum rotation speed of 250 rpm, and a resolution of 2,400 dpi (dot per inch, 1 inch=25.4 mm).

The exposure was carried out under conditions of 25° C. and 50% RH.

The color development of the lithographic printing plate precursor was measured immediately after exposure and after two hours of storage in a dark plate (25° C.) after the exposure. The color development was measured using a spectrophotometer CM2600d and operation software CM-S100W manufactured by Konica Minolta, Inc. by means of a specular component excluded (SCE) method. The color developability were evaluated using the difference ΔL between the L* value of an exposed portion and the L* value of a non-exposed portion using L* values (brightness) in the L*a*b* color specification system. The numerical values of ΔL are shown in Tables 3 to 6. A larger value of ΔL indicates superior color developability. A large value of ΔL after two hours of exposure (a numeric value shown in the column of "color developability (after two hours)" in the tables) indicates superior color developability after aging. In addition, it can be said that a large value of ΔL indicates a superior plate inspection property.

(2) On-Machine Developability

The lithographic printing plate precursors were exposed using a LUXEL PLATESETTER T-6000III manufactured by Fujifilm Corporation which was equipped with an infrared semiconductor laser under conditions of an external surface drum rotation speed of 1,000 rpm, a laser output of 70%, and a resolution of 2,400 dpi. Exposed images were provided with solid images and 50% halftone dot charts of 20 µm dot FM screens. Without carrying out a development process on the exposed plate precursors, the lithographic printing plate precursors were attached to the plate trunk of a printer LITHRONE 26 manufactured by Komori Corporation. Dampening water and ink were supplied using dampening water of ECOLITY-2 (manufactured by Fujifilm Corporation)/tap water=2/98 (capacity ratio) and Values-G(N) BLACK INK (manufactured by DIC Graphics Corporation) and using the standard automatic printing start method of LITHRONE 26, and then printing was carried out on 100 pieces of TOKUBISHI art paper (76.5 kg) (manufactured by Mitsubishi Paper Mills limited) at a printing rate of 10,000 pieces per hour.

The on-machine development of non-exposed portions in the image-recording layer was completed on the printer, and the number of pieces of printing paper required until ink was not transferred to the non-image areas was measured and evaluated as the on-machine developability. A smaller number of pieces of printing paper indicates superior on-machine developability.

(3) White Light Stability

In an environment of room temperature (25° C.) and a humidity of 50%, an OSRAM FLR40SW fluorescent light manufactured by Mitsubishi electric Corporation was used as a light source, and the lithographic printing plate precursor was set at a location of an illuminance of 1,000 lx in a pocket illuminance meter ANA-F9 manufactured by Tokyo Photoelectric Co., Ltd. and irradiated with white light for two hours. After that, exposure in an image pattern and on-machine development were carried out in the same manner as in the evaluation of the on-machine developability, the number of pieces of printing paper was measured and evaluated as the white light stability. A smaller number of pieces of printing paper indicates superior white light stability.

(4) Printing Resistance

After the on-machine developability were evaluated, printing was further continued. As the number of printed pieces increased, the image-recording layer gradually wore, and thus the ink concentration on printed matters decreased. The number of pieces of printed paper until the value of the halftone dot area ratio of FM screen 50% halftone dots on printed matters measured using a gretag density meter decreased to be 5% lower than the measurement value obtained in a case in which printing was carried out on a $100^{th}$ piece of paper was measured. The printing resistance was evaluated using relative printing resistance for which the number of pieces of printed paper of 50,000 was considered as 100. A larger numeric value indicates superior printing resistance.

Relative printing resistance=(the number of pieces of printed paper of the subject lithographic printing plate precursor)/50,000×100

TABLE 3

| | Lithographic printing plate precursor | Support | Compound A or compound for comparison | Color developability (immediately after exposure to light) | Color developability (after two hours) | On-machine developability (number of pieces) | White light stability (number of pieces) | Printing resistance |
|---|---|---|---|---|---|---|---|---|
| Example 16 | A | B | A-1 | 4.6 | 4.6 | 11 | 20 | 83 |
| Example 17 | A | B | A-22 | 4.7 | 4.7 | 11 | 21 | 82 |
| Example 18 | A | B | A-27 | 5.1 | 5.0 | 11 | 19 | 79 |
| Example 19 | A | B | A-40 | 4.5 | 4.5 | 11 | 23 | 83 |
| Example 20 | A | B | A-43 | 5.9 | 5.9 | 11 | 23 | 81 |
| Example 21 | A | B | A-61 | 5.3 | 5.5 | 11 | 20 | 84 |
| Example 22 | A | B | A-62 | 4.5 | 4.4 | 11 | 25 | 82 |
| Example 23 | A | B | A-65 | 5.8 | 5.8 | 11 | 30 | 81 |
| Example 24 | A | D | A-62 | 4.6 | 4.4 | 11 | 25 | 92 |
| Comparative example 7 | A | B | R-7 | 4.3 | 4.2 | 16 | 85 | 79 |
| Comparative example 8 | A | B | R-8 | 3.1 | 3.1 | 12 | 35 | 78 |
| Comparative example 9 | A | B | R-9 | 2.1 | 1.5 | 12 | 35 | 79 |
| Comparative example 10 | A | D | R-8 | 3.2 | 3.1 | 11 | 35 | 89 |

TABLE 4

| | Lithographic printing plate precursor | Support | Chain transfer agent | Compound A or compound for comparison | Color developability (immediately after exposure to light) | Color developability (after two hours) | On-machine developability (number of pieces) | White light stability (number of pieces) | Printing resistance |
|---|---|---|---|---|---|---|---|---|---|
| Example 25 | B | B | — | A-1 | 5.6 | 5.6 | 11 | 12 | 70 |
| Example 26 | B | B | — | A-22 | 5.5 | 5.5 | 11 | 12 | 69 |
| Example 27 | B | B | — | A-40 | 5.1 | 5.3 | 12 | 13 | 69 |
| Example 28 | B | B | — | A-43 | 6.5 | 6.5 | 12 | 13 | 72 |
| Example 29 | B | B | — | A-45 | 6.2 | 6.2 | 12 | 13 | 72 |

TABLE 4-continued

| | Lithographic printing plate precursor | Support | Chain transfer agent | Compound A or compound for comparison | Color developability (immediately after exposure to light) | Color developability (after two hours) | On-machine developability (number of pieces) | White light stability (number of pieces) | Printing resistance |
|---|---|---|---|---|---|---|---|---|---|
| Example 30 | B | B | — | A-62 | 5.5 | 5.5 | 12 | 15 | 75 |
| Example 31 | B | B | — | A-63 | 5.2 | 5.3 | 12 | 15 | 74 |
| Example 32 | B | B | — | A-65 | 6.3 | 6.3 | 12 | 15 | 72 |
| Example 33 | B | B | S-1 | A-1 | 5.6 | 5.6 | 11 | 12 | 77 |
| Example 34 | B | B | S-2 | A-1 | 5.5 | 5.5 | 11 | 12 | 78 |
| Example 35 | B | B | S-3 | A-1 | 5.5 | 5.5 | 11 | 12 | 75 |
| Example 36 | B | A | — | A-1 | 5.5 | 5.5 | 11 | 12 | 75 |
| Example 37 | B | D | — | A-1 | 5.5 | 5.5 | 11 | 12 | 77 |
| Comparative example 11 | B | B | — | R-7 | 4.9 | 4.9 | 17 | 40 | 68 |
| Comparative example 12 | B | B | — | R-8 | 3.5 | 3.5 | 12 | 15 | 65 |
| Comparative example 13 | B | B | — | R-9 | 1.5 | 1.1 | 12 | 15 | 60 |
| Comparative example 14 | B | B | S-1 | R-8 | 3.5 | 3.5 | 12 | 15 | 67 |
| Comparative example 15 | B | D | — | R-8 | 3.5 | 3.5 | 12 | 15 | 72 |

TABLE 5

| | Lithographic printing plate precursor | Support | Compound A or compound for comparison | Color developability (immediately after exposure to light) | Color developability (after two hours) | On-machine developability (number of pieces) | White light stability (number of pieces) | Printing resistance |
|---|---|---|---|---|---|---|---|---|
| Example 38 | C | B | A-1 | 4.5 | 4.6 | 13 | 21 | 74 |
| Example 39 | C | B | A-27 | 4.8 | 4.8 | 13 | 25 | 72 |
| Example 40 | C | B | A-43 | 5.8 | 5.8 | 14 | 21 | 75 |
| Example 41 | C | B | A-62 | 4.9 | 4.7 | 14 | 25 | 72 |
| Example 42 | C | C | A-1 | 4.6 | 4.6 | 16 | 22 | 80 |
| Example 43 | C | D | A-1 | 4.6 | 4.4 | 15 | 22 | 79 |
| Comparative example 16 | C | B | R-7 | 4.0 | 3.9 | 16 | 65 | 70 |
| Comparative example 17 | C | B | R-8 | 3.2 | 3.2 | 16 | 35 | 71 |
| Comparative example 18 | C | B | R-9 | 2.3 | 1.5 | 16 | 25 | 72 |
| Comparative example 19 | C | D | R-8 | 3.2 | 3.1 | 16 | 35 | 77 |

TABLE 6

| | Lithographic printing plate precursor | Support | Compound A or compound for comparison | Color developability (immediately after exposure to light) | Color developability (after two hours) | On-machine developability (number of pieces) | White light stability (number of pieces) | Printing resistance |
|---|---|---|---|---|---|---|---|---|
| Example 44 | D | B | A-2 | 9.5 | 9.4 | 15 | 15 | 76 |
| Example 45 | D | B | A-3 | 9.2 | 9.3 | 15 | 16 | 74 |
| Example 46 | D | B | A-4 | 8.8 | 8.9 | 14 | 15 | 72 |
| Example 47 | D | B | A-5 | 9.0 | 8.8 | 15 | 15 | 73 |
| Example 48 | D | B | A-10 | 8.7 | 8.8 | 15 | 15 | 74 |
| Example 49 | D | B | A-16 | 8.8 | 8.8 | 15 | 16 | 75 |
| Example 50 | D | B | A-18 | 8.4 | 8.5 | 17 | 15 | 72 |
| Example 51 | D | B | A-19 | 8.7 | 8.5 | 15 | 15 | 73 |
| Example 52 | D | B | A-28 | 8.4 | 8.2 | 15 | 15 | 73 |
| Example 53 | D | B | A-34 | 8.1 | 8.1 | 15 | 16 | 72 |
| Example 54 | D | B | A-47 | 9.8 | 9.9 | 17 | 16 | 72 |
| Example 55 | D | A | A-2 | 9.4 | 9.4 | 16 | 16 | 79 |
| Example 56 | D | C | A-2 | 9.3 | 9.4 | 16 | 16 | 83 |
| Example 57 | D | D | A-2 | 9.2 | 9.2 | 16 | 16 | 84 |
| Comparative | D | B | R-1 | 4.2 | 4.3 | 17 | 16 | 72 |

TABLE 6-continued

| Lithographic printing plate precursor | | Support | Compound A or compound for comparison | Color developability (immediately after exposure to light) | Color developability (after two hours) | On-machine developability (number of pieces) | White light stability (number of pieces) | Printing resistance |
|---|---|---|---|---|---|---|---|---|
| example 20 | | | | | | | | |
| Comparative example 21 | D | B | R-3 | 2.0 | 1.5 | 17 | 16 | 71 |
| Comparative example 22 | D | B | R-5 | 2.2 | 1.6 | 17 | 16 | 72 |
| Comparative example 23 | D | B | R-10 | 6.9 | 7.2 | 18 | 20 | 71 |
| Comparative example 24 | D | D | R-1 | 4.3 | 4.3 | 18 | 16 | 77 |

From the results of Tables 3 to 6, it is clear that the lithographic printing plate precursors according to the examples of the present application having an image-recording layer containing the compound represented by Formula 1 are superior in terms of the color developability and the maintenance of the color developability to the lithographic printing plate precursors of the comparative examples containing the compound for comparison. Furthermore, the lithographic printing plate precursor having an image-recording layer containing the compound represented by Formula 1 has more favorable color developability than the lithographic printing plate precursors not having an image-recording layer containing the compound represented by Formula 1 which were used in the comparative examples. In addition, the lithographic printing plate precursors according to the example of the present application having an image-recording layer containing the compound represented by Formula 1 obtain favorable results in terms of all of the color developability, the on-machine developability, the white light stability, and the printing resistance.

What is claimed is:
1. A color developing composition, comprising:
a compound represented by the following Formula 1,

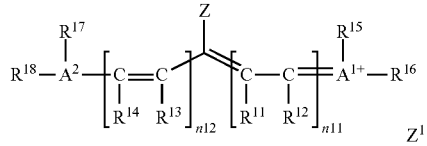

Formula 1

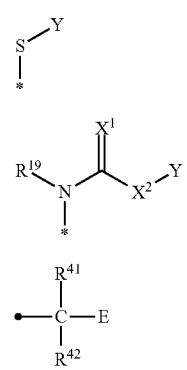

Formula 2

Formula 3

Formula 4 wherein, in Formula 1, Z represents a group represented by Formula 2, Formula 3, or the following Formulas G-1 to G-7, each of $R^{11}$ to $R^{18}$ independently represents a hydrogen atom, a halogen atom, $-R^a$, $-OR^b$, $-SR^c$, or $-NR^dR^e$, each of $R^a$ to $R^e$ independently represents a hydrocarbon group, each of $A^1$ and $A^2$ independently represents an oxygen atom, a sulfur atom, or a nitrogen atom, $R^{16}$ is not present in a case in which $A^1$ represents an oxygen atom or a sulfur atom, $R^{18}$ is not present in a case in which $A^2$ represents an oxygen atom or a sulfur atom, at least two selected from the group consisting of $A^1$, $A^2$, and a plurality of $R^{11}$ to $R^{18}$ may be linked to each other to form a monocyclic structure or a polycyclic structure, n11 and n12 represent the same integer of 0 to 5, and $Z^1$ represents a counter ion for neutralizing a charge,

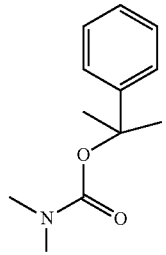

G-1

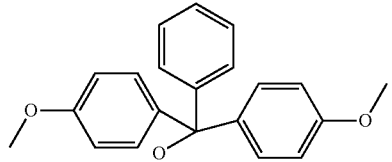

G-2

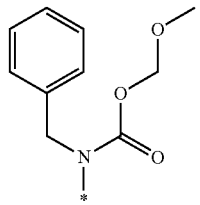

G-3

-continued

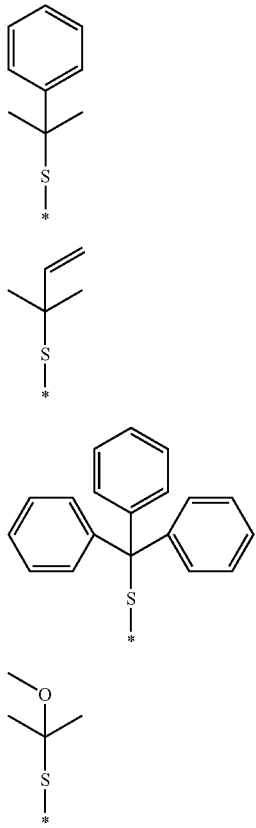

wherein, in Formula 2 and Formula 3, $R^{19}$ represents a hydrocarbon group, each of $X^1$ and $X^2$ independently represents an oxygen atom or a sulfur atom, Y represents a group which is represented by Formula 4, and * represents a bonding site with a carbon atom in Formula 1, and wherein, in Formula 4, each of $R^{41}$ and $R^{42}$ independently represents a hydrogen atom or a hydrocarbon group, E represents an onium salt that is a group consisting of a group represented by the following Formula 5, and • represents a bonding site with a sulfur atom in Formula 2 or a bonding site with $X^2$ in Formula 3,

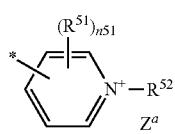

Formula 5 wherein, in Formula 5, each of $R^{51}$'s independently represents a halogen atom, a hydrocarbon group, a hydroxyl group, or —$OR^{53}$—, $R^{53}$ represents a hydrocarbon group, a plurality of $R^{51}$'s may be linked to each other to form a ring, n51 represents an integer of 0 to 4, $R^{52}$ represents a hydrocarbon group, and $Z^a$ represents a counter ion that neutralizes a charge.

2. The color developing composition according to claim 1, wherein the compound represented by Formula 1 is a compound represented by the following Formula 6:

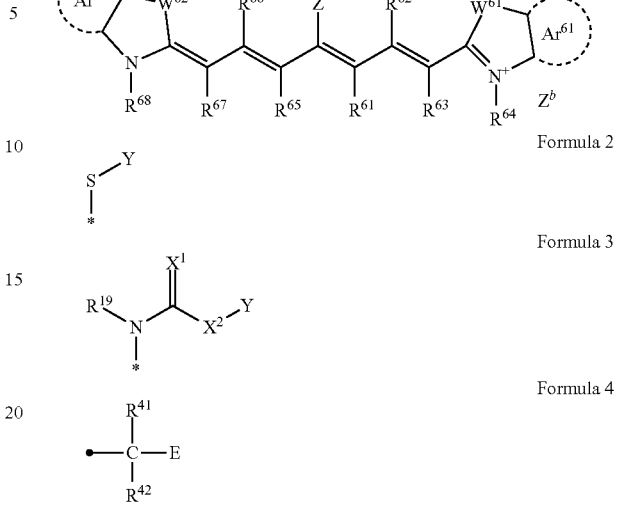

wherein, in Formula 6, Z represents a group represented by Formula 2 or Formula 3, each of $R^{61}$ to $R^{68}$ independently represents a hydrogen atom, a halogen atom, —$R^a$, —$OR^b$, —$SR^c$, or —$NR^dR^e$, each of $R^a$ to $R^e$ independently represents a hydrocarbon group, each of $Ar^{61}$ and $Ar^{62}$ independently represents a group forming a benzene ring or forming a naphthalene ring, each of $W^{61}$ and $W^{62}$ independently represents an oxygen atom, a sulfur atom, —$CR^{611}R^{612}$—, or —$NR^{613}$—, each of $R^{611}$ to $R^{613}$ independently represents a hydrocarbon group, and $Z^b$ represents a counter ion that neutralizes a charge, wherein, in Formula 2 and Formula 3, $R^{19}$ represents a hydrocarbon group, each of $X^1$ and $X^2$ independently represents an oxygen atom or a sulfur atom, Y represents a group which is represented by Formula 4, and * represents a bonding site with a carbon atom in Formula 1, and wherein, in Formula 4, each of $R^{41}$ and $R^{42}$ independently represents a hydrogen atom or a hydrocarbon group, E represents an onium salt that is a group consisting of a group represented by Formula 5, and • represents a bonding site with a sulfur atom in Formula 2 or a bonding site with $X^2$ in Formula 3.

3. The color developing composition according to claim 2, wherein each of $R^{64}$ and $R^{68}$ in Formula 6 independently represents a group represented by any one of the following Formula 7 to Formula 10:

$+R^{71}—O+_{n71}R^{72}$   Formula 7

—$R^{81}$—$CO_2M^{81}$   Formula 8

—$R^{91}$—$PO_3M^{91}$   Formula 9

—$R^{101}$—$SO_3M^{101}$   Formula 10 wherein, in Formulae 7 to 10, $R^{71}$ represents an alkylene group having 2 to 6 carbon atoms, n71 represents an integer of 1 to 45, $R^{72}$ represents an alkyl group having 1 to 12 carbon atoms or —C(=O)—$R^{73}$, each of $R^{81}$, $R^{91}$, and $R^{101}$ independently represents an alkylene group having 1 to 12 carbon atoms, $R^{73}$ represents an alkyl group having 1 to 12 carbon atoms, and each of $M^{81}$, $M^{91}$, and $M^{101}$ represents a hydrogen atom, a Na atom, a K atom, or an onium salt.

4. The color developing composition according to claim 1, further comprising a binder polymer.

5. The color developing composition according to claim 1, further comprising a thermally adhesive particle.

6. The color developing composition according to claim 1, further comprising a polymerization initiator and a polymerizable compound.

7. The color developing composition according to claim 1, further comprising a borate compound.

8. A lithographic printing plate precursor, comprising:
a support; and
at least one layer comprising the color developing composition according to claim 1 on the support.

9. A method for producing a lithographic printing plate, comprising:
radiating an infrared ray to the lithographic printing plate precursor according to claim 8; and
carrying out on-machine development by supplying at least one selected from the group consisting of a printing ink and dampening water to the lithographic printing plate precursor to which the infrared ray has been radiated on a printer.

10. A compound represented by the following Formula 1,

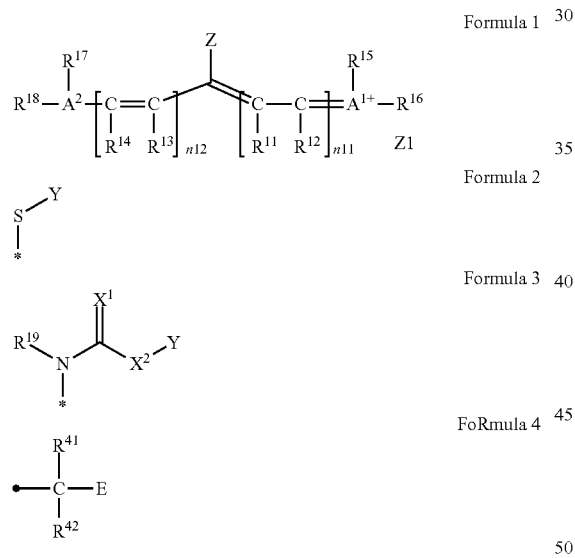

Formula 1

Formula 2

Formula 3

FoRmula 4 wherein, in Formula 1, Z represents a group represented by Formula 2, Formula 3 or the following Formulas G-1 to G-7, each of $R^{11}$ to $R^{18}$ independently represents a hydrogen atom, a halogen atom, $-R^a$, $-OR^b$, $-SR^c$, or $-NR^dR^e$, each of to $R^e$ independently represents a hydrocarbon group, each of $A^1$ and $A^2$ independently represents an oxygen atom, a sulfur atom, or a nitrogen atom, $R^{16}$ is not present in a case in which $A^1$ represents an oxygen atom or a sulfur atom, $R^{18}$ is not present in a case in which $A^2$ represents an oxygen atom or a sulfur atom, at least two selected from the group consisting of $A^1$, $A^2$, and a plurality of $R^{11}$ to $R^{18}$ may be linked to each other to form a monocyclic structure or a polycyclic structure, n11 and n12 represent the same integer of 0 to 5, and $Z^1$ represents a counter ion for neutralizing a charge,

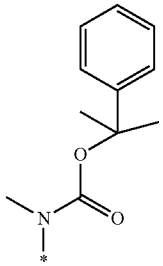

G-1

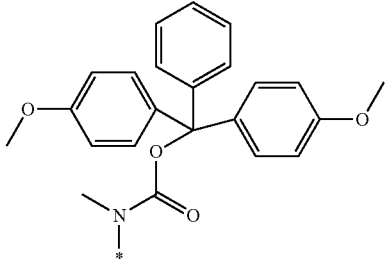

G-2

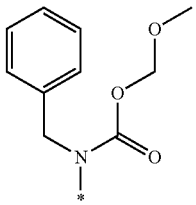

G-3

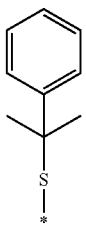

G-4

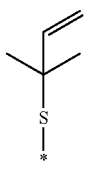

G-5

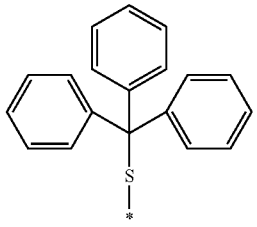

G-6

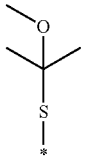

G-7 wherein, in Formula 2 and Formula 3, $R^{19}$ represents a hydrocarbon group, each of $X^1$ and $X^2$ independently represents an oxygen atom or a sulfur atom, Y represents a group which is represented by Formula 4, and * represents a bonding site with a carbon atom in Formula 1, and wherein, in Formula 4, each of $R^{41}$ and $R^{42}$ independently represents a hydrogen atom or a hydrocarbon group, E represents an onium salt that is a group consisting of a group represented by the following Formula 5, and • represents a bonding site with a sulfur atom in Formula 2 or a bonding site with $X^2$ in Formula 3,

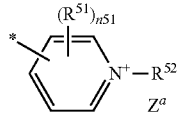

Formula 5 wherein, in Formula 5, each of $R^{51}$'s independently represents a halogen atom, a hydrocarbon group, a hydroxyl group, or —$OR^{53}$—, $R^{53}$ represents a hydrocarbon group, a plurality of $R^{51}$'s may be linked to each other to form a ring, n51 represents an integer of 0 to 4, $R^{52}$ represents a hydrocarbon group, and $Z^a$ represents a counter ion that neutralizes a charge.

11. The color developing composition according to claim 1, wherein Z represents a group represented by Formula 2 or Formula 3.

* * * * *